(12) United States Patent
Wang et al.

(10) Patent No.: US 11,404,553 B2
(45) Date of Patent: Aug. 2, 2022

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

(72) Inventors: Xin-Yong Wang, Shanghai (CN); Liu Han, Nanjing (CN)

(73) Assignees: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 16/875,757

(22) Filed: May 15, 2020

(65) Prior Publication Data
US 2021/0320181 A1 Oct. 14, 2021

(30) Foreign Application Priority Data
Apr. 13, 2020 (CN) .......................... 202010285587.0

(51) Int. Cl.
*H01L 27/088* (2006.01)
*H01L 21/8234* (2006.01)
*H01L 29/423* (2006.01)
*H01L 29/66* (2006.01)
*H01L 29/06* (2006.01)

(52) U.S. Cl.
CPC ...... *H01L 29/4238* (2013.01); *H01L 29/0653* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2009/0170259 A1 | 7/2009 | Hornung et al. | |
| 2015/0214341 A1* | 7/2015 | Shin | H01L 29/7851 257/401 |
| 2017/0200651 A1* | 7/2017 | Lee | H01L 21/76224 |
| 2017/0271503 A1* | 9/2017 | Yu | H01L 21/823431 |
| 2018/0211955 A1* | 7/2018 | Greene | H01L 27/0924 |

* cited by examiner

*Primary Examiner* — Joseph C. Nicely
*Assistant Examiner* — Lamont B Koo
(74) *Attorney, Agent, or Firm* — Maschoff Brennan

(57) ABSTRACT

A semiconductor device includes a source/drain region, a body region, a first gate structure, and a second gate structure. The source/drain region and the body region are in a substrate. The first and second gate structures are above the substrate. The source/drain region and the body region are on opposite sides of the first gate structure. The second gate structure is spaced apart from the first gate structure. The source/drain region, the body region, and the first gate structure are on a same side of the second gate structure.

20 Claims, 36 Drawing Sheets

SEMICONDUCTOR DEVICE AND MANUFACTURING METHOD THEREOF

PRIORITY CLAIM AND CROSS-REFERENCE

The present application claims priority to China Application Serial Number 202010285587.0, filed Apr. 13, 2020, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
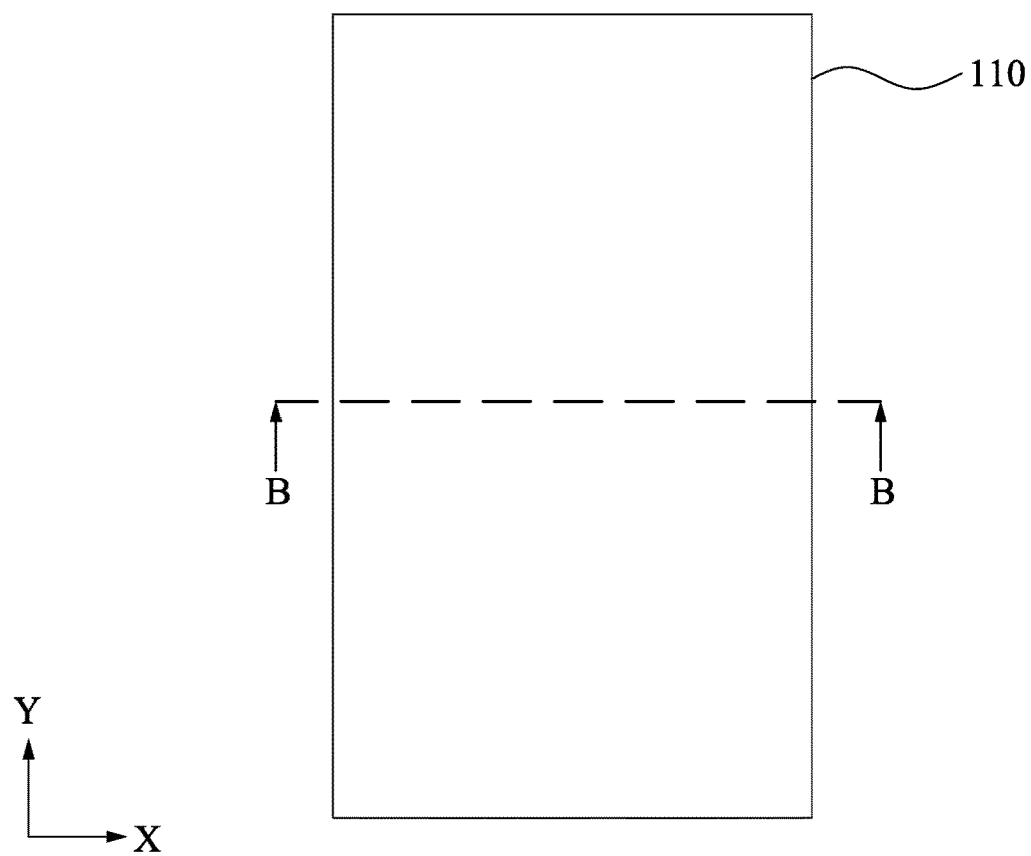
FIGS. 1A-10E illustrate a method for manufacturing a semiconductor device at various stages in accordance with some embodiments of the present disclosure.
Figure 1B:
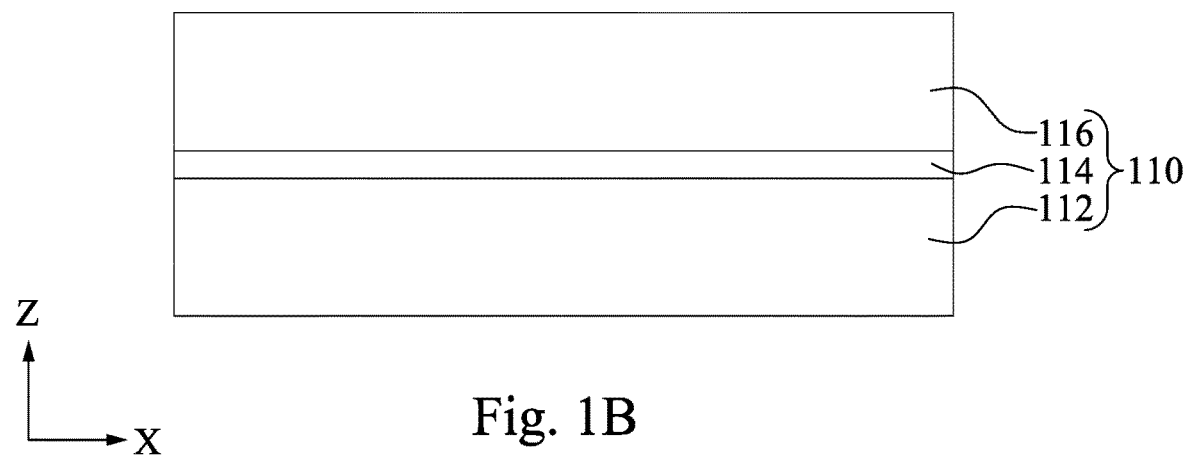

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Embodiments of the present disclosure relate to semiconductor devices and methods for forming semiconductor devices with H-shaped gate structure. These embodiments are discussed below in the context of forming planar transistors having active regions in a bulk silicon substrate.

FIGS. 1A-10E illustrate a method for manufacturing a semiconductor device at various stages in accordance with some embodiments of the present disclosure. Reference is made first to FIGS. 1A and 1B, where FIG. 1A is a top view for manufacturing a semiconductor device at various stages in accordance with some embodiments of the present disclosure, and FIG. 1B is a cross-sectional view taken along line B-B in FIG. 1A. A substrate 110 is provided. The substrate 110 is a silicon substrate in some embodiment. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In yet another alternative, the substrate 110 is a semiconductor-on-insulator (SOI) such as a buried dielectric layer. In some embodiments, an SOI substrate includes a layer of a semiconductor material 116, such as silicon, formed on an insulator layer 114. The insulator layer 114 may be, for example, a buried oxide (BOX) layer or a silicon oxide layer. The insulator layer 114 is provided on a semiconductor substrate 112, such as a silicon or glass substrate. In some embodiments, the semiconductor substrate 112 includes a p-type silicon substrate (p-substrate). For example, p-type dopants are introduced into the semiconductor substrate 112 to form the p-substrate.

Figure 2A:
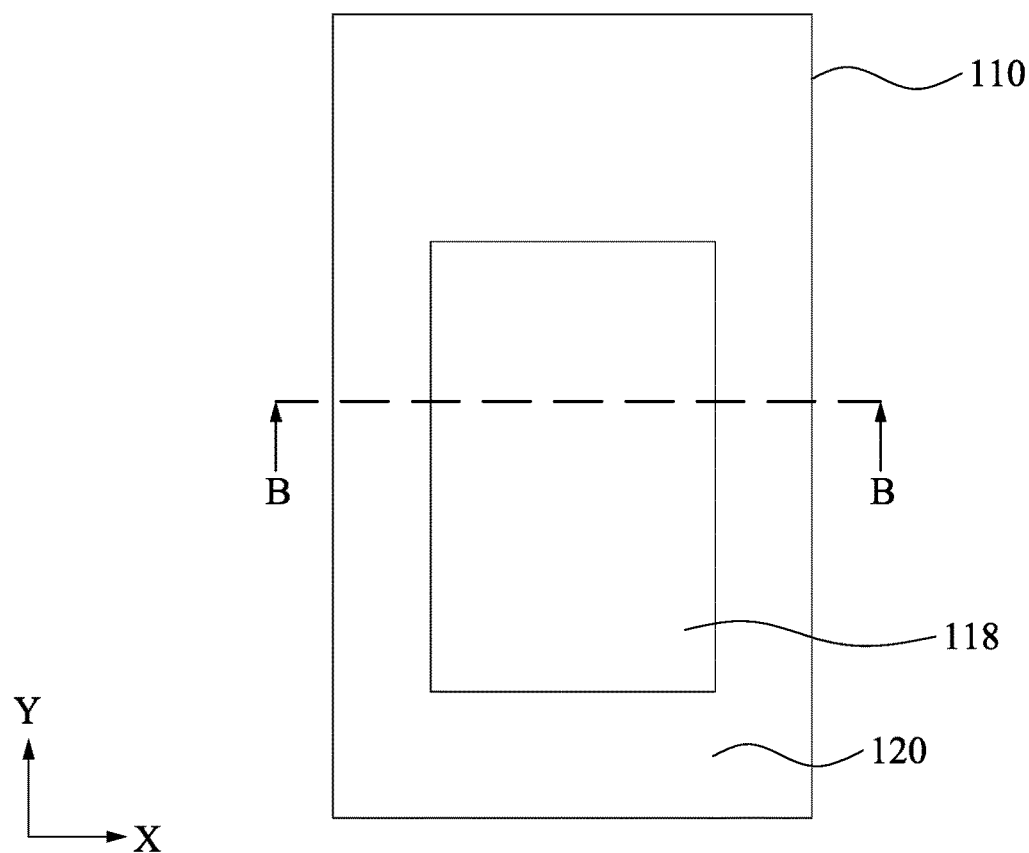
Figure 2B:
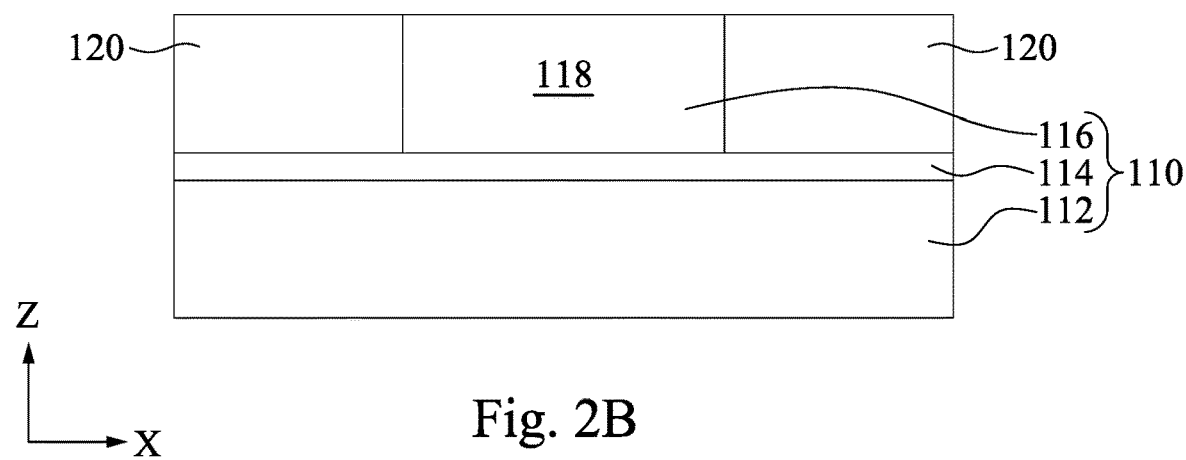

Reference is made to FIGS. 2A and 2B, where FIG. 2A is a top view for manufacturing a semiconductor device at various stages in accordance with some embodiments of the present disclosure, and FIG. 2B is a cross-sectional view taken along line B-B in FIG. 2A. A plurality of isolation structures 120, such as shallow trench isolation (STI), are formed in the semiconductor material 116 of the substrate 110 to separate various devices. The formation of the isolation structures 120 may include etching trenches in the substrate 110 and filling the trenches by insulator materials such as silicon oxide, silicon nitride, or silicon oxynitride. The filled trench may have a multi-layer structure such as a thermal oxide liner layer with silicon nitride filling the trench. In some embodiments, the isolation structures 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers. The isolation structures 120 define at least one active region 118 in the substrate 110. For example, the isolation structures 120 surround the active region 118. It is noted that the arrangement of the active region 118 in FIG. 2A is illustrative, and should not limit the scope of the present disclosure.

Figure 3A:
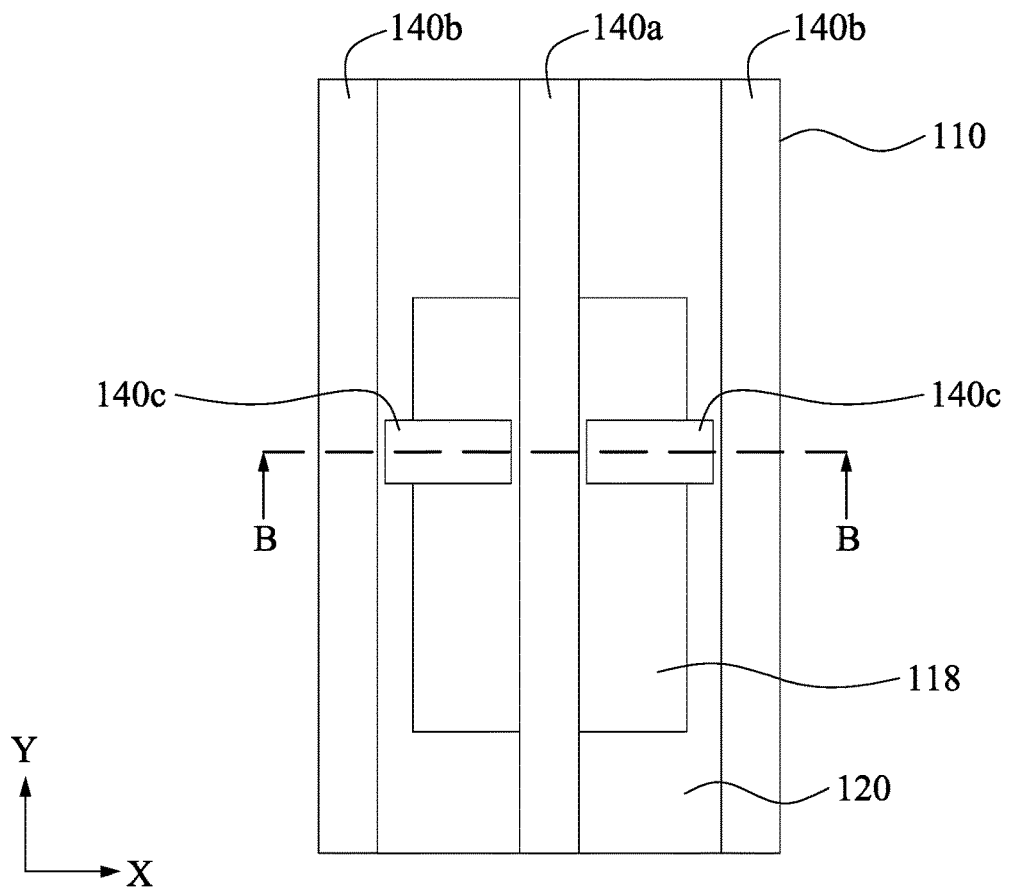
Figure 3B:
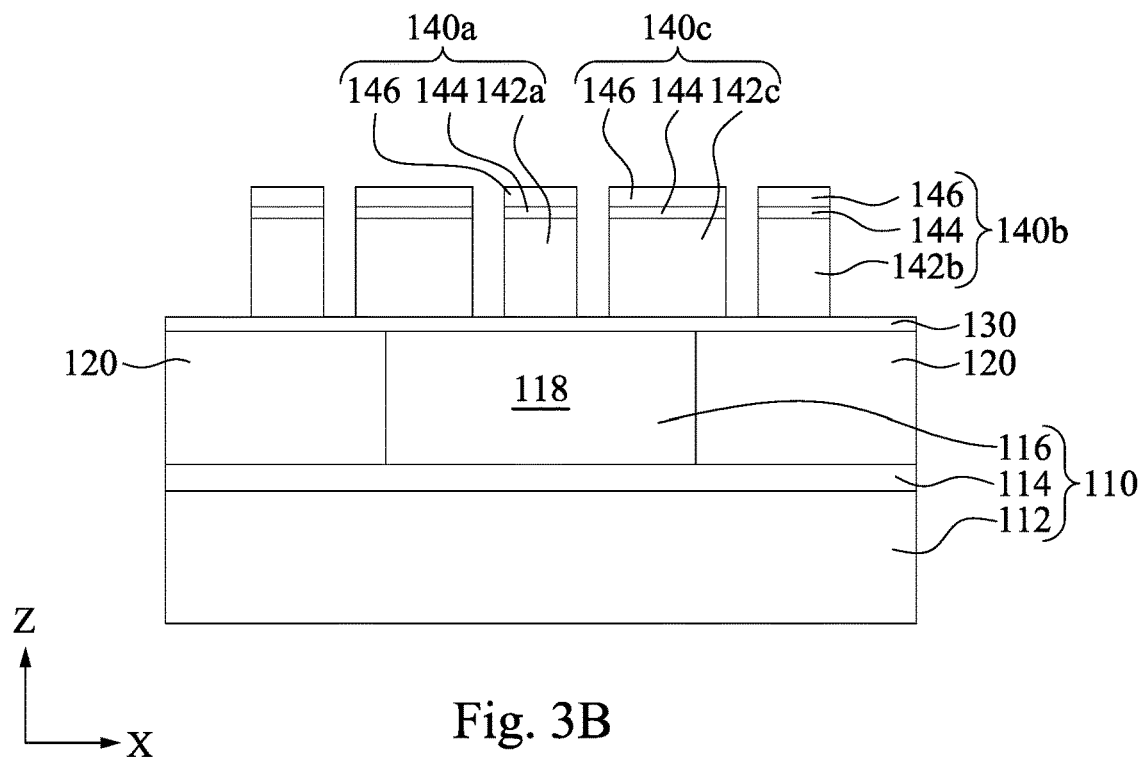

Reference is made to FIGS. 3A and 3B, where FIG. 3A is a top view for manufacturing a semiconductor device at various stages in accordance with some embodiments of the present disclosure, and FIG. 3B is a cross-sectional view taken along line B-B in FIG. 3A. A dummy dielectric layer 130 is formed to cover the active region 118 (and the isolation structures 120 in some embodiments). For clarity, the dummy dielectric layer 130 is illustrated in FIG. 3B and is omitted in FIG. 3A. In some embodiments, the dummy dielectric layer 130 may include silicon dioxide, silicon nitride, a high-κ dielectric material or other suitable material. In various examples, the dummy dielectric layer 130 may be deposited by an ALD process, a CVD process, a subatmospheric CVD (SACVD) process, a flowable CVD process, a PVD process, or other suitable process. By way of example, the dummy dielectric layer 130 may be used to prevent damage to the active region 118 by subsequent processing (e.g., subsequent formation of the dummy gate structure).

Subsequently, dummy gate stacks 140a, 140b, and 140c are formed above the dummy dielectric layer 130. The dummy gate stacks 140a and 140c are formed above the active region 118, and the dummy gate stacks 140b are formed above the isolation structure 120. Each of the dummy gate stacks 140a, 140b, and 140c includes a gate structure 142a (or 142b or 142c), a pad layer 144 formed over the gate structure 142a (or 142b or 142c), and a hard mask layer 146 formed over the pad layer 144. In some embodiments, a dummy gate layer (not shown) may be formed over the dummy dielectric layer 130, and the pad layers 144 and the hard mask layers 146 are formed over the dummy gate layer. The dummy gate layer is then patterned using the pad layers 144 and the hard mask layers 146 as masks to form the gate structure 142a-142c. As such, the gate structures 142a, 142b, 142c, the pad layer 144, and the hard mask layer 146 are referred to as the dummy gate stacks 140a, 140b, and 140c. In some embodiments, the gate structures 142a-142c may be made of polycrystalline-silicon (poly-Si), poly-crystalline silicon-germanium (poly-SiGe), or other suitable materials. The pad layer 144 may be made of silicon dioxide or other suitable materials, and the hard mask layer 146 may be made of silicon nitride or other suitable materials. It is noted that the arrangement of the dummy gate stacks 140a, 140b, and 140c in FIG. 3A is illustrative, and should not limit the scope of the present disclosure.

In FIGS. 3A and 3B, the dummy gate stacks 140a, 140b, and 140c are separated from each other. The dummy gate stacks 140c and the dummy gate stacks 140a and 140b extend in different directions. For example, the dummy gate stacks 140c extend in an x-direction, and the dummy gate stacks 140a and 140b extend in a y-direction. As shown in FIGS. 3A and 3B, the z-direction is parallel a normal line of the substrate 110, the x-direction is the direction in which the dummy gate stacks 140c extend, and the y-direction is the direction orthogonal to the z-direction and the x-direction. One of the dummy gate stacks 140c is between the dummy gate stack 140a and one of the dummy gate stacks 140b. Further, at least a portion of the dummy gate stack 140a is directly above the active region 118, and at least a portion of each of the dummy gate stacks 140c is directly above the active region 118. In contrast, the dummy gate stacks 140b do not overlap with the active region 118 and are directly above the isolation structure 120.

Figure 4A:
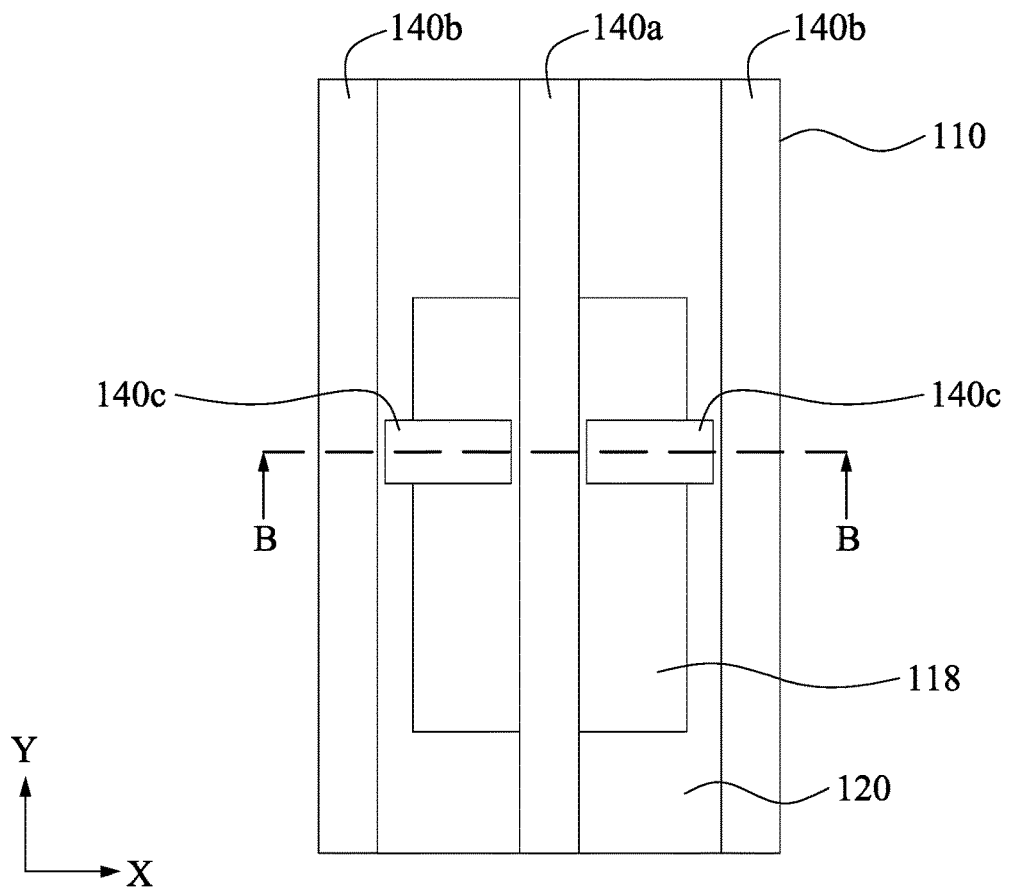
Figure 4B:
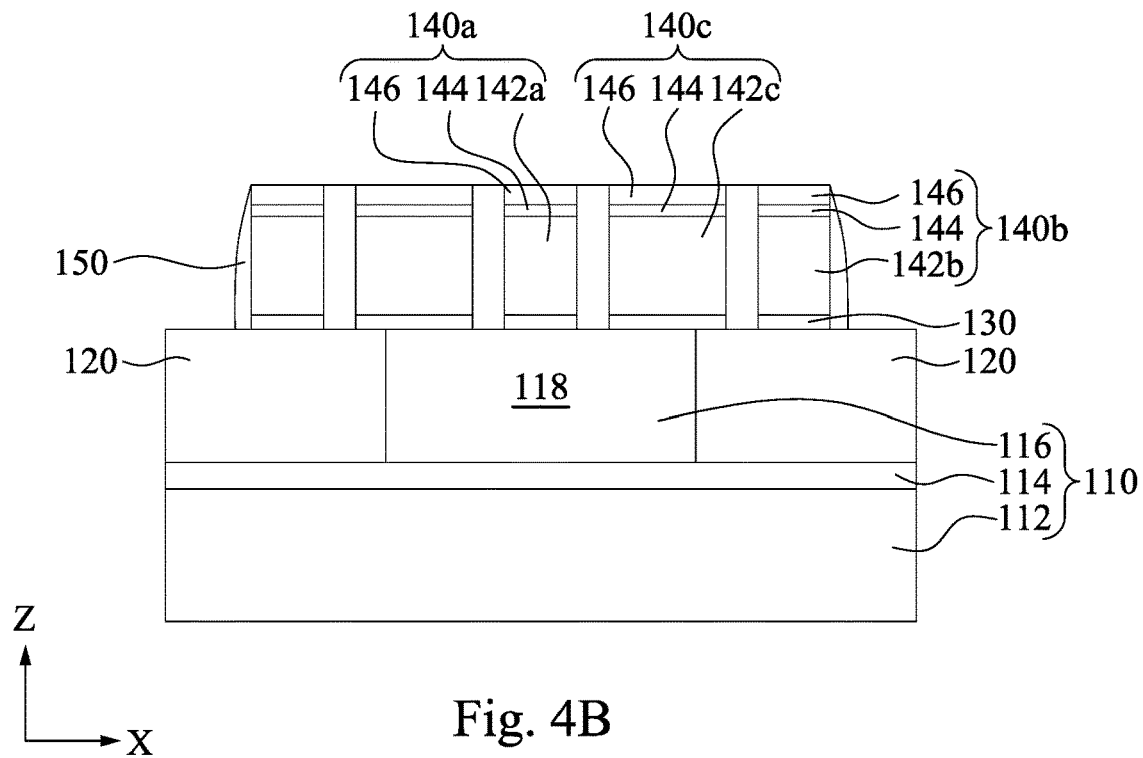

Reference is made to FIGS. 4A and 4B, where FIG. 4A is a top view for manufacturing a semiconductor device at various stages in accordance with some embodiments of the present disclosure, and FIG. 4B is a cross-sectional view taken along line B-B in FIG. 4A. Portions of the dummy dielectric layer 130 uncovered by the dummy gate stacks 140a, 140b, and 140c are removed to expose the active region 118 (and the isolation structure 120). Spacer structures 150 are then formed at least on opposite sides of the dummy gate stacks 140a, 140b, and 140c. For clarity, the spacer structures 150 are illustrated in FIG. 4B and are omitted in FIG. 4A. The spacer structures 150 may include a seal spacer and a main spacer (not shown). The spacer structures 150 include one or more dielectric materials, such as silicon oxide, silicon nitride, silicon oxynitride, SiCN, $SiC_xO_yN_z$, or combinations thereof. The seal spacers are formed on sidewalls of the dummy gate stack 140*a*, 140*b*, and 140*c* and the main spacers are formed on the seal spacers. The spacer structures 150 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 150 may include blanket forming spacer layers and then performing etching operations to remove the horizontal portions of the spacer layers. The remaining vertical portions of the spacer layers form the spacer structures 150.

Figure 5A:
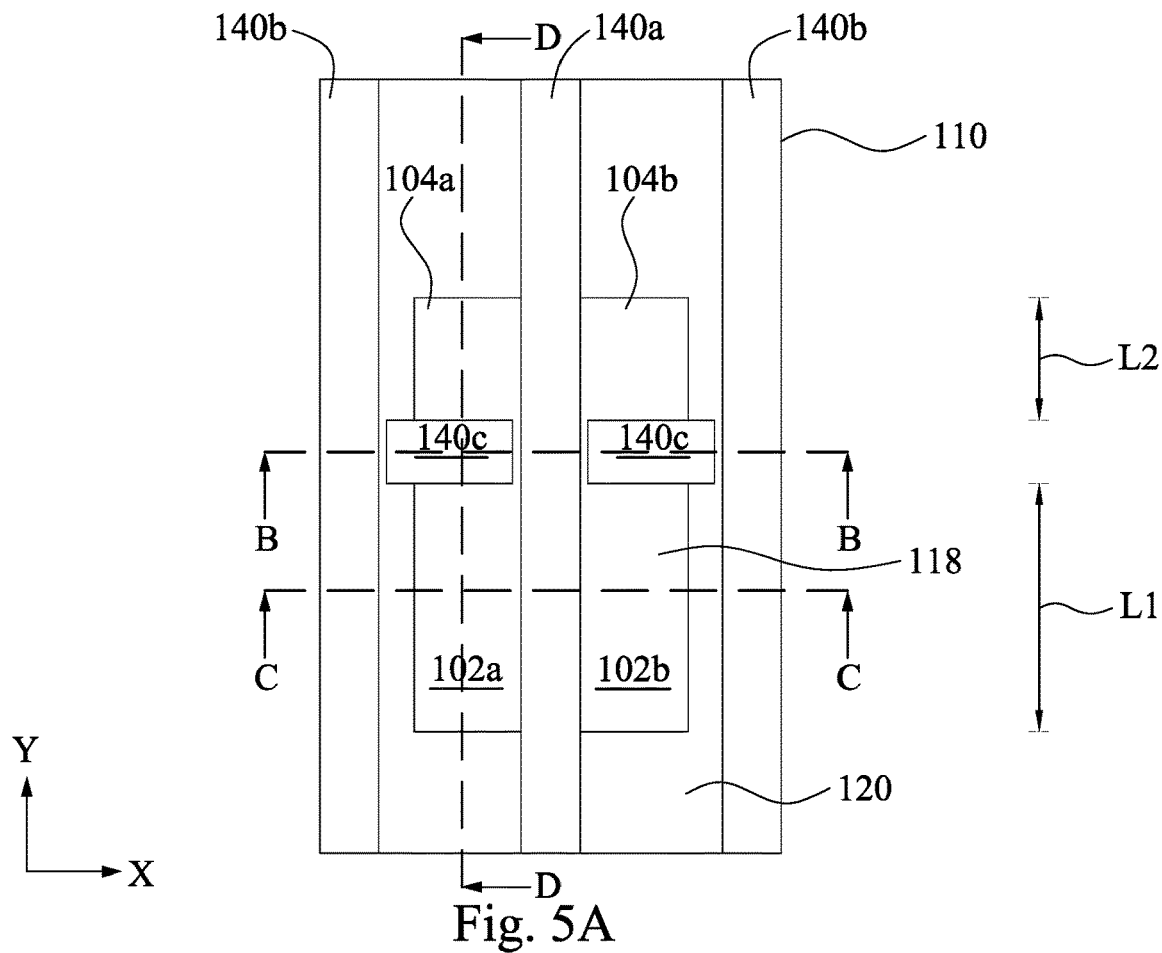
Figure 5B:
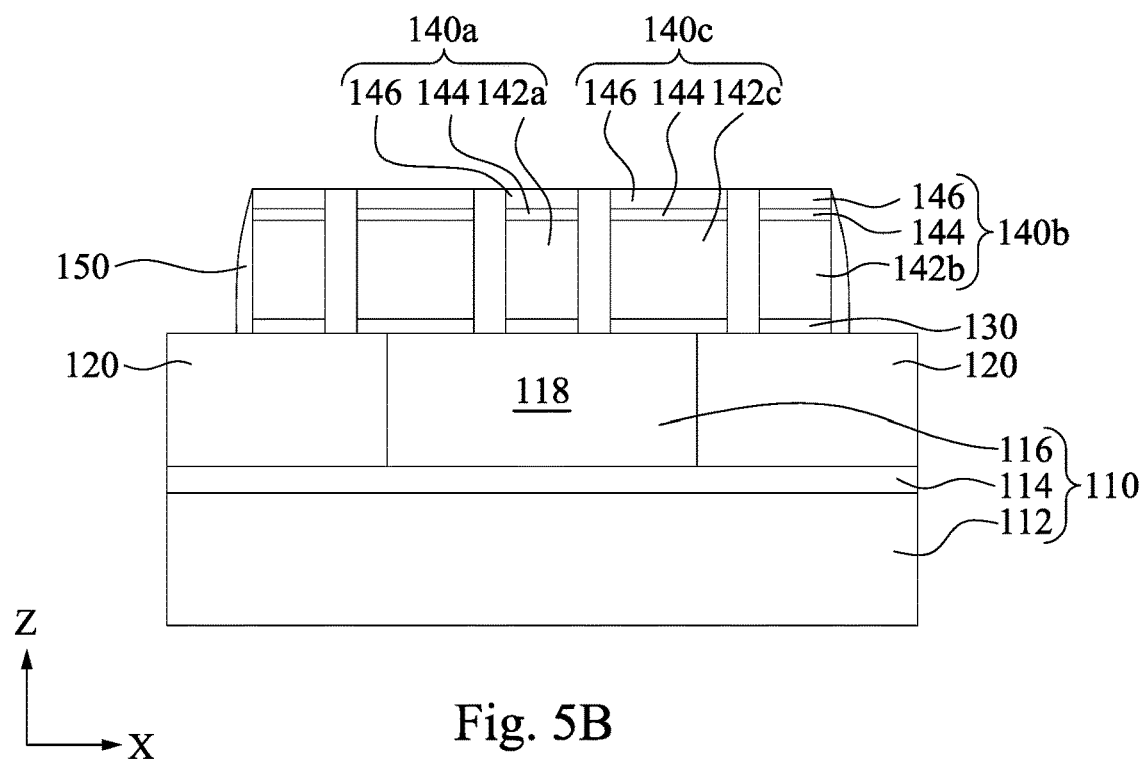
Figure 5C:
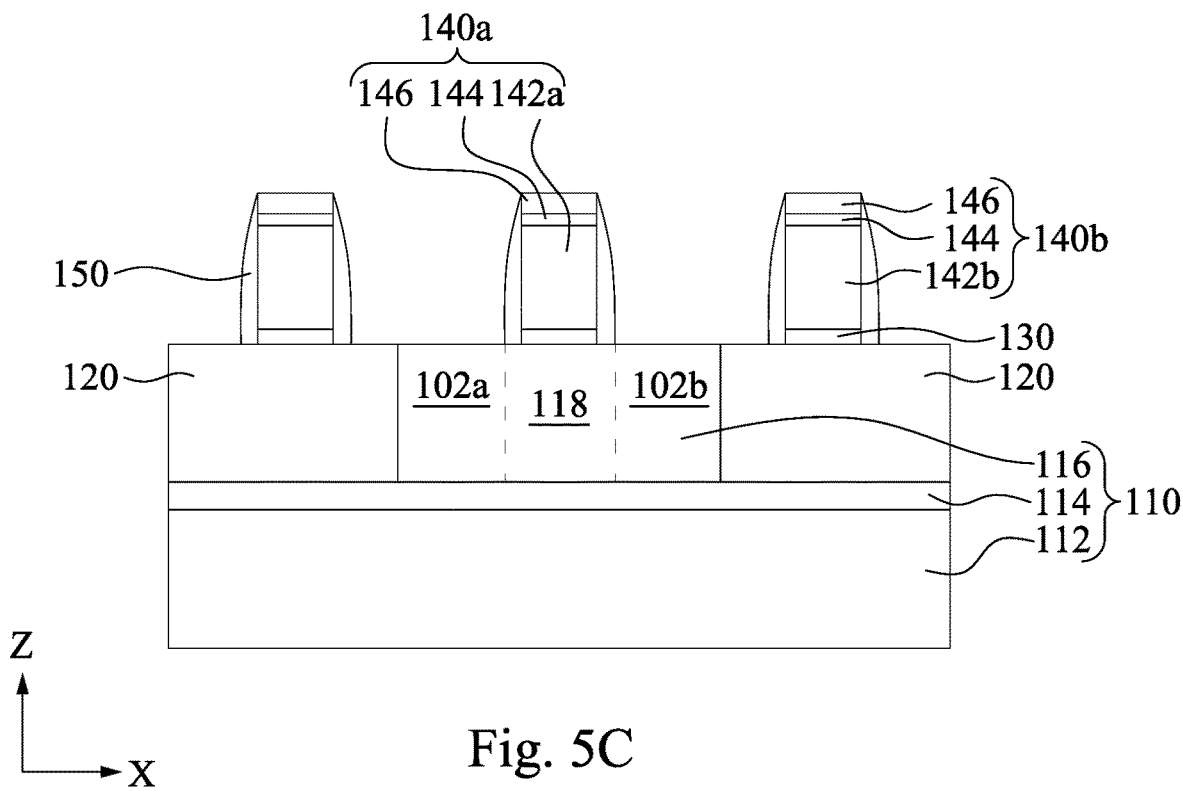
Figure 5D:
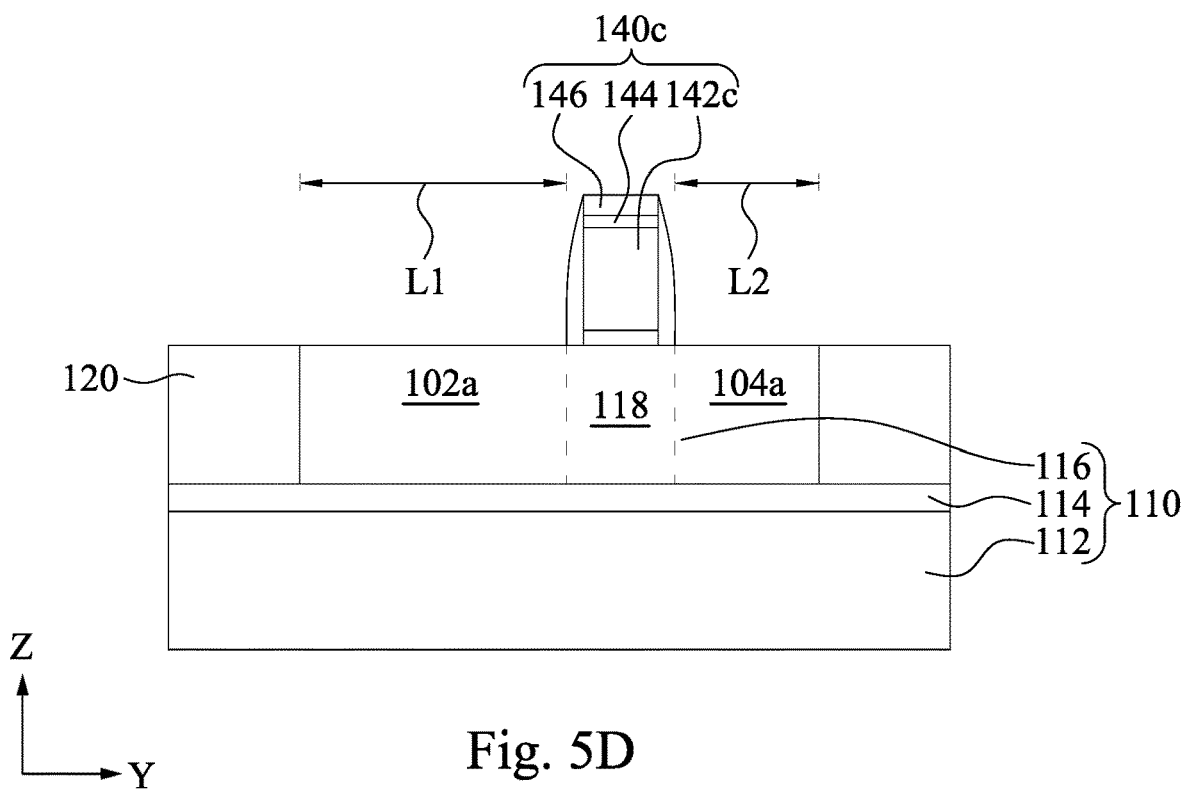

Reference is made to FIGS. 5A-5D, where FIG. 5A is a top view for manufacturing a semiconductor device at various stages in accordance with some embodiments of the present disclosure, FIG. 5B is a cross-sectional view taken along line B-B in FIG. 5A, FIG. 5C is a cross-sectional view taken along line C-C in FIG. 5A, and FIG. 5D is a cross-sectional view taken along line D-D in FIG. 5A. Source/drain regions 102*a* and 102*b* are formed in the active region 118 of the substrate 110. Specifically, the source/drain regions 102*a* and 102*b* are formed on one side of the dummy gate stacks 140*c*. In some embodiments, the source/drain regions 102*a* and 102*b* are formed by ion-implantation, diffusion techniques, or other suitable techniques. For example, a first mask is used to pattern a photoresist layer in a photolithography process or other suitable process. An exemplary photolithography process may include processing operations of photoresist coating, soft baking, mask aligning, exposing, post-exposure baking, developing, and hard baking. An ion implantation utilizing dopants may be performed to form the source/drain regions 102*a* and 102*b* in the active region 118. In some embodiments, the source/drain regions 102*a* and 102*b* are N-type doped regions, and the dopants implanted in the source/drain regions 102*a* and 102*b* may be arsenic, phosphorus, or other suitable materials.

In FIG. 5C, since the dummy gate stack 140*a* is used as a mask to implant the source/drain regions 102*a* and 102*b*, the source/drain regions 102*a* and 102*b* are not formed right under the dummy gate stack 140*a* and are separated by the dummy gate stack 140*a*. The source/drain regions 102*a* and 102*b* may be source/drain regions of a transistor, and a region of the active region 118 right under the dummy gate stack 140*a* and between the source/drain regions 102*a* and 102*b* is referred to as a channel of the transistor.

Subsequently, body regions 104*a* and 104*b* are formed in the active region 118 of the substrate 110. Specifically, the body regions 104*a* and 104*b* are formed on another side of the dummy gate stacks 140*c*. In some embodiments, the body regions 104*a* and 104*b* are formed by ion-implantation, diffusion techniques, or other suitable techniques. For example, a second mask is used to pattern a photoresist layer in a photolithography process or other suitable process. An exemplary photolithography process may include processing operations of photoresist coating, soft baking, mask aligning, exposing, post-exposure baking, developing, and hard baking. An ion implantation utilizing dopants may be performed to form the body regions 104*a* and 104*b* in the active region 118. It is noted that the formation sequence of the source/drain regions 102*a*-102*b* and body regions 104*a*-104*b* mentioned above is an example, and should not limit the present disclosure. In some embodiments, the source/drain regions 102*a*-102*b* may be formed after the formation of the body regions 104*a*-104*b*. In some embodiments, the body regions 104*a* and 104*b* are P-type doped regions, and the dopants implanted in the body regions 104*a* and 104*b* may be boron, boron difluoride ($BF_2$), or other suitable materials.

In FIG. 5D, since the dummy gate stack 140*c* is used as a mask to implant the source/drain regions 102*a*-102*b* and the body regions 104*a*-104*b*, the source/drain regions 102*a* and 102*b* and the body regions 104*a*-104*b* are not formed right under the dummy gate stack 140*c* and are separated by the dummy gate stack 140*c*. The body regions 104*a*-104*b* may be referred to as body regions of the transistor. The source/drain regions 102*a*-102*b* and the body regions 104*a*-104*b* have different conductivity types. Further, the body regions 104*a*-104*b* are separated from each other by the dummy gate stack 140*a* as shown in FIG. 5A. In some embodiments, each of the source/drain regions 102*a*-102*b* has a length L1 in the y-direction, and each of the body regions 104*a*-104*b* has a length L2 less than the length L1.

Figure 6A:
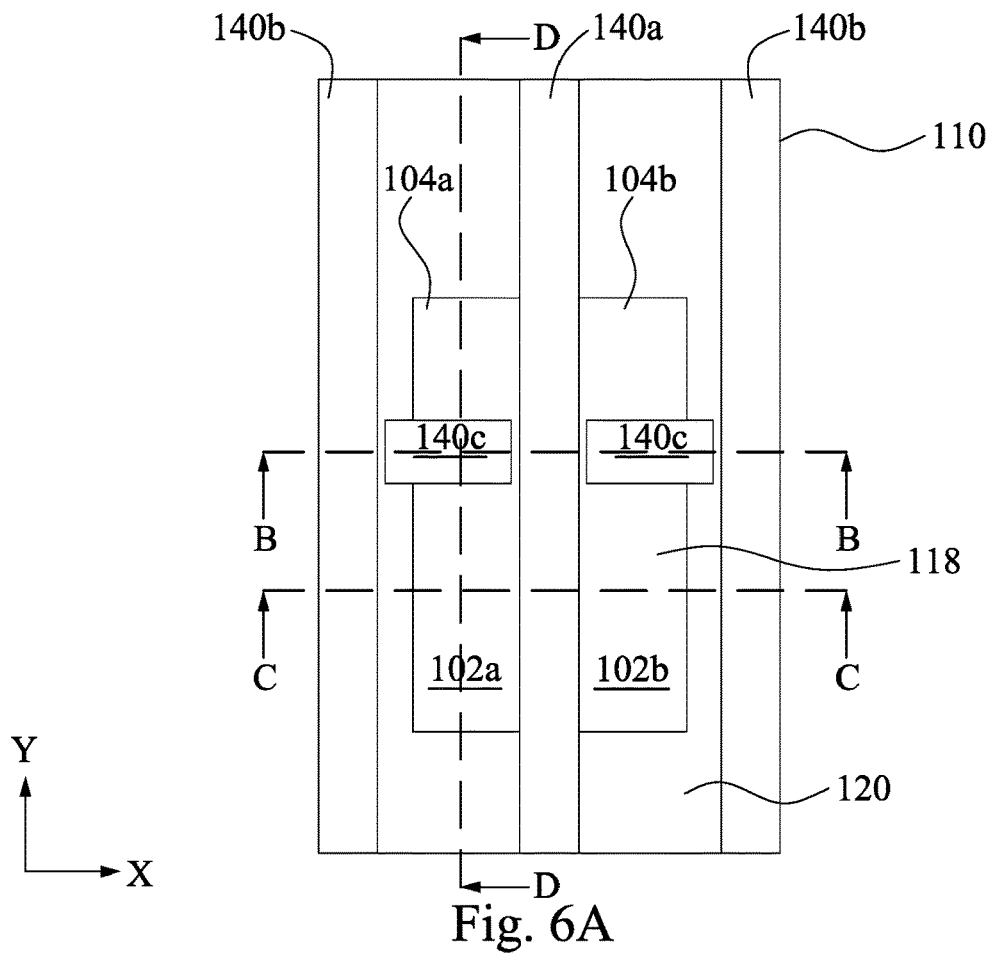
Figure 6B:
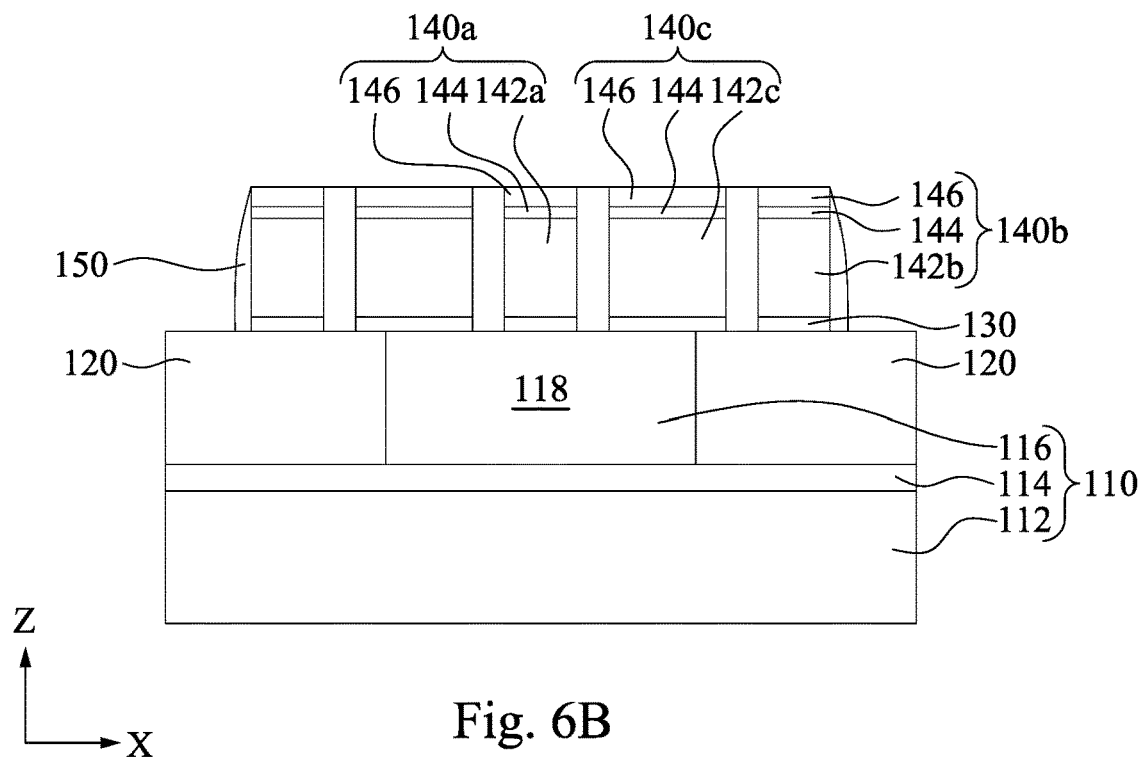
Figure 6C:
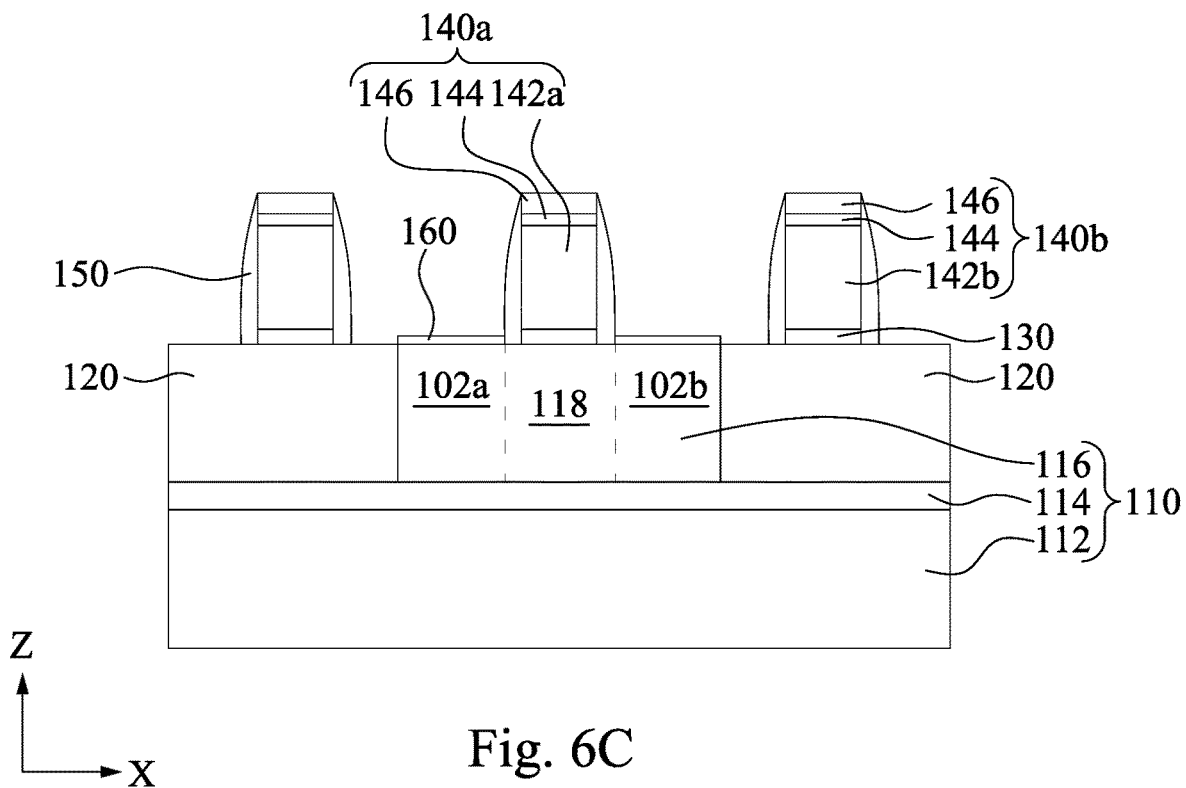
Figure 6D:
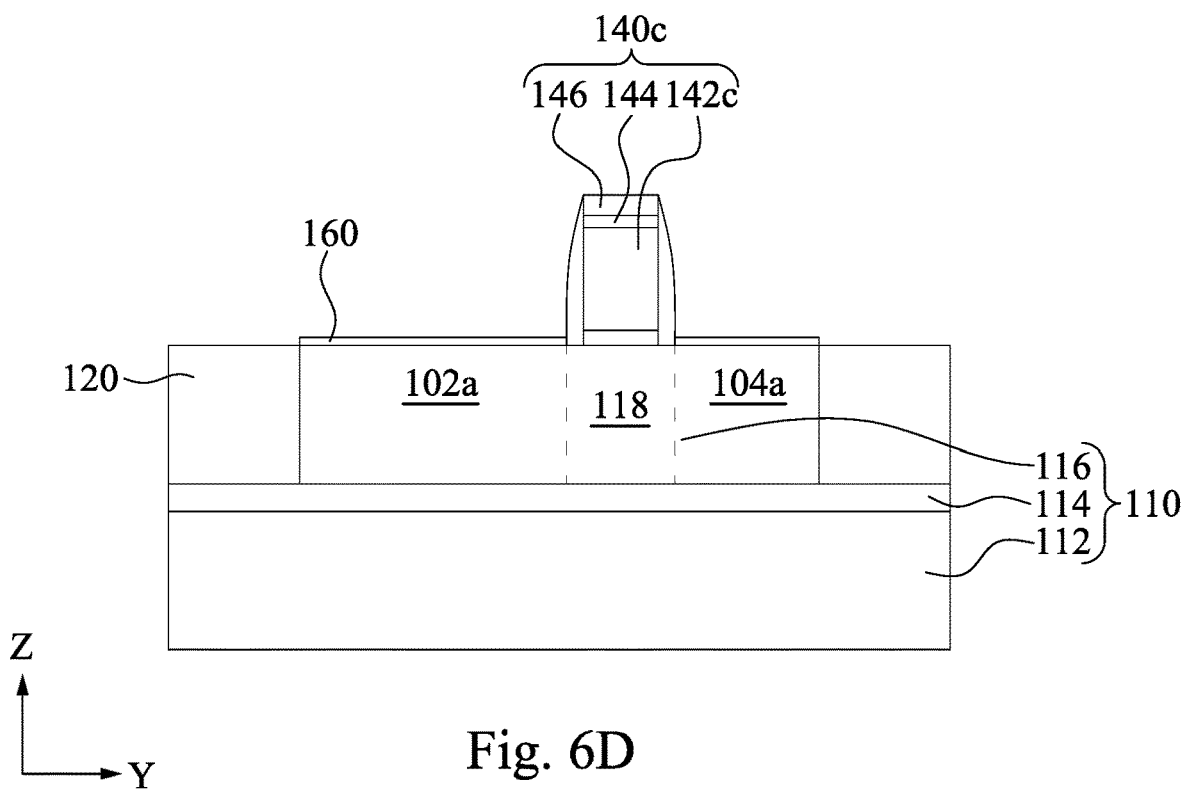

Reference is made to FIGS. 6A-6D, where FIG. 6A is a top view for manufacturing a semiconductor device at various stages in accordance with some embodiments of the present disclosure, FIG. 6B is a cross-sectional view taken along line B-B in FIG. 6A, FIG. 6C is a cross-sectional view taken along line C-C in FIG. 6A, and FIG. 6D is a cross-sectional view taken along line D-D in FIG. 6A. A plurality of metal alloy layers 160 are respectively formed over the source/drain regions 102*a*-102*b* and the body regions 104*a*-104*b*. For clarity, the metal alloy layers 160 are illustrated in FIGS. 6C-6D and are omitted in FIG. 6A. For example, a metal layer is formed over the active region 118. An annealing process is then performed on the metal layer to form the metal alloy layers 160. The annealing process is also referred to as a silicide process if the active regions 118 are made of silicon. The silicide process converts the surface portions of the active regions 118 into silicide contacts (i.e., the metal alloy layer 160 in this case). The silicide contacts remain over the active regions 118, while unreacted metal is removed from other areas. In some embodiments, the metal alloy layers 160 may be made of NiSi or other suitable materials.

Figure 7A:
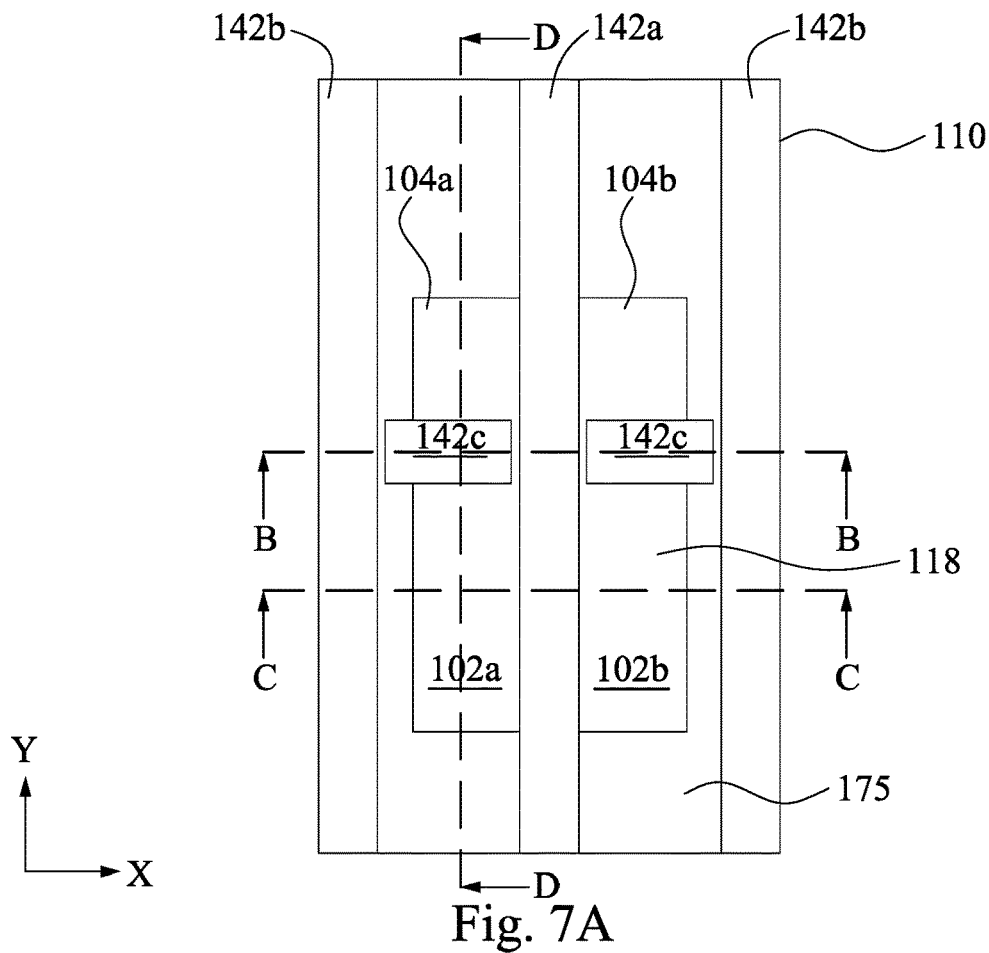
Figure 7B:
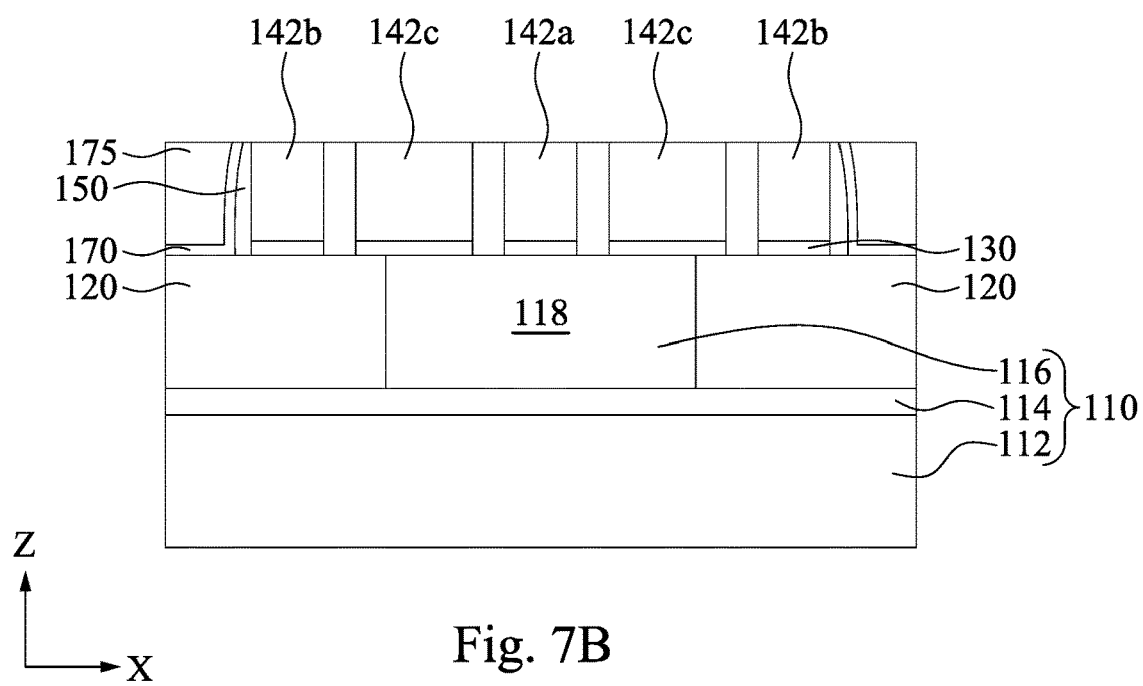
Figure 7C:
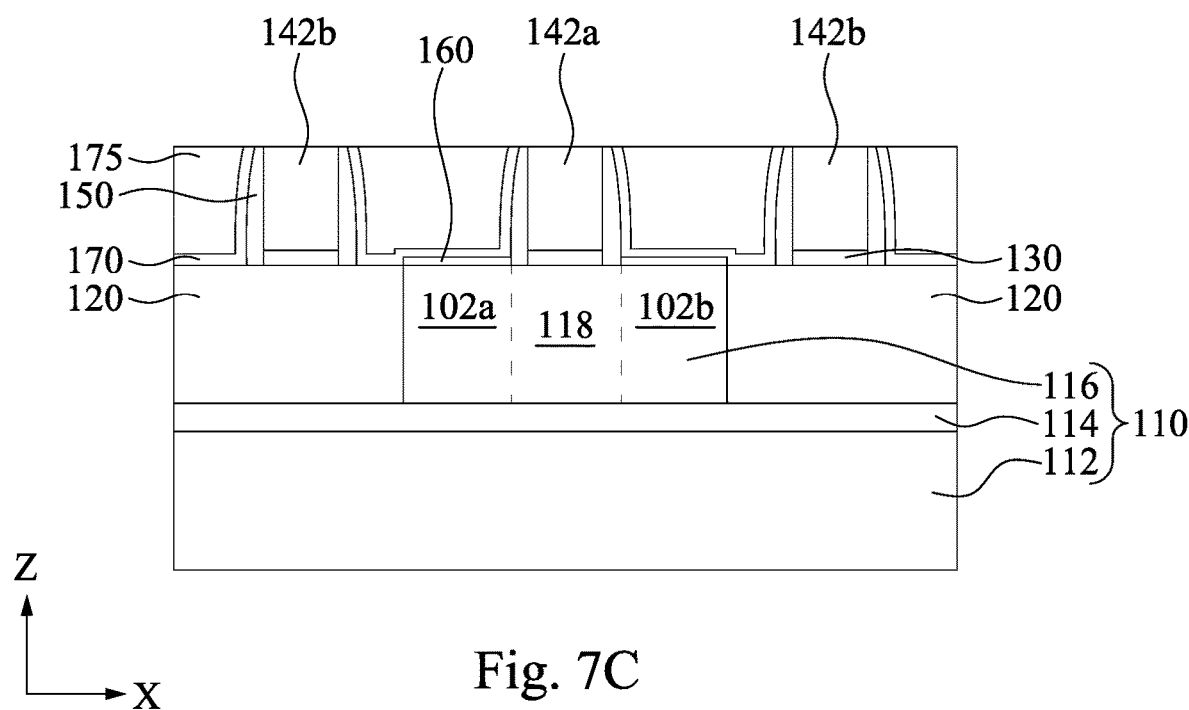
Figure 7D:
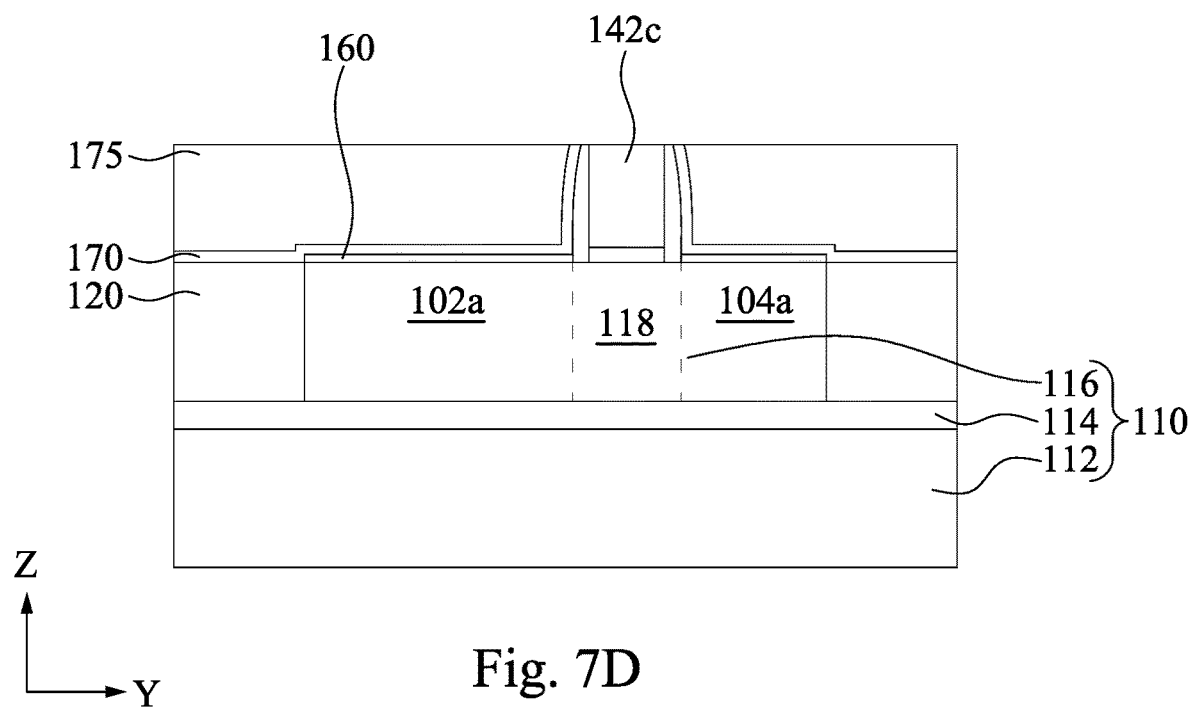

Reference is made to FIGS. 7A-7D, where FIG. 7A is a top view for manufacturing a semiconductor device at various stages in accordance with some embodiments of the present disclosure, FIG. 7B is a cross-sectional view taken along line B-B in FIG. 7A, FIG. 7C is a cross-sectional view taken along line C-C in FIG. 7A, and FIG. 7D is a cross-sectional view taken along line D-D in FIG. 7A. A contact etch stop layer (CESL) 170 is conformally formed over the structure of FIGS. 6A-6D. For clarity, the CESL 170 is illustrated in FIGS. 7B-7D and [[are]] is omitted in FIG. 7A. In some embodiments, the CESL 170 can be a stressed layer or layers. In some embodiments, the CESL 170 has a tensile stress and is formed of Si3N4. In some other embodiments, the CESL 170 includes materials such as oxynitrides. In yet some other embodiments, the CESL 170 may have a composite structure including a plurality of layers, such as a silicon nitride layer overlying a silicon oxide layer. The CESL 170 can be formed using plasma enhanced CVD (PECVD), however, other suitable methods, such as low pressure CVD (LPCVD), atomic layer deposition (ALD), and the like, can also be used.

A first interlayer dielectric (ILD) 175 is then formed on the CESL 170. The first ILD 175 may be formed by chemical vapor deposition (CVD), high-density plasma CVD, spin-on, sputtering, or other suitable methods. In some embodiments, the first ILD 175 includes silicon oxide. In some other embodiments, the first ILD 175 may include silicon oxy-nitride, silicon nitride, or a low-k material. Subsequently, a planarization process (such as a chemical mechanical planarization (CMP) process) is performed to level the top surface of the first ILD 175 with the top surface of the gate structures 142a, 142b, and 142c. That is, the gate structures 142a, 142b, and 142c are exposed from the first ILD 175. In some other embodiments, the planarization process level the top surface of the first ILD 175 with the top surface of the hard mask layer 146.

Figure 8A:
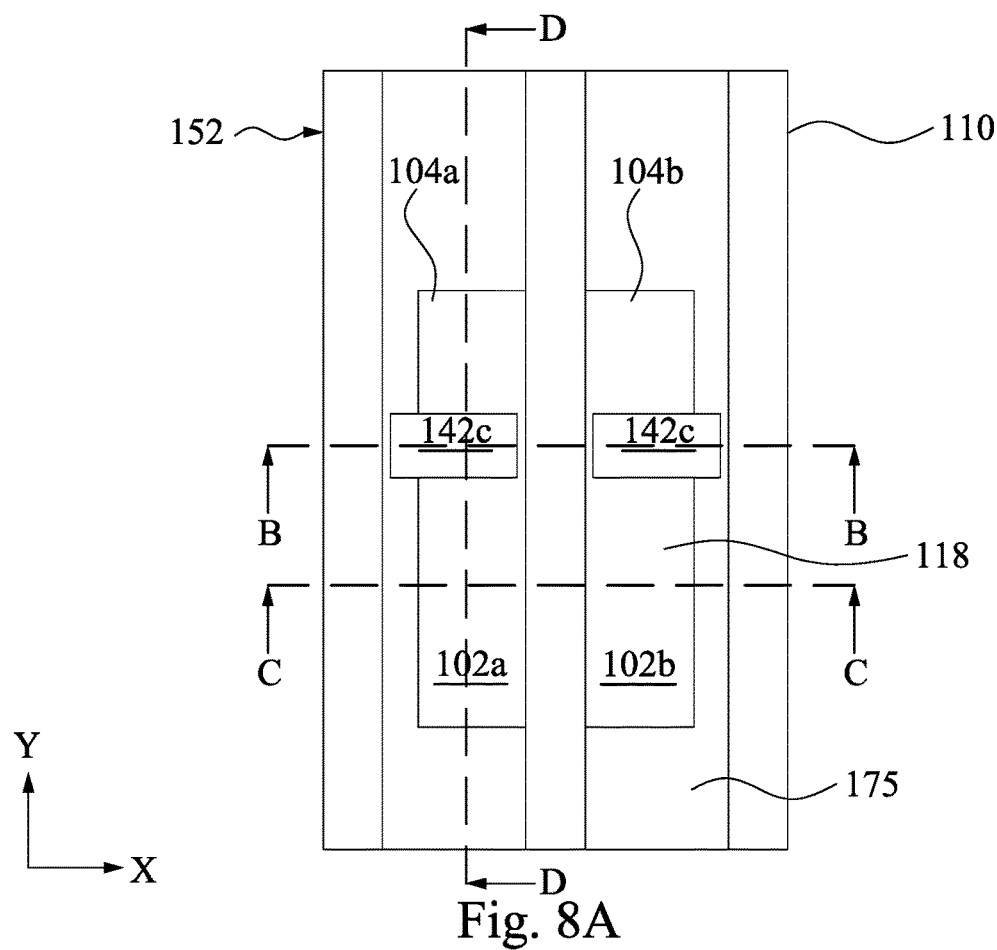
Figure 8B:
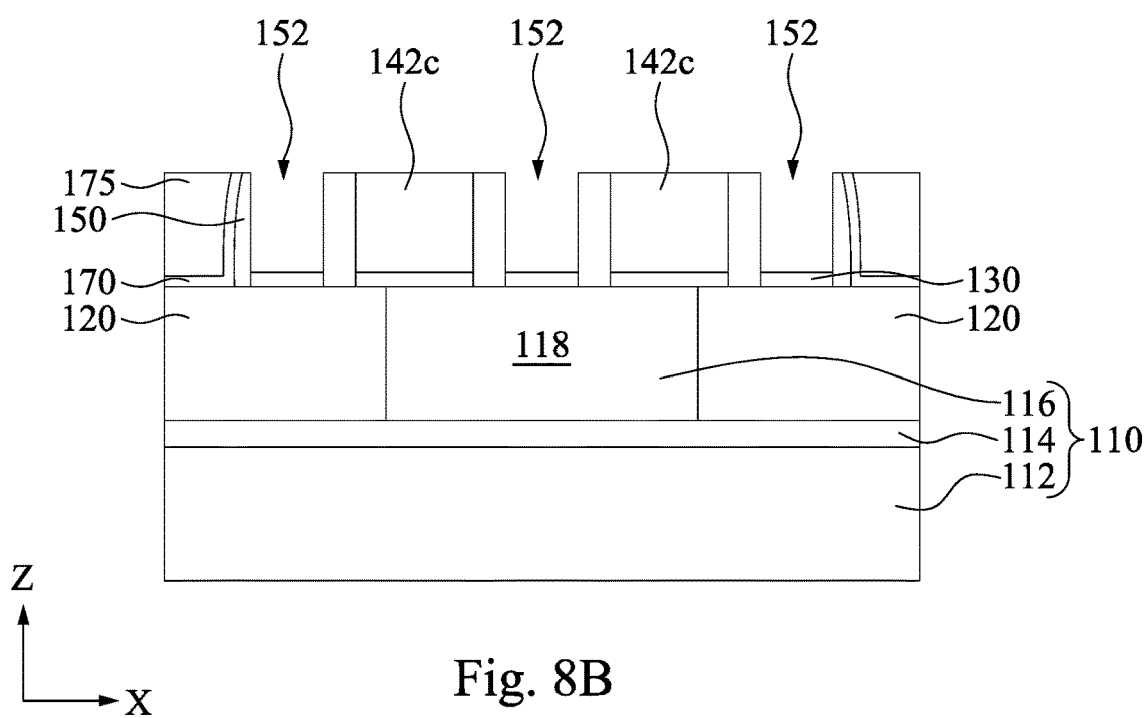
Figure 8C:
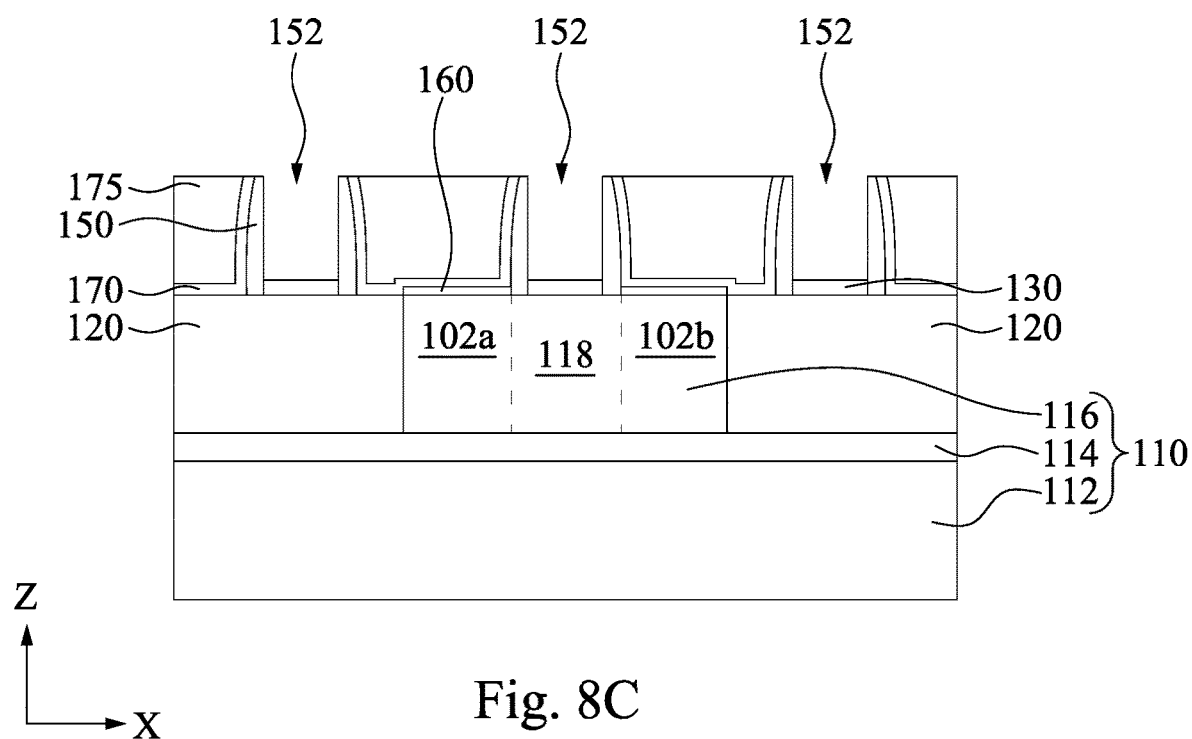
Figure 8D:
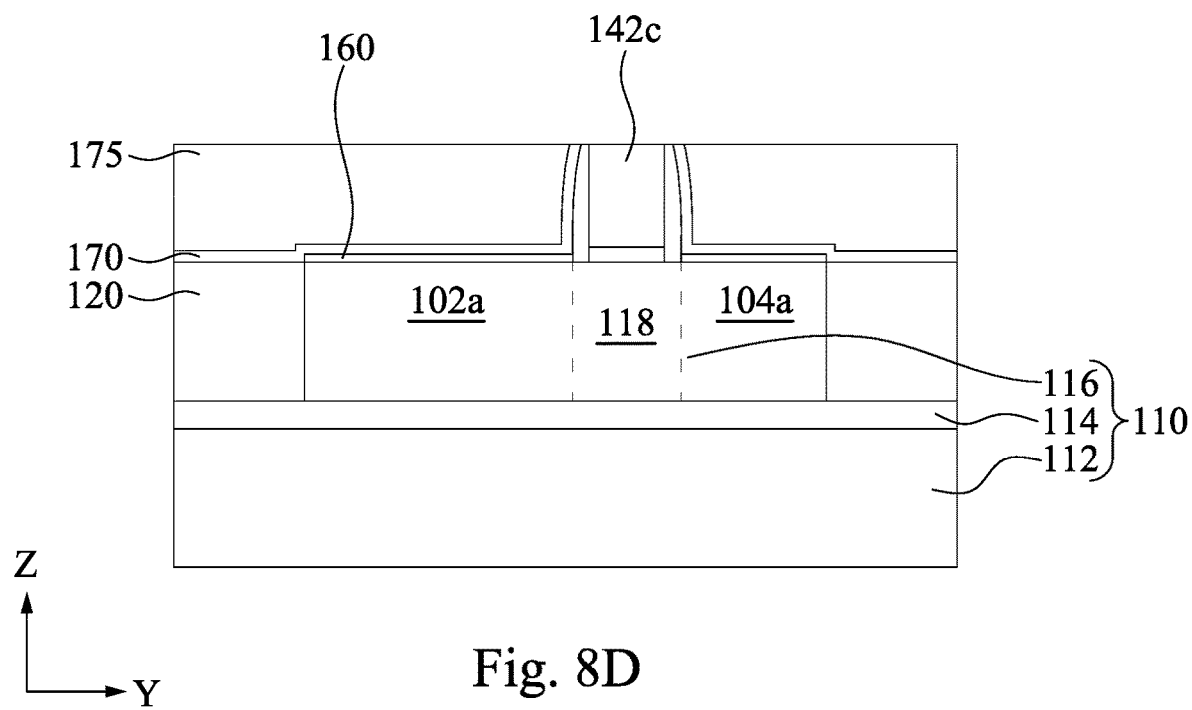

Reference is made to FIGS. 8A-8D, where FIG. 8A is a top view for manufacturing a semiconductor device at various stages in accordance with some embodiments of the present disclosure, FIG. 8B is a cross-sectional view taken along line B-B in FIG. 8A, FIG. 8C is a cross-sectional view taken along line C-C in FIG. 8A, and FIG. 8D is a cross-sectional view taken along line D-D in FIG. 8A. A replacement gate (RPG) process scheme is employed. In the RPG process scheme, a dummy polysilicon gate (the gate structures 142a and 142b of FIGS. 7A-7D in this case) is formed in advance and is replaced later by a metal gate. Specifically, a mask layer is formed over the structure of FIGS. 7A-7D, and the mask layer is patterned to form a patterned mask layer. The patterned mask layer exposes the gate structures 142a and 142b but covers the gate structures 142c. That is, the RPG process replaces the gate structures 142a and 142b with metal gate structures.

Subsequently, the gate structures 142a and 142b are removed to respectively form openings 152 with the spacer structures 150 as their sidewalls. The gate structures 142a and 142b may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 9A:
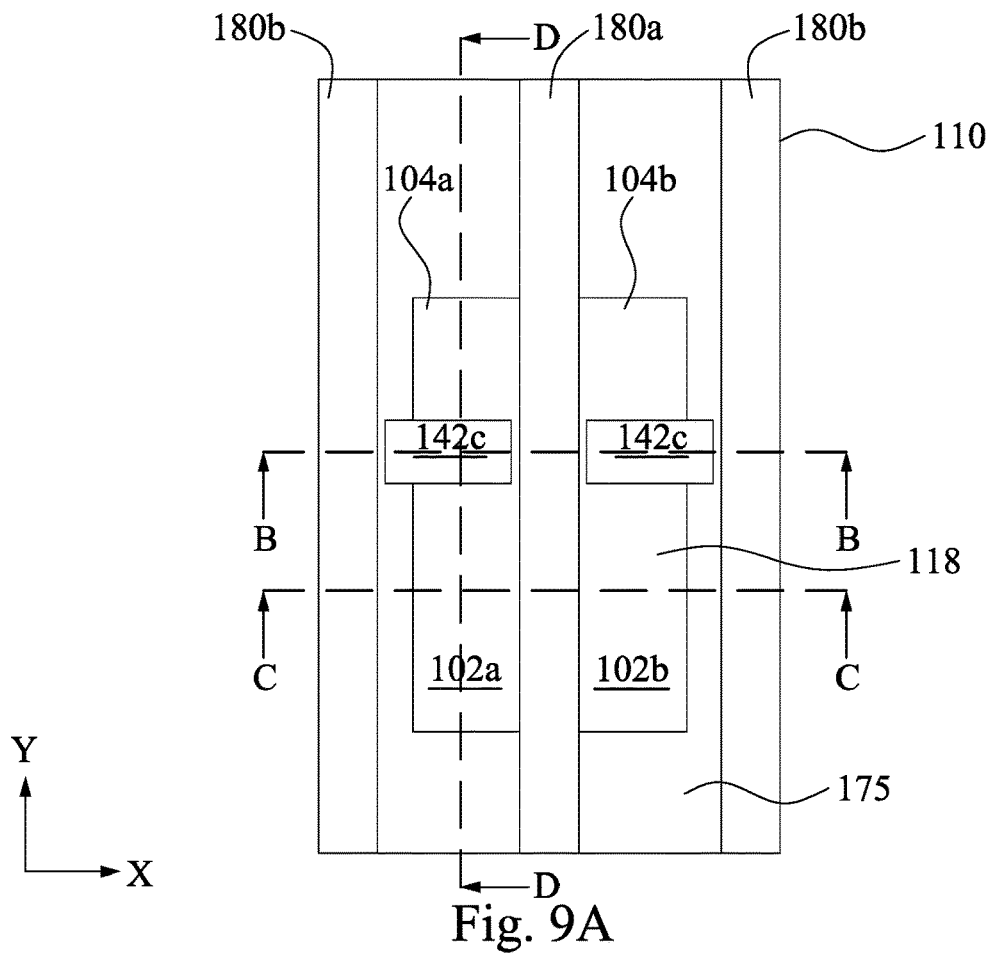
Figure 9B:
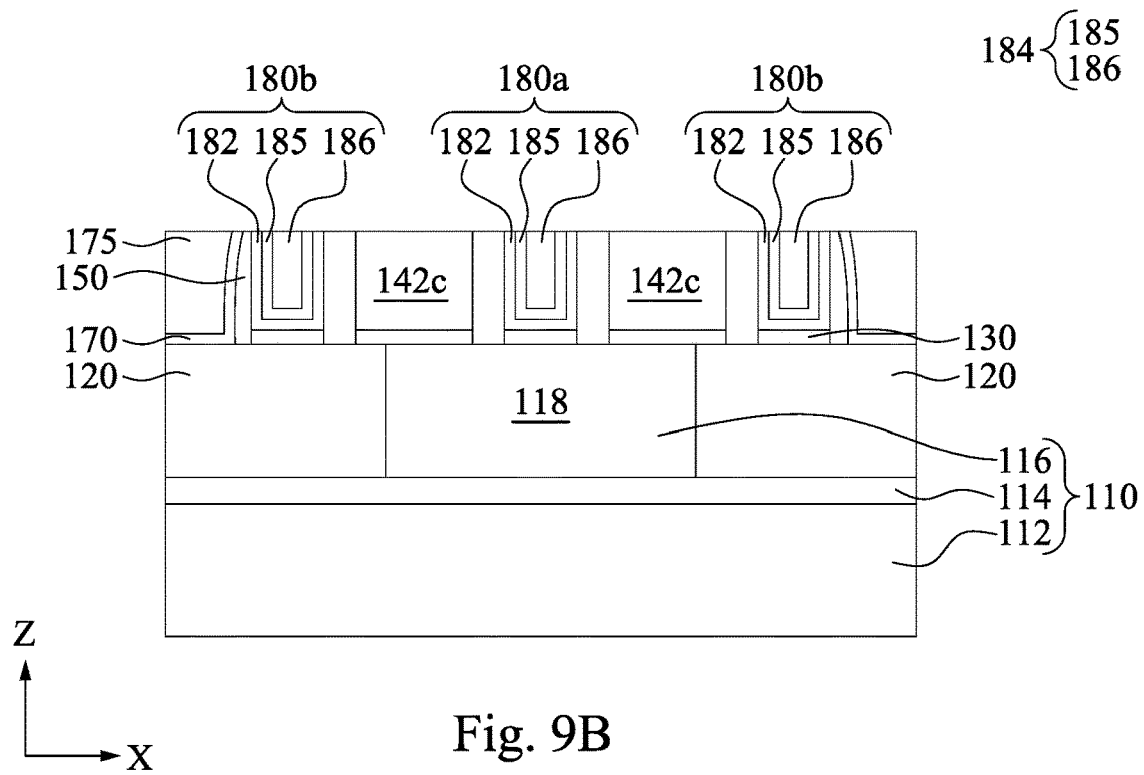
Figure 9C:
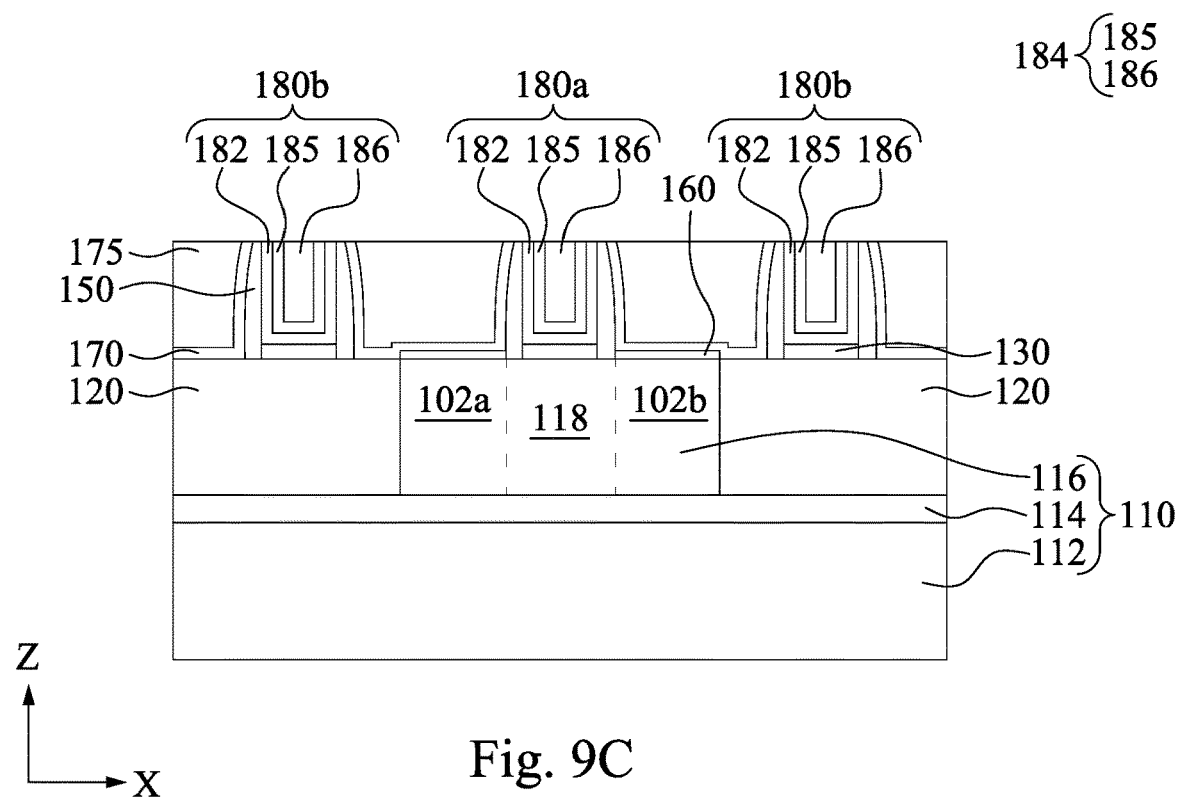
Figure 9D:
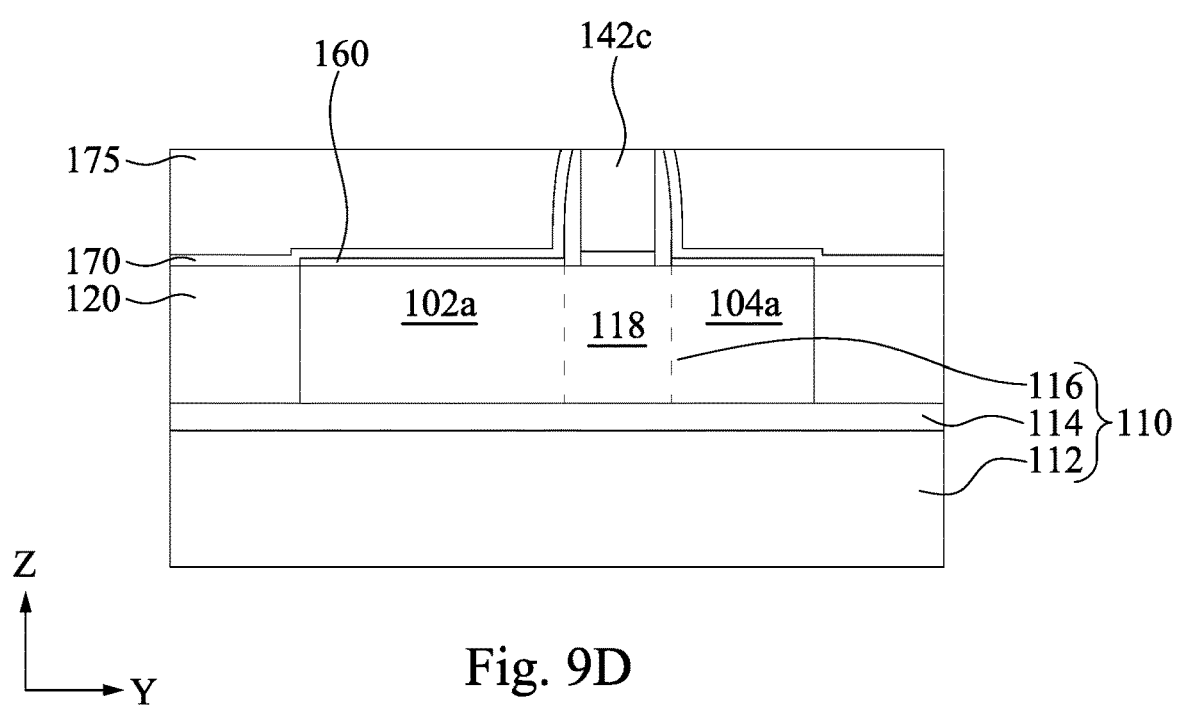

Reference is made to FIGS. 9A-9D, where FIG. 9A is a top view for manufacturing a semiconductor device at various stages in accordance with some embodiments of the present disclosure, FIG. 9B is a cross-sectional view taken along line B-B in FIG. 9A, FIG. 9C is a cross-sectional view taken along line C-C in FIG. 9C, and FIG. 9D is a cross-sectional view taken along line D-D in FIG. 9A. A gate dielectric layer 182 is formed in the openings 152 (see FIGS. 8A-8C), and at least one metal layer is formed in the openings 152 and on the gate dielectric layer 182. Subsequently, a chemical mechanical planarization (CMP) process is performed to planarize the metal layer and the gate dielectric layer 182 to form metal gate structures 180a and 180b respectively in the openings 152. That is, the gate structure 142a in FIG. 7A is replaced with the metal gate structure 180a, and the gate structures 142b in FIG. 7A is replaced with the metal gate structures 180b. Each of the metal gate structures 180a and 180b includes the gate dielectric layer 182 and a metal gate electrode 184 over the gate dielectric layer 182. The metal gate electrode 184 may include metal layers 185, e.g., work function metal layer(s) and capping layer(s), a fill layer(s) 186, and/or other suitable layers that are desirable in a metal gate structure. The work function metal layer may include p-type work function metal. Exemplary p-type work function metals include TiN, TaN, Ru, Mo, Al, WN, $ZrSi_2$, $MoSi_2$, $TaSi_2$, $NiSi_2$, other suitable p-type work function materials, or combinations thereof. The work function metal layer may have multiple layers. The work function metal layer(s) may be deposited by CVD, PVD, electroplating and/or other suitable process. In some embodiments, the capping layer in the metal gate electrodes may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer 186 in the metal gate electrodes may include tungsten (W). The fill layer 186 may be deposited by ALD, PVD, CVD, or other suitable process.

Figure 10A:
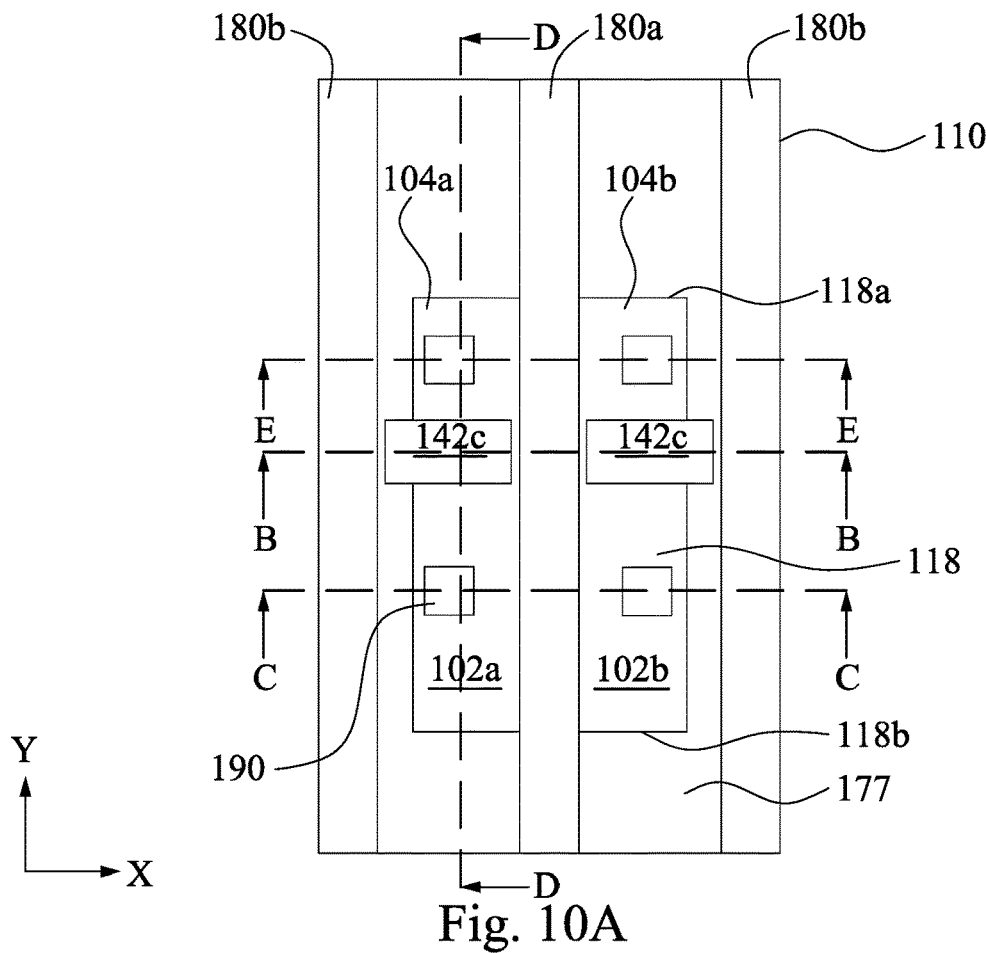
Figure 10B:
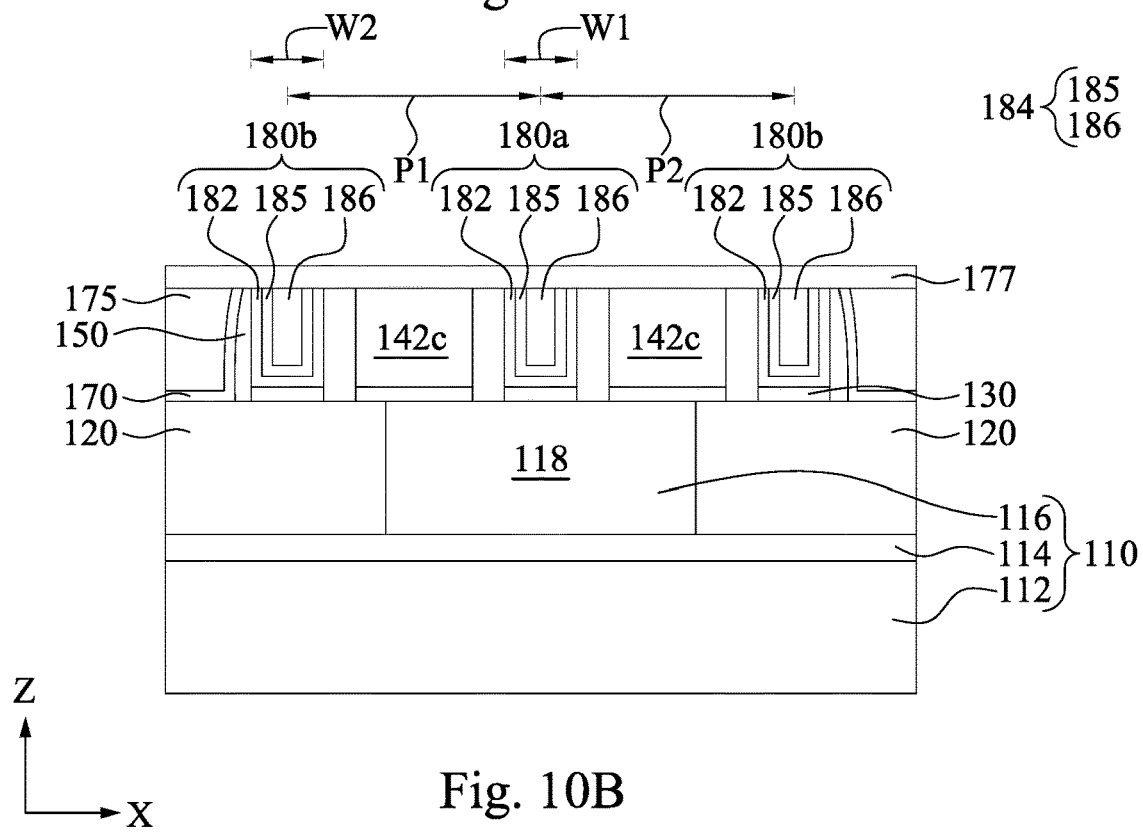
Figure 10C:
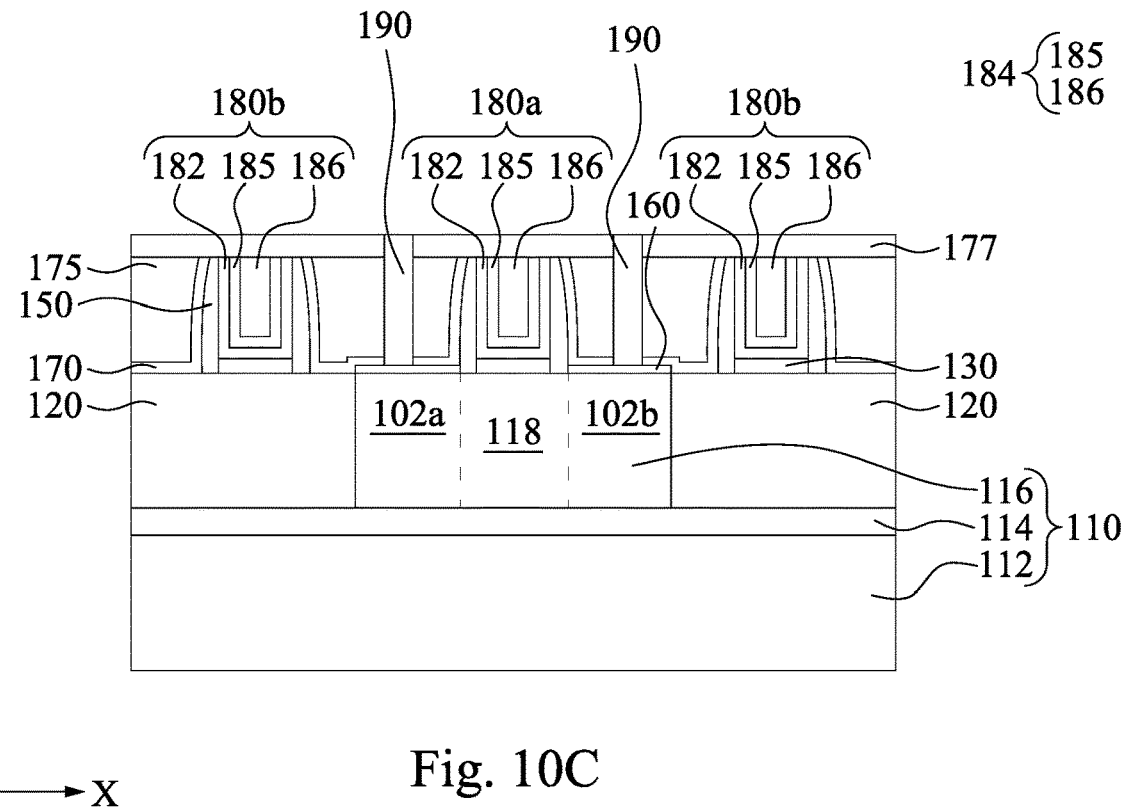
Figure 10D:
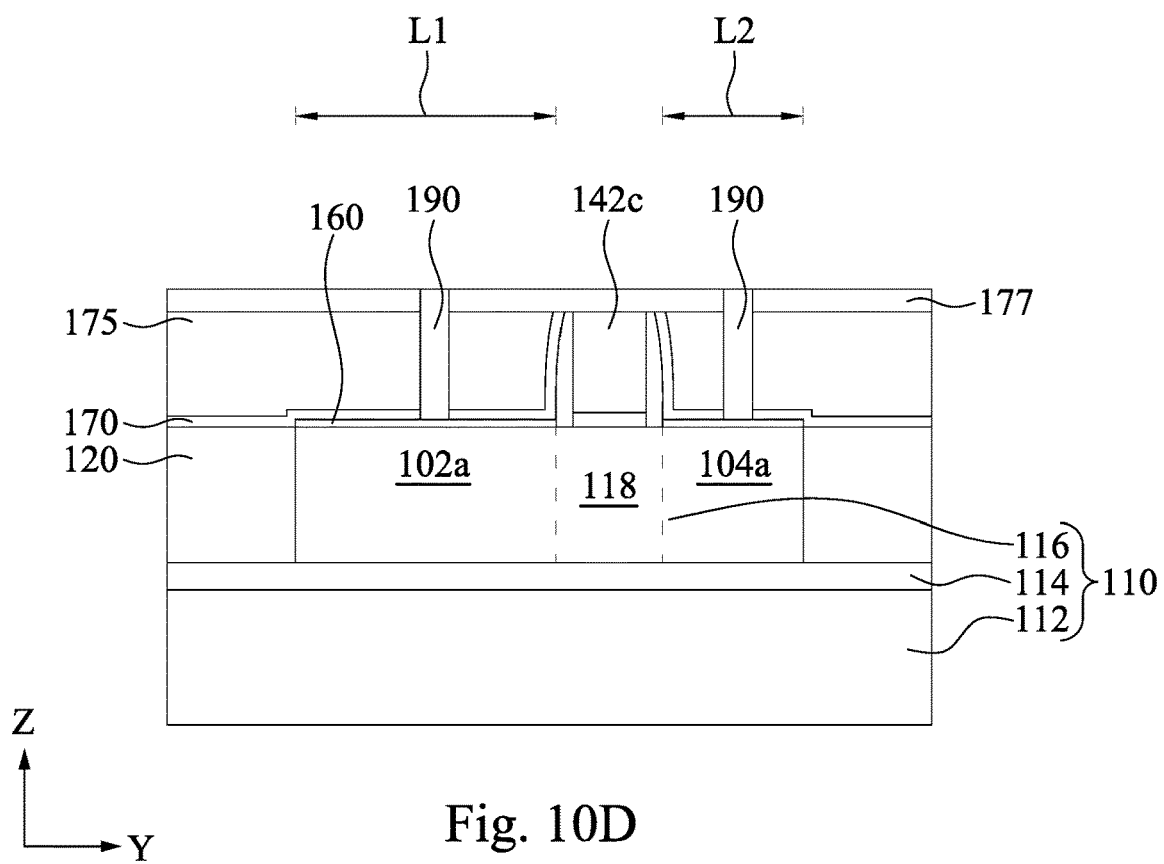
Figure 10E:
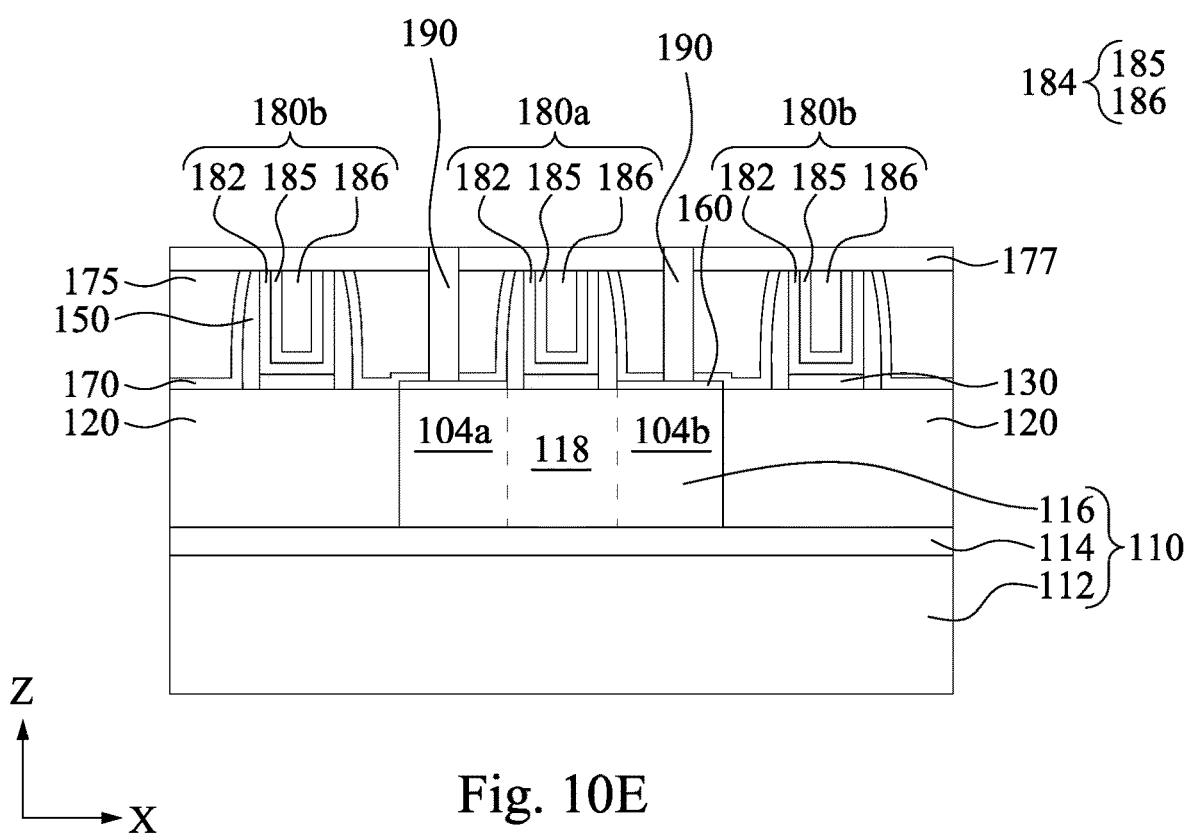

Reference is made to FIGS. 10A-10E, where FIG. 10A is a top view for manufacturing a semiconductor device at various stages in accordance with some embodiments of the present disclosure, FIG. 10B is a cross-sectional view taken along line B-B in FIG. 10A, and FIG. 10C is a cross-sectional view taken along line C-C in FIG. 10A, FIG. 10D is a cross-sectional view taken along line D-D in FIG. 10A, and FIG. 10E is a cross-sectional view taken along line E-E in FIG. 10A. A plurality of contacts 190 are formed over the memory cells source/drain regions 102a-102b and the body regions 104a-104b. For example, a second ILD layer 177 is formed above the structure in FIG. 9A, and a plurality of the openings are formed in the first and second ILDs 175 and 177. Conductive materials are then filled in the openings. The excess portions of the conductive materials are removed to form the contacts 190 respectively in contact with the metal alloy layers 160. The contacts 190 may be made of tungsten, aluminum, copper, or other suitable materials.

In FIG. 10A, the semiconductor device may be a body contact MOS device and includes the active region 118, the metal gate structures 180a and 180b, and the gate structures 142c. The metal gate structure 180a is referred to as intrinsic gates and extends in the y-direction. The gate structures 142c are referred to as extrinsic gates and extend in the x-direction. For example, the metal gate structure 180a and the gate structures 142c are substantially orthogonal to each other. The metal gate structures 180b are referred to as dummy gate structures. Portions of the metal gate structure 180a and the gate structure 142c are directly above the active region 118, and the metal gate structures 180b are directly above the isolation structure 120. In some embodiments, the active region 118 has opposite sides 118a and 118b, and the metal gate structure 180a extends beyond the opposite sides 118a and 118b of the active region 118.

As shown in FIGS. 10A and 10B, one of the gate structures 142c is between the metal gate structure 180a and one of the metal gate structures 180b to form an H shape. The metal gate structures 180a and 180b and the gate structures 142c are electrically isolated from each other. That is, the metal gate structures 180a and 180b and the gate structures 142c are separated from each other by the spacer structures 150. Portions of the spacer structure 150 are between and in contact with the metal gate structures 180a (or 180b) and the gate structure 142c. In some embodiments, the metal gate structure 180a is a functional gate, which is electrically connected to a (electrically) conductive trace (see FIG. 14B for example), and the gate structures 142c are floating. That is, there is no via (and electrically conductive trace) connected to the gate structures 142c in some embodiments.

The metal gate structures 180a and 180b have substantially the same gate pitch. That is, a distance P1 between the metal gate structure 180a and one of the metal gate structures 180b is substantially the same as a distance P2 between the metal gate structure 180a and another one of the metal gate structures 180b. Furthermore, the metal gate structures 180a and 180b have substantially the same width. That is, the width W1 of the metal gate structure 180a is substantially the same as the width W2 of the metal gate structure 180b.

As shown in FIGS. 10A and 10C, the active region 118 includes the source/drain regions 102a and 102b. The source/drain regions 102a and 102b are on opposite sides of the metal gate structure 180*a*, and a channel (i.e., a portion of the active region 118 right below the metal gate structure 180*a*) is between the source/drain regions 102*a* and 102*b* and right under the metal gate structure 180*a*. Two of the contacts 190 are respectively above the source/drain regions 102*a* and 102*b*. Further, the source/drain regions 102*a* and 102*b* have the same conductivity type, e.g., N-type in this case.

As shown in FIGS. 10A and 10E, the active region 118 further includes the body regions 104*a* and 104*b*. The body regions 104*a* and 104*b* are on opposite sides of the metal gate structure 180*a*. Another two of the contacts 190 are respectively above the body regions 104*a* and 104*b*. Further, the body regions 104*a* and 104*b* have the same conductivity type, e.g., P-type in this case.

As shown in FIGS. 10A and 10D, the source/drain region 102*a* and the body region 104*a* are spaced apart from each other and on opposite sides of one of the gate structures 142*c*. Each of the source/drain regions 102*a*-102*b* has the length L1 in the y-direction, and each of the body regions 104*a*-104*b* has the length L2 less than the length L1. The body regions 104*a*-104*b* and the source/drain regions 102*a*-102*b* have different conductivity types. The source/drain region 102*a*, the body region 104*a*, and one of the gate structures 142*c* are on a same side of the metal gate structure 180*a*, and the source/drain region 102*b*, the body region 104*b*, and another of the gate structures 142*c* are on another side of the metal gate structure 180*a*. In FIG. 10A, the source/drain region 102*a* and the body region 104*a* are arranged along the y-direction. Similarly, the source/drain region 102*b* and the body region 104*b* are arranged along the y-direction.

Figure 11:
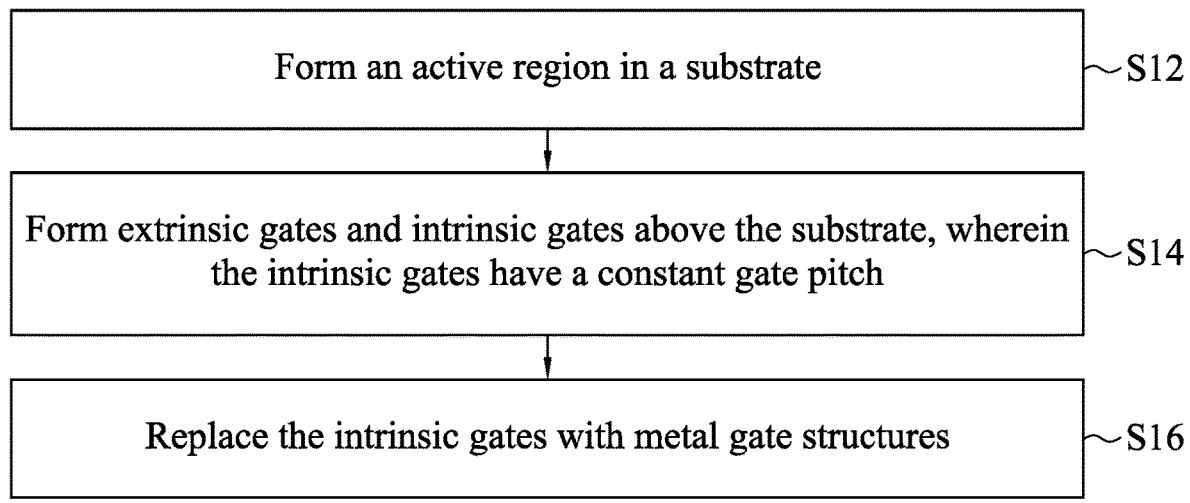
FIG. 11 is a flow chart of a method for forming a semiconductor device in accordance with some embodiments of the present disclosure.

FIG. 11 is a flow chart of a method M for forming a semiconductor device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, an active region is formed in a substrate. FIGS. 1A-2B illustrate top views and cross-sectional views of some embodiments corresponding to act in block S12. At block S14, extrinsic gates and intrinsic gates are formed above the substrate, wherein the intrinsic gates have a constant gate pitch. FIGS. 3A and 3B illustrate a top view and a cross-sectional view of some embodiments corresponding to act in block S14. In FIG. 3A, the gate structures 142*a* and 142*b* may be referred to as the intrinsic gates, and the gate structures 142*c* may be referred to as the extrinsic gates. At block S16, the intrinsic gates are replaced with metal gate structures. FIGS. 8A-9B illustrate top views and cross-sectional views of some embodiments corresponding to act in block S16.

Figure 12A:
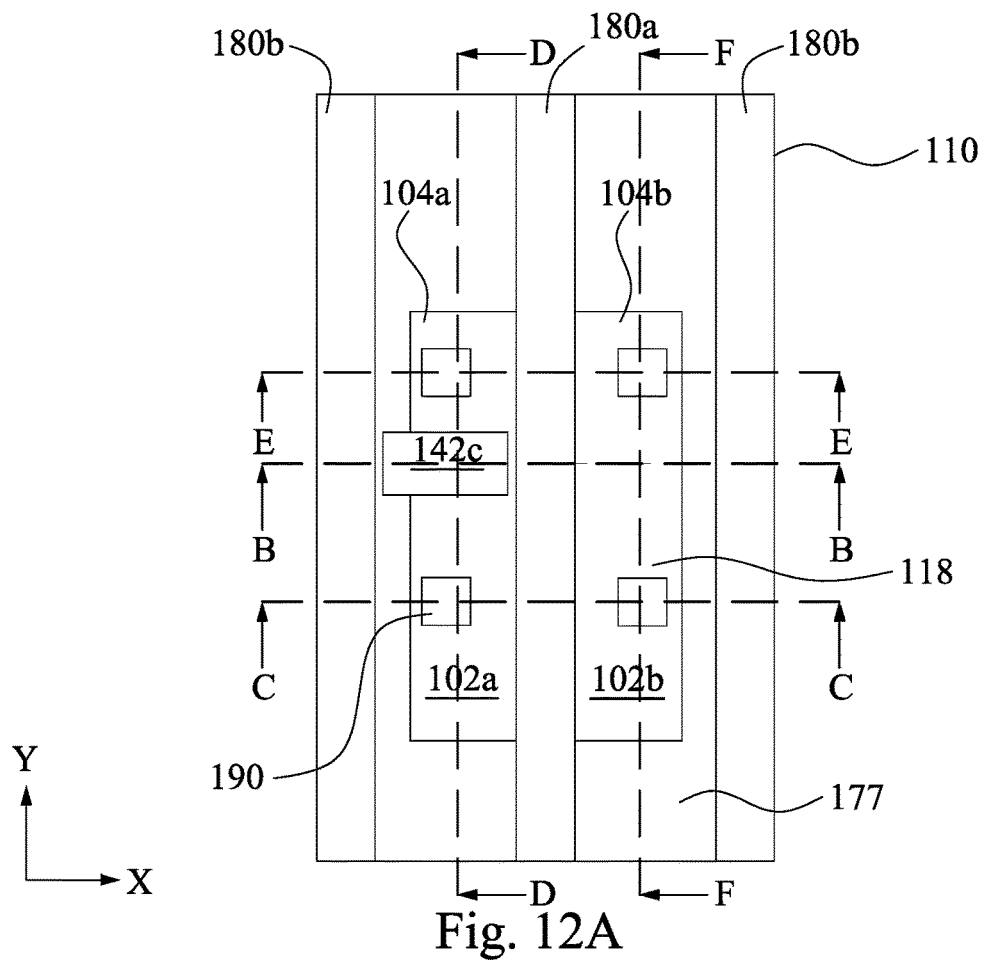
FIG. 12A is a top view of a semiconductor device in accordance with some embodiments of the present disclosure.
Figure 12B:
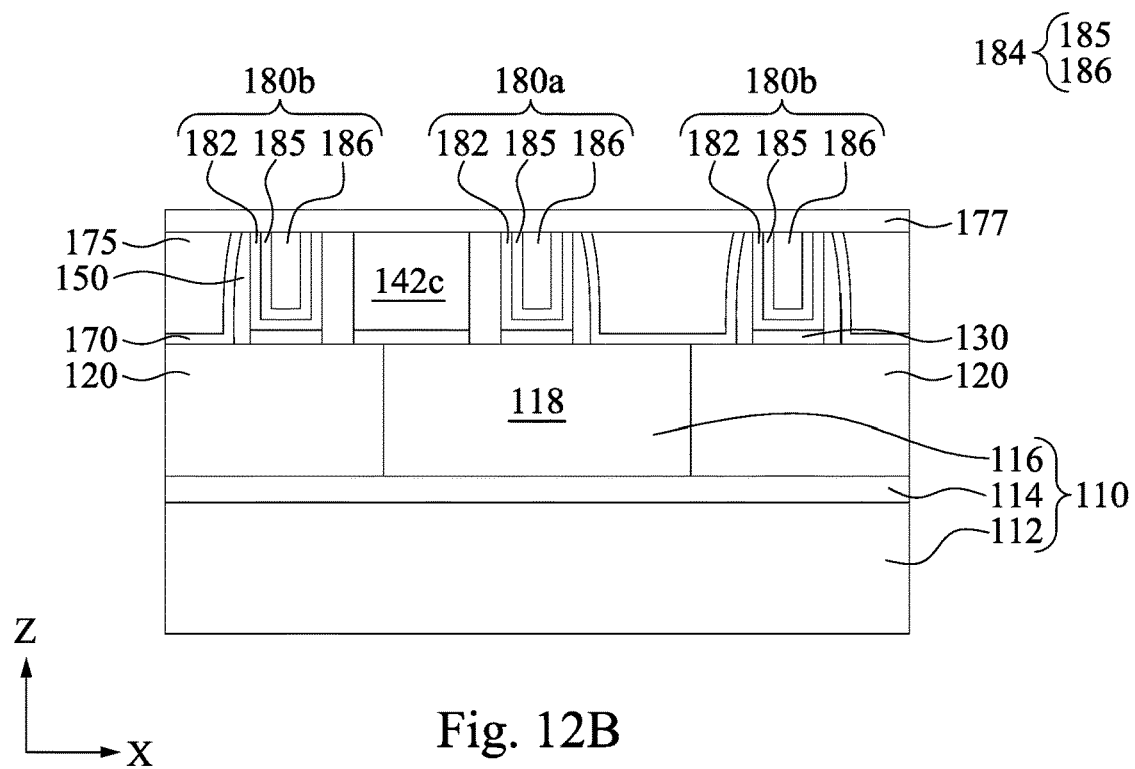
FIG. 12B is a cross-sectional view taken along line B-B in FIG. 12A.
Figure 12C:
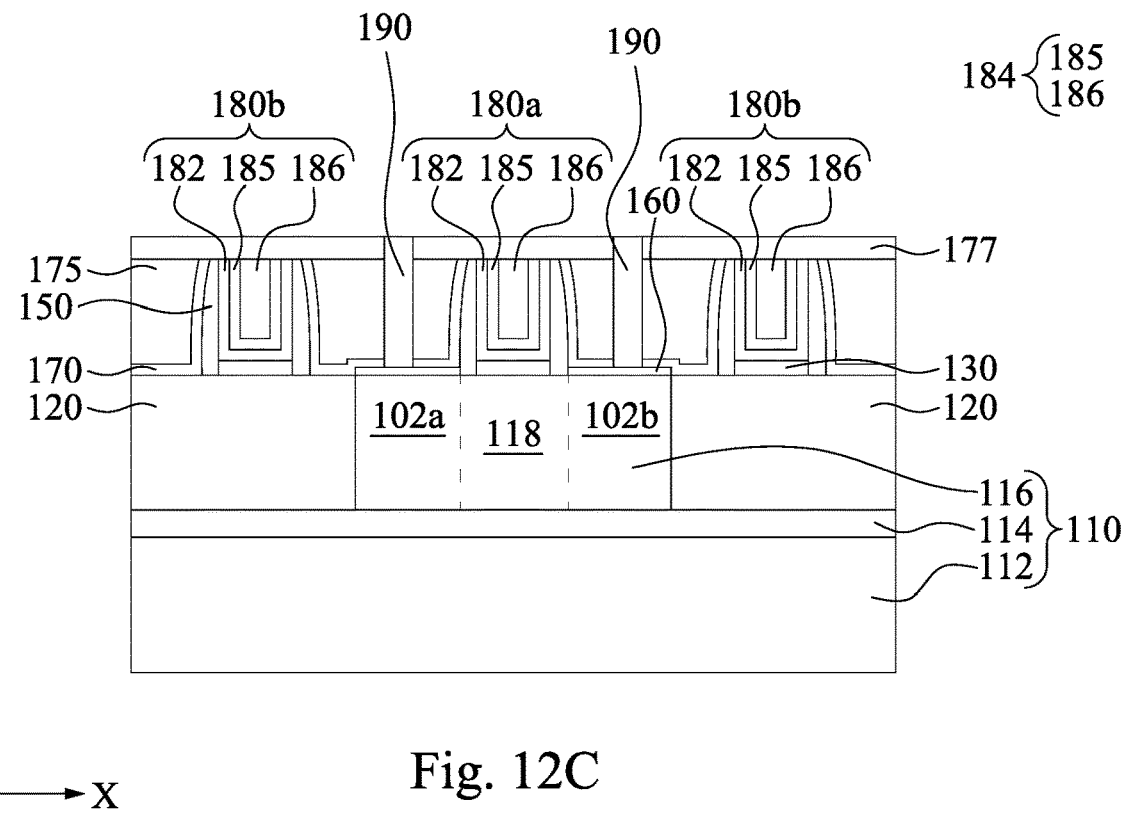
FIG. 12C is a cross-sectional view taken along line C-C in FIG. 12A.
Figure 12D:
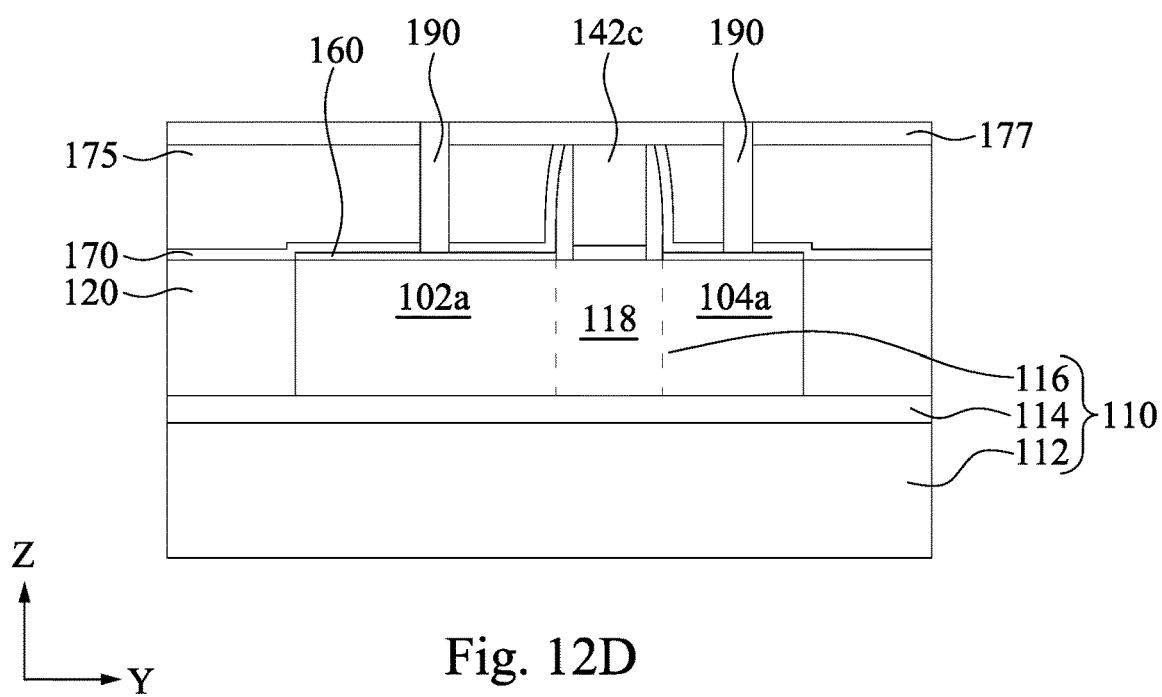
FIG. 12D is a cross-sectional view taken along line D-D in FIG. 12A.
Figure 12E:
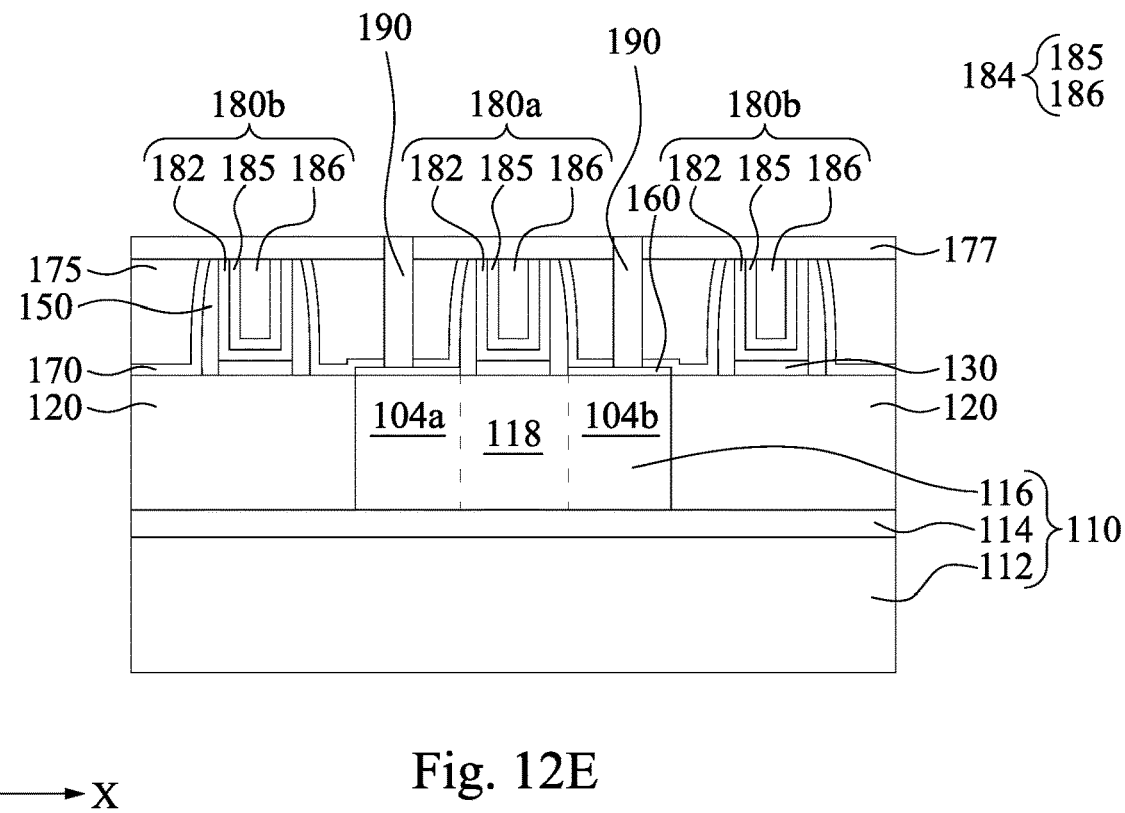
FIG. 12E is a cross-sectional view taken along line E-E in FIG. 12A.
Figure 12F:
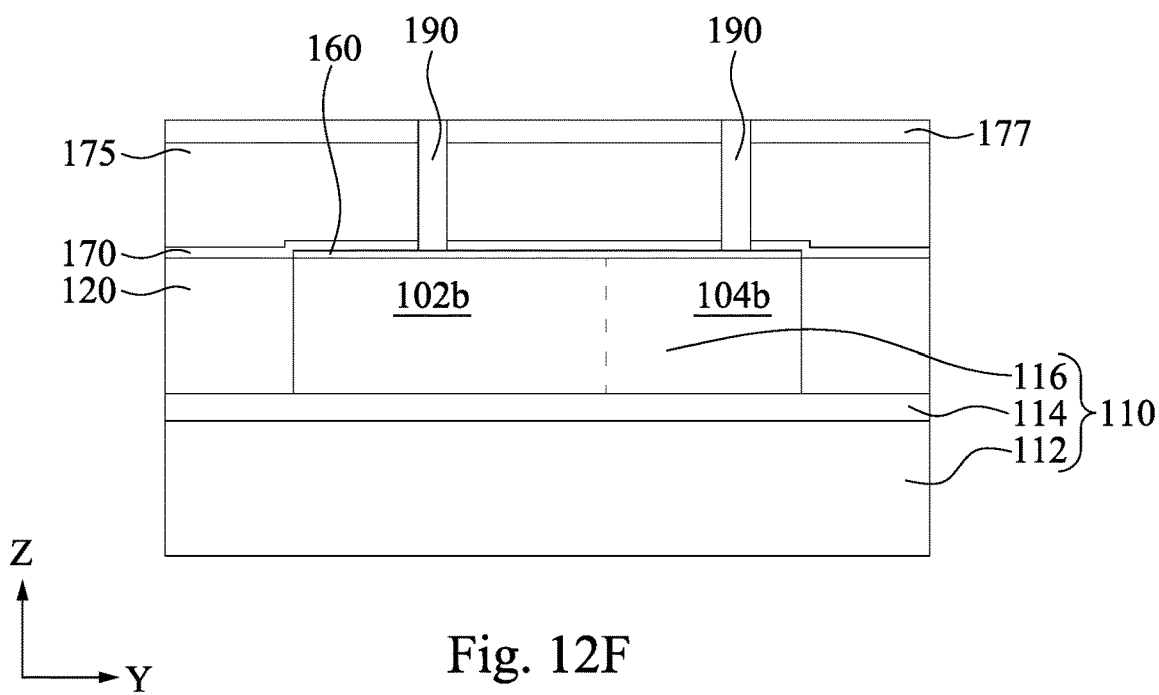
FIG. 12F is a cross-sectional view taken along line F-F in FIG. 12A.

FIG. 12A is a top view of a semiconductor device in accordance with some embodiments of the present disclosure, FIG. 12B is a cross-sectional view taken along line B-B in FIG. 12A, and FIG. 12C is a cross-sectional view taken along line C-C in FIG. 12A, FIG. 12D is a cross-sectional view taken along line D-D in FIG. 12A, FIG. 12E is a cross-sectional view taken along line E-E in FIG. 12A, and FIG. 12F is a cross-sectional view taken along line F-F in FIG. 12A. The difference between the semiconductor devices in FIGS. 12A and 10A pertains to the arrangement of the gate structures 142*c*. In FIGS. 12A-12F, the semiconductor device include a single one gate structure 142*c* between the metal gate structure 180*a* and one of the metal gate structures 180*b*. Without another one of the gate structure 142*c* (as shown in FIG. 10A), the source/drain region 102*b* and the body region 104*b* are connected to each other by the metal alloy layer 160. Other relevant structural details of the semiconductor device in FIGS. 12A-12F are the same as or similar to the semiconductor device in FIGS. 10A-10E, and, therefore, a description in this regard will not be repeated hereinafter.

Figure 13A:
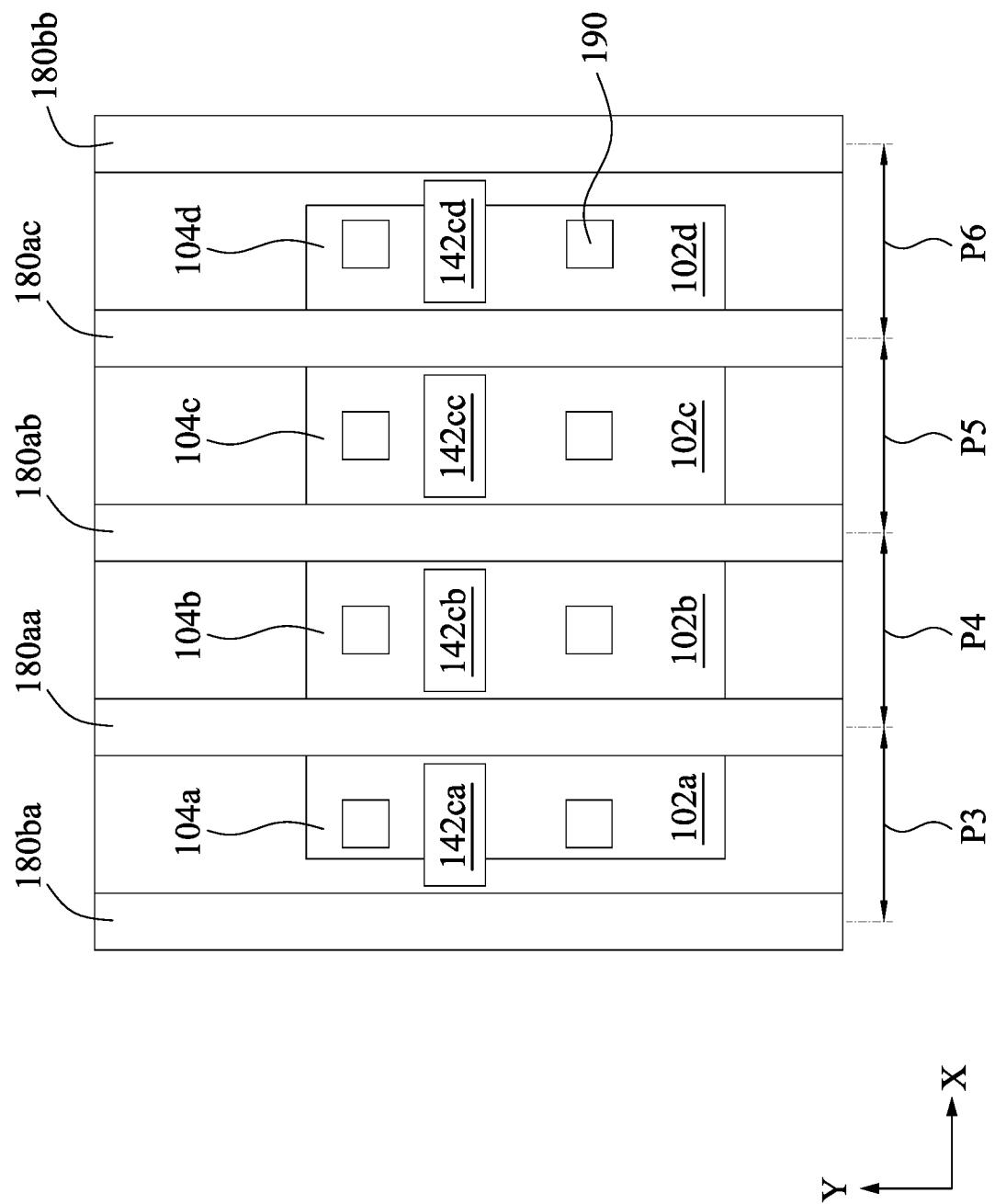
FIGS. 13A-13D are top views of semiconductor devices in accordance with some embodiments of the present disclosure.

FIGS. 13A-13D are top views of semiconductor devices in accordance with some embodiments of the present disclosure. In FIG. 13A, the semiconductor device includes metal gate structures 180*aa*, 180*ab*, 180*ac*, 180*ba*, and 180*bb*, gate structures 142*ca*, 142*cb*, 142*cc*, and 142*cd*, source/drain regions 102*a*, 102*b*, 102*c*, and 102*d*, and body regions 104*a*, 104*b*, 104*c*, and 104*d*. The metal gate structures 180*aa*, 180*ab*, 180*ac*, 180*ba*, and 180*bb* extend in the y-direction, and the gate structures 142*ca*, 142*cb*, 142*cc*, and 142*cd* extend in the x-direction. The metal gate structures 180*aa*, 180*ab*, and 180*ac* are between the metal gate structures 180*ba*, and 180*bb*. The gate structure 142*ca* is between the metal gate structures 180*aa* and 180*ba*, the gate structure 142*cb* is between the metal gate structures 180*aa* and 180*ab*, the gate structure 142*cc* is between the metal gate structures 180*ab* and 180*ac*, and the gate structure 142*cd* is between the metal gate structures 180*ac* and 180*bb*. The adjacent metal gate structures 180*aa*, 180*ab*, 180*ac*, 180*ba*, and 180*bb* have substantially the same gate pitch. That is, the distance P3 is substantially the same as the distance P4, the distance P4 is substantially the same as the distance P5, and/or the distance P5 is substantially the same as the distance P6. The source/drain regions 102*a* and 102*b* are on opposite sides of the metal gate structure 180*aa*, the source/drain regions 102*b* and 102*c* are on opposite sides of the metal gate structure 180*ab*, and the source/drain regions 102*c* and 102*d* are on opposite sides of the metal gate structure 180*ac*. The body regions 104*a* and 104*b* are on opposite sides of the metal gate structure 180*aa*, the body regions 104*b* and 104*c* are on opposite sides of the metal gate structure 180*ab*, and the body regions 104*c* and 104*d* are on opposite sides of the metal gate structure 180*ac*. The source/drain region 102*a* and the body region 104*a* are on opposite sides of the gate structure 142*ca*, the source/drain region 102*b* and the body region 104*b* are on opposite sides of the gate structure 142*cb*, the source/drain region 102*c* and the body region 104*c* are on opposite sides of the gate structure 142*cc*, and the source/drain region 102*d* and the body region 104*d* are on opposite sides of the gate structure 142*cd*. Contacts 190 are respectively above the source/drain regions 102*a*-102*d* and the body regions 104*a*-104*d*.

Figure 13B:
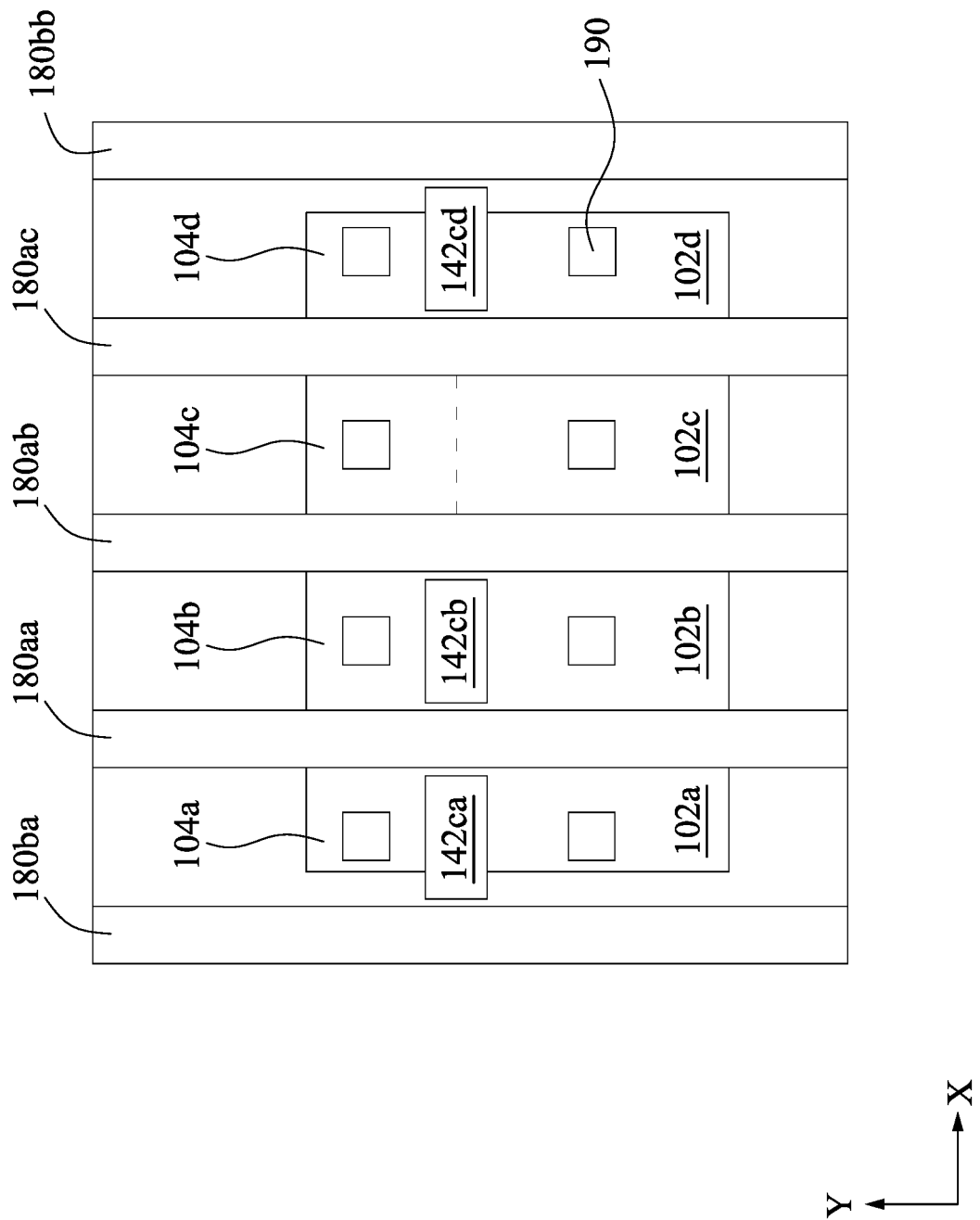
Figure 13C:
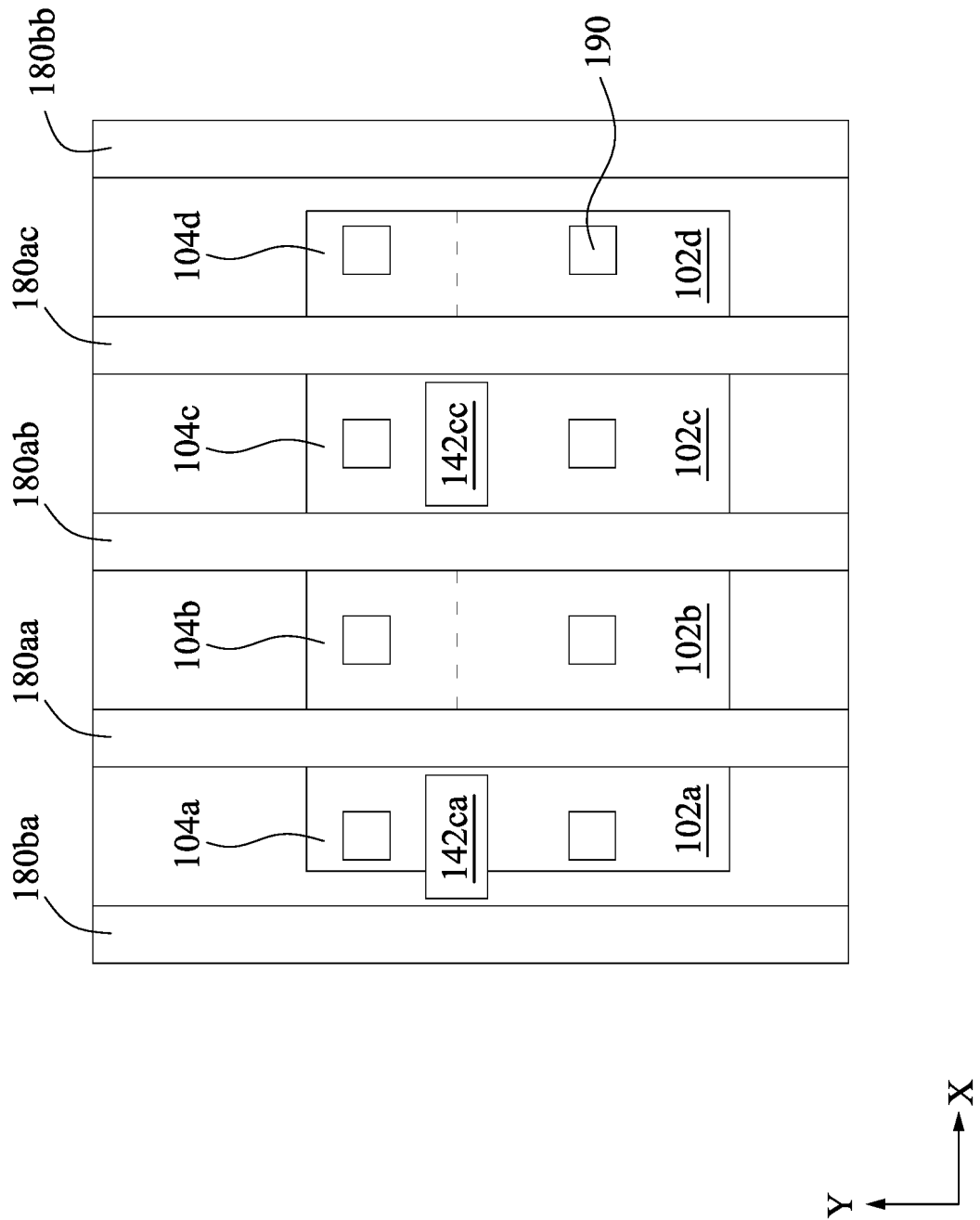
Figure 13D:
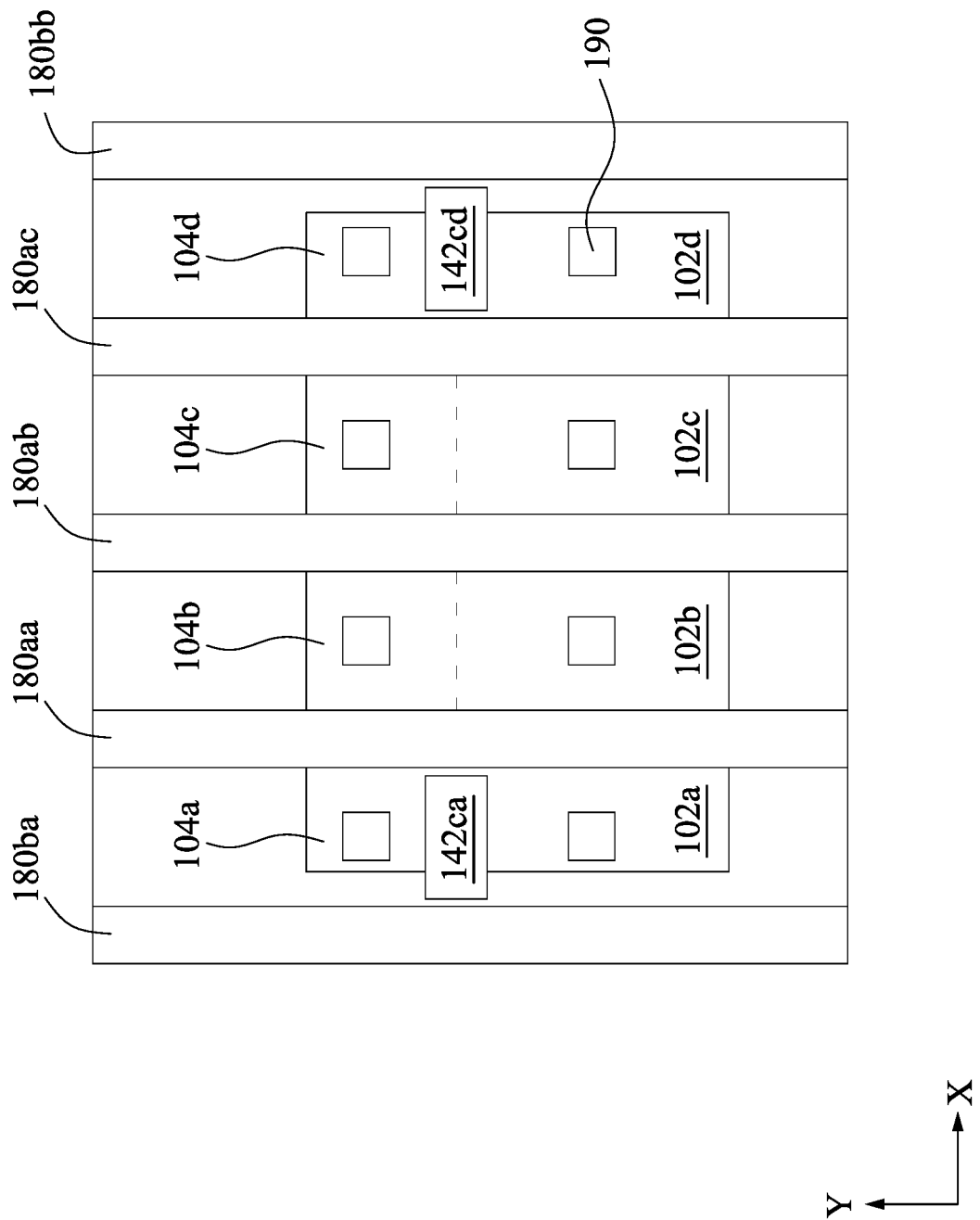

The difference between the semiconductor devices in FIGS. 13B and 13A pertains to the presence of the gate structure 142*cc* (see FIG. 13A). In FIG. 13B, the gate structure 142*cc* is omitted, such that the source/drain region 102*c* and the body region 104*c* are electrically and physically connected (e.g., by a metal alloy layer formed thereon). The difference between the semiconductor devices in FIGS. 13C and 13A pertains to the presence of the gate structures 142*cb* and 142*cd* (see FIG. 13A). In FIG. 13C, the gate structures 142*cb* and 142*cd* are omitted, such that the source/drain region 102*b* and the body region 104*b* are electrically and physically connected (e.g., by a metal alloy layer formed thereon), and the source/drain region 102d and the body region 104d are electrically and physically connected (e.g., by another metal alloy layer formed thereon). The difference between the semiconductor devices in FIGS. 13D and 13A pertains to the presence of the gate structures 142cb and 142cc (see FIG. 13A). In FIG. 13D, the gate structures 142cb and 142cc are omitted, such that the source/drain region 102b and the body region 104b are electrically and physically connected (e.g., by a metal alloy layer formed thereon), and the source/drain region 102c and the body region 104c are electrically and physically connected (e.g., by another metal alloy layer formed thereon). Other relevant structural details of the semiconductor device in FIGS. 13A-13D are the same as or similar to the semiconductor device in FIG. 10A, and, therefore, a description in this regard will not be repeated hereinafter.

It is noted that the arrangements of the gate structures 142ca, 142cb, 142cc, and 142cd in FIGS. 13A-13D are illustrative, and should not limit the scope of the present disclosure. In some embodiments, at least one of the gate structures 142ca, 142cb, 142cc or 142cd is omitted, and the corresponding source/drain region and the body region are electrically connected to each other.

Figure 14A:
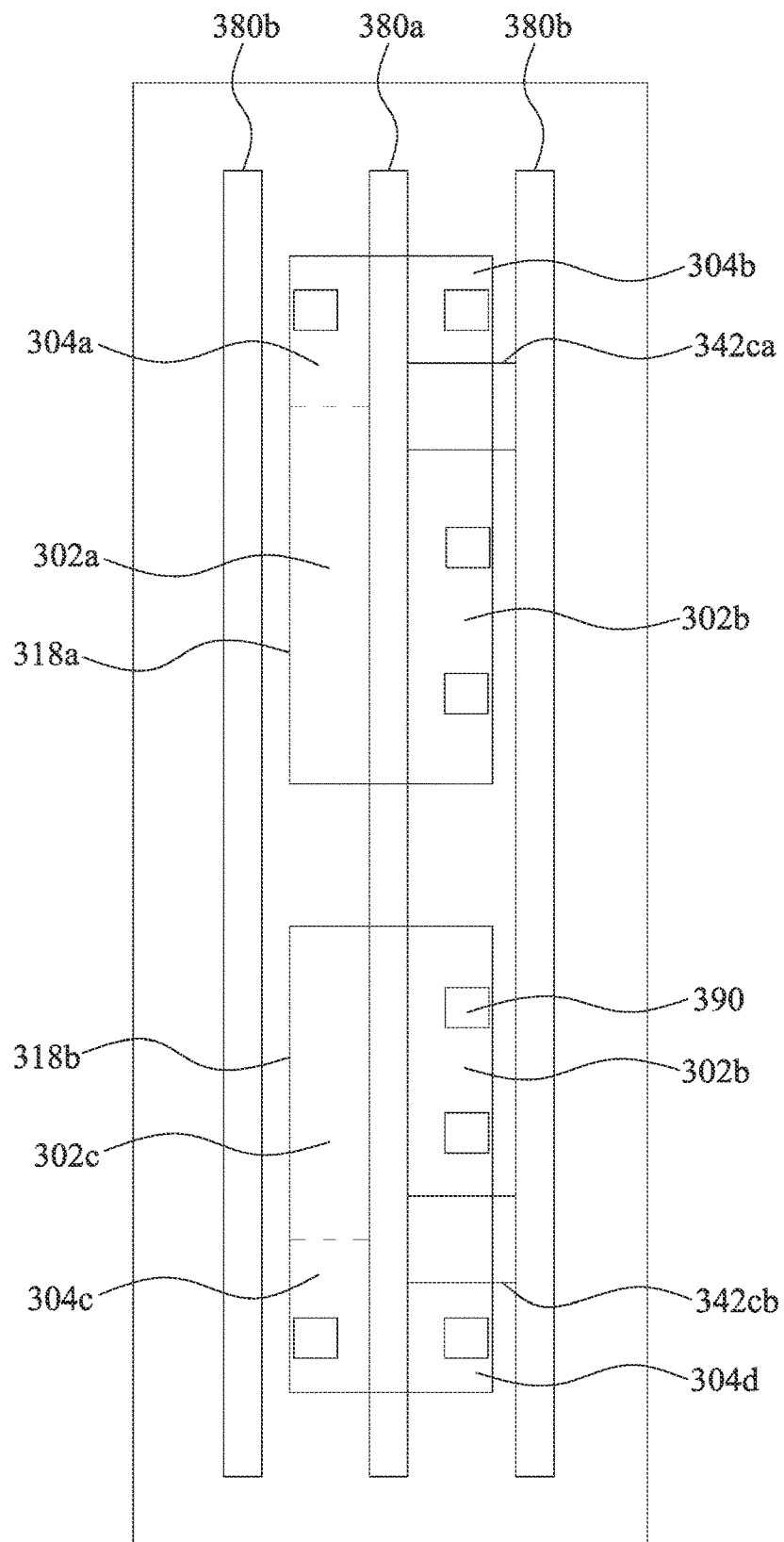
FIG. 14A is a layout diagram of an integrated circuit without conductive traces in accordance with some embodiments of the present disclosure.
Figure 14B:
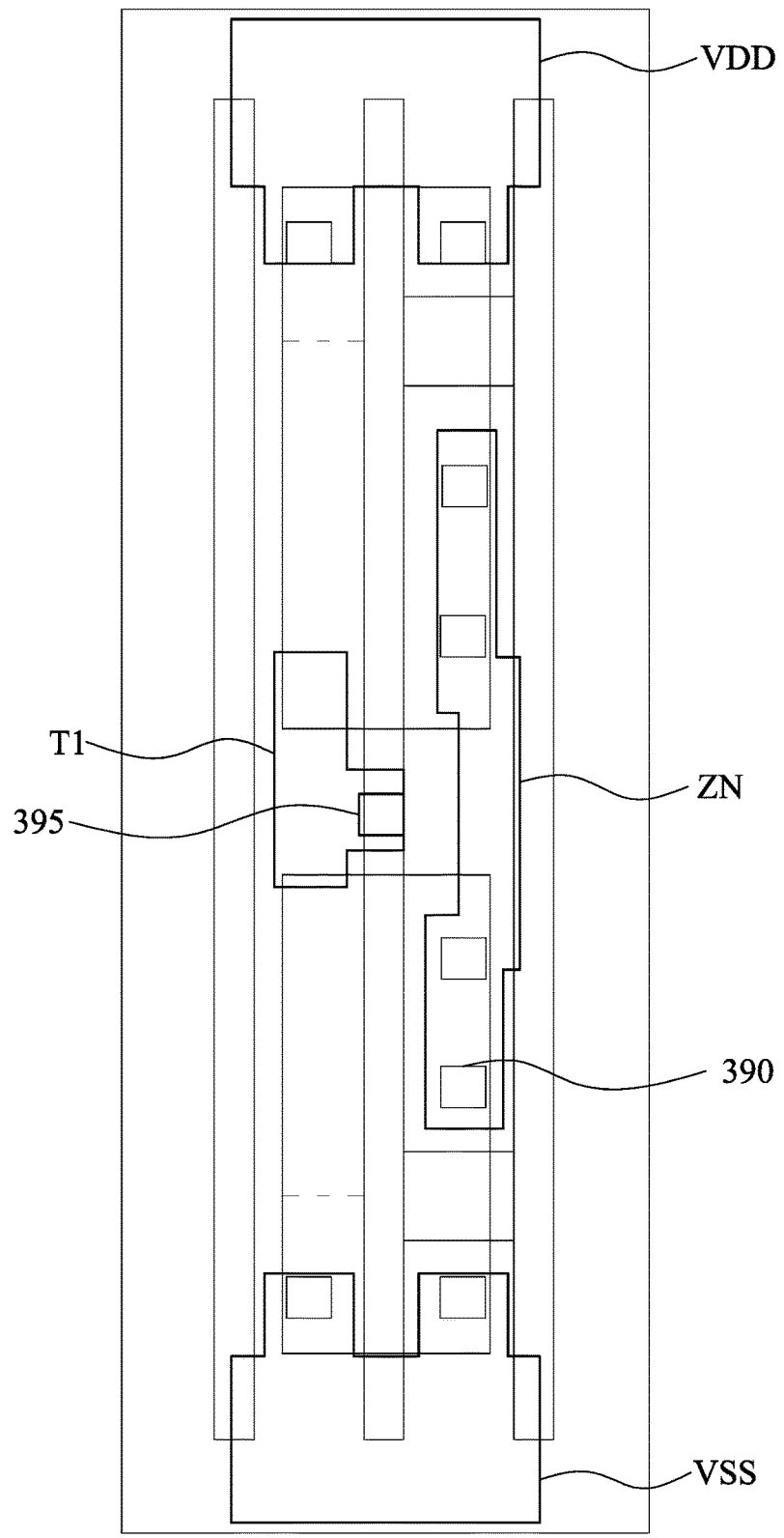
FIG. 14B is a layout diagram of the integrated circuit with conductive traces in accordance with some embodiments of the present disclosure.

The structure in FIG. 10A (or FIG. 12A) may be applied to various integrated circuits/circuit cells to increase routing flexibility. FIG. 14A is a layout diagram of an integrated circuit 300 without conductive traces in accordance with some embodiments of the present disclosure, and FIG. 14B is a layout diagram of the integrated circuit 300 with conductive traces in accordance with some embodiments of the present disclosure. The integrated circuit 300 is an INVD1 circuit. The layout diagram of the integrated circuit 300 includes active regions 318a and 318b, metal gate structures 380a and 380b, gate structures 342ca and 342cb, contacts 390, and conductive traces VSS, VDD, T1, and ZN. The active regions 318a and 318b are spaced apart from each other. The gate structures 342ca and 342cb are between the metal gate structure 380a and one of the metal gate structures 380b.

The source/drain region 302a and the body region 304a are electrically connected to each other, the source/drain region 302c and the body region 304c are electrically connected to each other, the source/drain regions 302a and 302b are on opposite sides of the metal gate structure 380a, the body regions 304a and 304b are on opposite sides of the metal gate structure 380a, the source/drain regions 302c and 302d are on opposite sides of the metal gate structure 380a, and the body regions 304c and 304d are on opposite sides of the metal gate structure 380a. The source/drain region 302b and the body region 304b are on opposite sides of the gate structure 342ca, and the source/drain region 302d and the body region 304d are on opposite sides of the gate structure 342cb. The contacts 390 are respectively above the source/drain regions 302b and 302d and the body regions 304a-304d. The conductive trace VDD is coupled to the body regions 304a and 304b, the conductive trace VSS is coupled to the body regions 304c and 304d, the conductive trace T1 is coupled to the metal gate structure 380a through a via 395, and the conductive trace ZN is coupled to the source/drain regions 302b and 302d through some of the contacts 390.

It is noted that the structure/material/formation processes of the active regions 318a and 318b, the metal gate structures 380a and 380b, the gate structures 342ca and 342cb, and the contacts 390 in FIGS. 14A and 14B are similar to or the same as that of the active region 118, the metal gate structures 180a and 180b, the gate structures 142c, and the contacts 190 in FIG. 10A, and therefore, a description in this regard will not be repeated hereinafter.

Figure 15A:
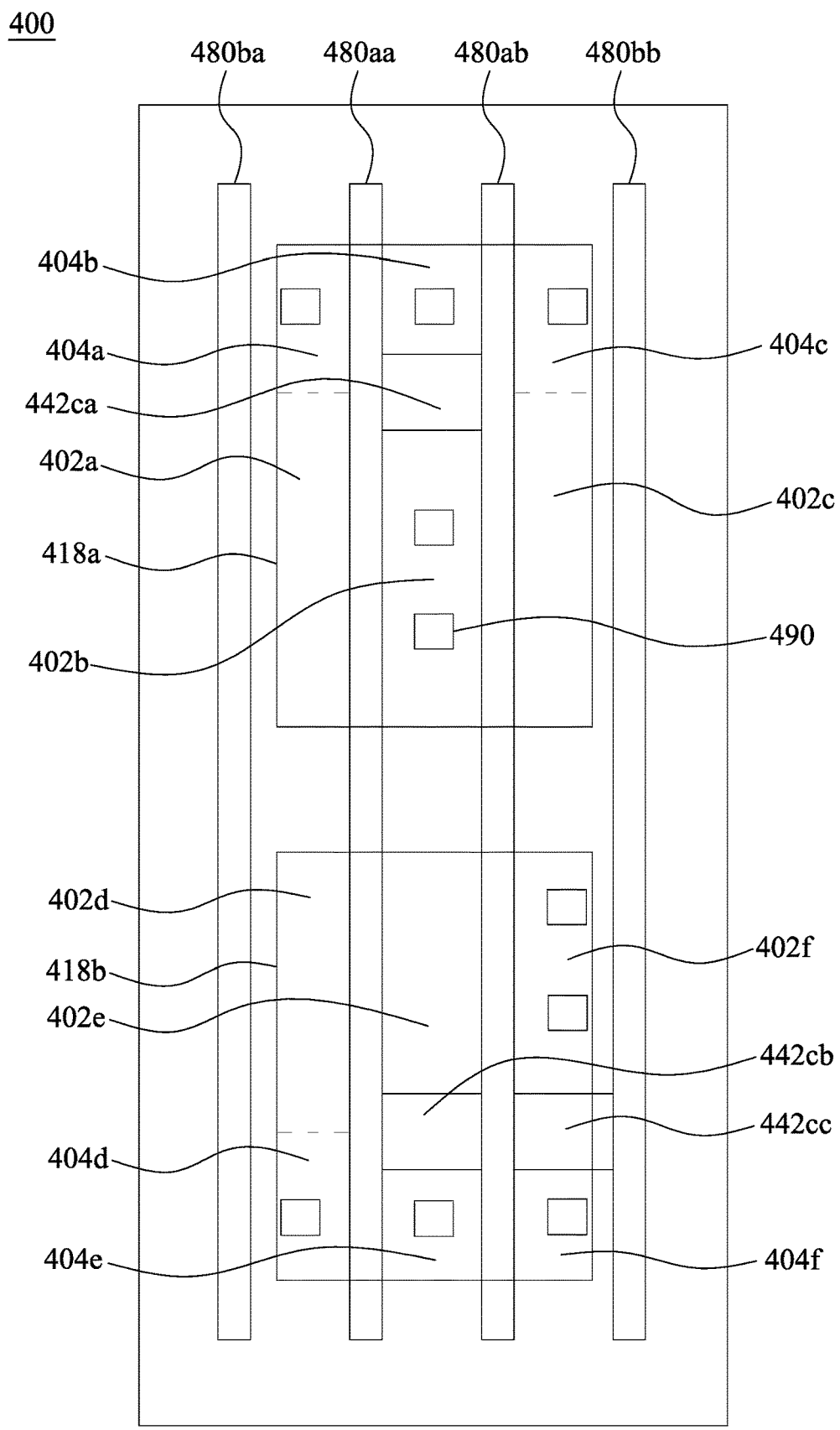
FIG. 15A is a layout diagram of an integrated circuit without conductive traces in accordance with some embodiments of the present disclosure.
Figure 15B:
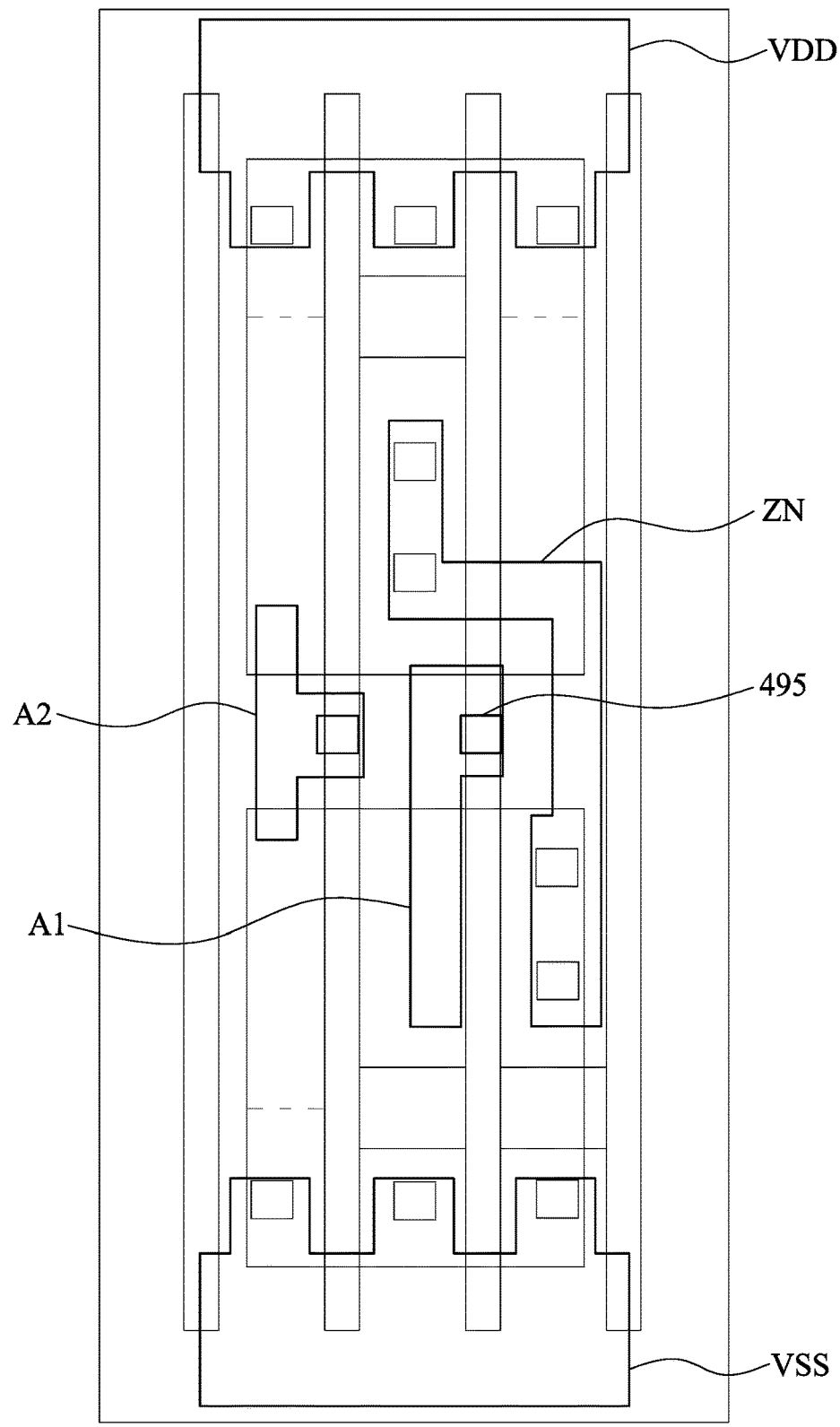
FIG. 15B is a layout diagram of the integrated circuit with conductive traces in accordance with some embodiments of the present disclosure.

FIG. 15A is a layout diagram of an integrated circuit 400 without conductive traces in accordance with some embodiments of the present disclosure, and FIG. 15B is a layout diagram of the integrated circuit 400 with conductive traces in accordance with some embodiments of the present disclosure. The integrated circuit 400 is an ND2D1 circuit. The layout diagram of the integrated circuit 400 includes active regions 418a and 418b, metal gate structures 480aa, 480ab, 480ba, and 480bb, gate structures 442ca, 442cb, and 442cc, contacts 490, and conductive traces VSS, VDD, A1, A2, and ZN. The active regions 418a and 418b are spaced apart from each other. The gate structures 442ca and 442cb are between the metal gate structures 480aa and 480ab, and the gate structure 442cc is between the metal gate structures 480ab and 480bb.

The source/drain region 402a and the body region 404a are electrically connected to each other, the source/drain region 402c and the body region 404c are electrically connected to each other, and the source/drain region 402d and the body region 404d are electrically connected to each other. The source/drain region 402b and the body region 404b are on opposite sides of the gate structure 442ca, the source/drain region 402e and the body region 404e are on opposite sides of the gate structure 442cb, and the source/drain region 402f and the body region 404f are on opposite sides of the gate structure 442cc. The contacts 490 are respectively above the source/drain regions 402b and 402f and the body regions 404a-404f. The conductive trace VDD is coupled to the body regions 404a, 404b, and 404c, the conductive trace VSS is coupled to the body regions 404d, 404e, and 404f, the conductive trace A1 is coupled to the metal gate structure 480ab through one of vias 495, the conductive trace A2 is coupled to the metal gate structure 480aa through another of the vias 495, and the conductive trace ZN is coupled to the source/drain regions 402b and 402f.

It is noted that the structure/material/formation processes of the active regions 418a and 418b, the metal gate structures 480aa, 480ab, 480ba, and 480bb, the gate structures 442ca, 442cb, and 442cc, and the contacts 490 in FIGS. 15A and 15B are similar to or the same as that of the active region 118, the metal gate structures 180a and 180b, the gate structures 142c, and the contacts 190 in FIG. 10A, and therefore, a description in this regard will not be repeated hereinafter.

Figure 16A:
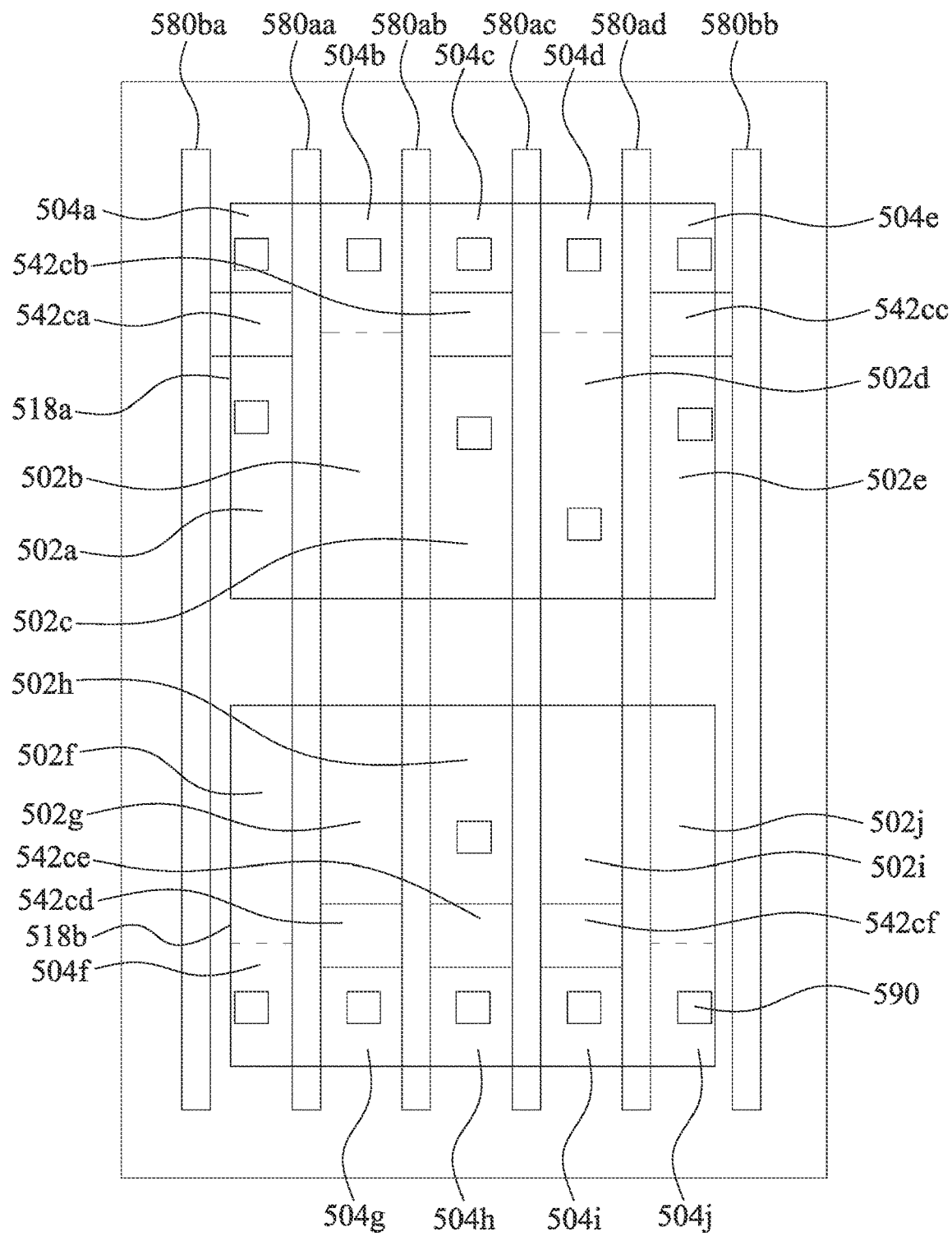
FIG. 16A is a layout diagram of an integrated circuit without conductive traces in accordance with some embodiments of the present disclosure.
Figure 16B:
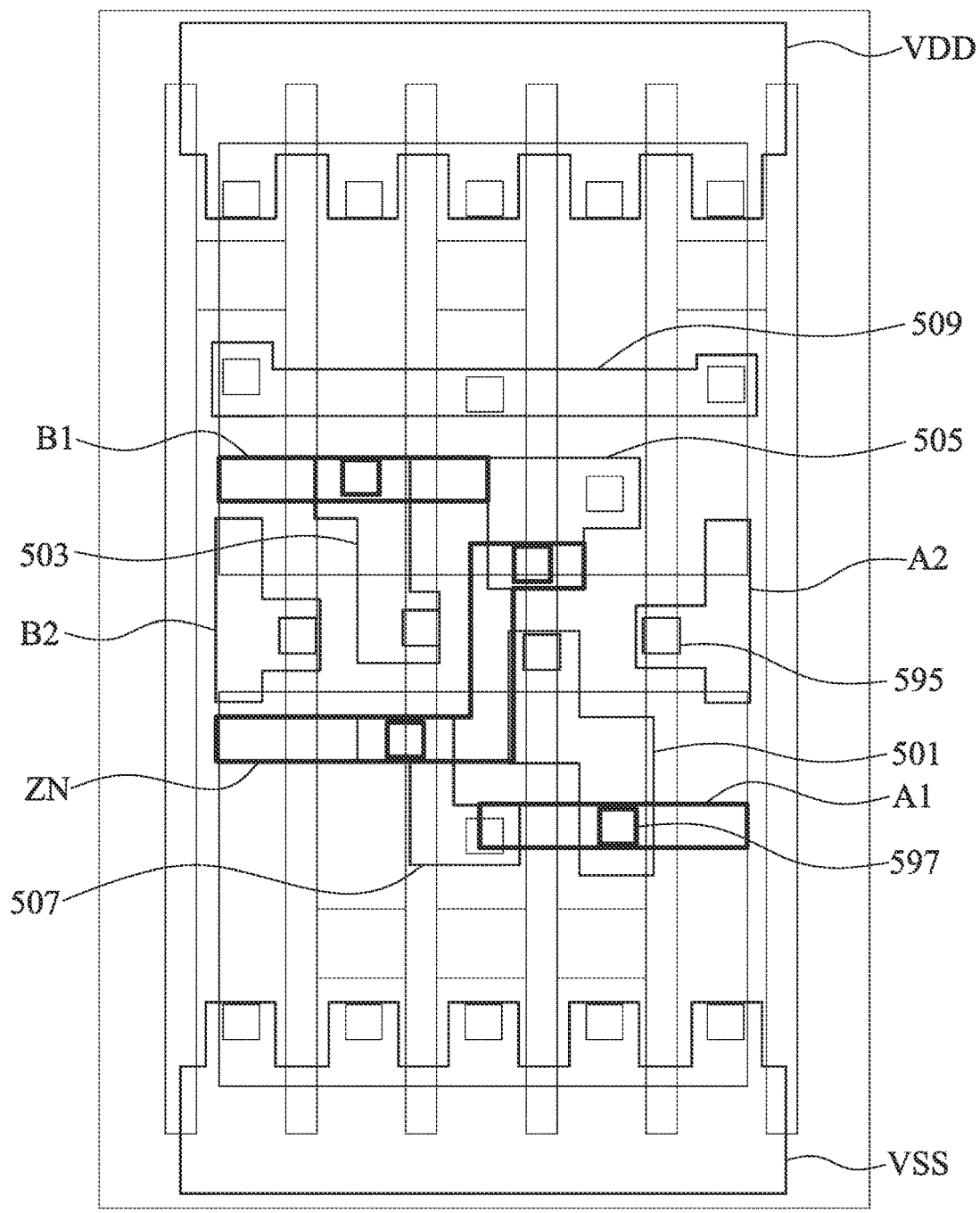
FIG. 16B is a layout diagram of the integrated circuit with conductive traces in accordance with some embodiments of the present disclosure.

FIG. 16A is a layout diagram of an integrated circuit 500 without conductive traces in accordance with some embodiments of the present disclosure, and FIG. 16B is a layout diagram of the integrated circuit 500 with conductive traces in accordance with some embodiments of the present disclosure. The integrated circuit 500 is an AOI22D1 circuit. The layout diagram of the integrated circuit 500 includes active regions 518a and 518b, metal gate structures 580aa, 580ab, 580ac, 580ad, 580ba, and 580bb, gate structures 542ca, 542cb, 542cc, 542cd, 542ce, and 542cf, contacts 590, and conductive traces VSS, VDD, A1, A2, B1, B2, and ZN. The active regions 518a and 518b are spaced apart from each other. The gate structures 542ca is between the metal gate structures 580ba and 580aa, the gate structure 542cb is between the metal gate structures 580ab and 580ac, the gate structure 542cc is between the metal gate structures 580ad and 580bb, the gate structure 542cd is between the metal gate structures 580aa and 580ab, the gate structure 542ce is between the metal gate structures 580*ab* and 580*ac*, and the gate structure 542*cf* is between the metal gate structures 580*ac* and 580*ad*.

The source/drain region 502*b* and the body region 504*b* are electrically connected to each other, the source/drain region 502*d* and the body region 504*d* are electrically connected to each other, the source/drain region 502*f* and the body region 504*f* are electrically connected to each other, and the source/drain region 502*j* and the body region 504*j* are electrically connected to each other. The source/drain region 502*a* and the body region 504*a* are on opposite sides of the gate structure 542*ca*, the source/drain region 502*c* and the body region 504*c* are on opposite sides of the gate structure 542*cb*, the source/drain region 502*e* and the body region 504*e* are on opposite sides of the gate structure 542*cc*, the source/drain region 502*g* and the body region 504*g* are on opposite sides of the gate structure 542*cd*, the source/drain region 502*h* and the body region 504*h* are on opposite sides of the gate structure 542*ce*, and the source/drain region 502*i* and the body region 504*i* are on opposite sides of the gate structure 542*cf*. The contacts 590 are respectively above the source/drain regions 502*a*, 502*c*, 502*d*, 502*e*, and 502*h* and the body regions 504*a*-504*j*. The conductive trace VDD is coupled to the body regions 504*a*, 504*b*, 504*c*, 504*d*, and 504*e*, the conductive trace VSS is coupled to the body regions 504*f*, 504*g*, 504*h*, 504*i*, and 504*j*, the conductive trace A1 is coupled to the metal gate structure 580*ac* through a via 597, a conductive trace 501, and a via 595, the conductive trace A2 is coupled to the metal gate structure 580*ad* through another via 595, the conductive trace B1 is coupled to the metal gate structure 580*ab* through another via 597, a conductive trace 503, and another via 595, the conductive trace B2 is coupled to the metal gate structure 580*aa* through another via 595, and the conductive trace ZN is coupled to the source/drain regions 502*d* and 502*h* through another via 597 and conductive traces 505 and 507, and the source/drain region 502*a* is coupled to the source/drain regions 502*c* and 502*e* through an internal conductive trace 509. In some embodiments, the conductive traces A2, B2, 501, 503, 505, 507, 509, VDD, and VSS may be in the same level (e.g., M0 level), and the conductive traces A1, B1, and ZN may be in another level (e.g., M1 level).

It is noted that the structure/material/formation processes of the active regions 518*a* and 518*b*, the metal gate structures 580*aa*-580*ad* and 580*ba*-580*bb*, the gate structures 542*ca*-542*cf*, and the contacts 590 in FIGS. 16A and 16B are similar to or the same as that of the active region 118, the metal gate structures 180*a* and 180*b*, the gate structures 142*c*, and the contacts 190 in FIG. 10A, and therefore, a description in this regard will not be repeated hereinafter.

Figure 17:
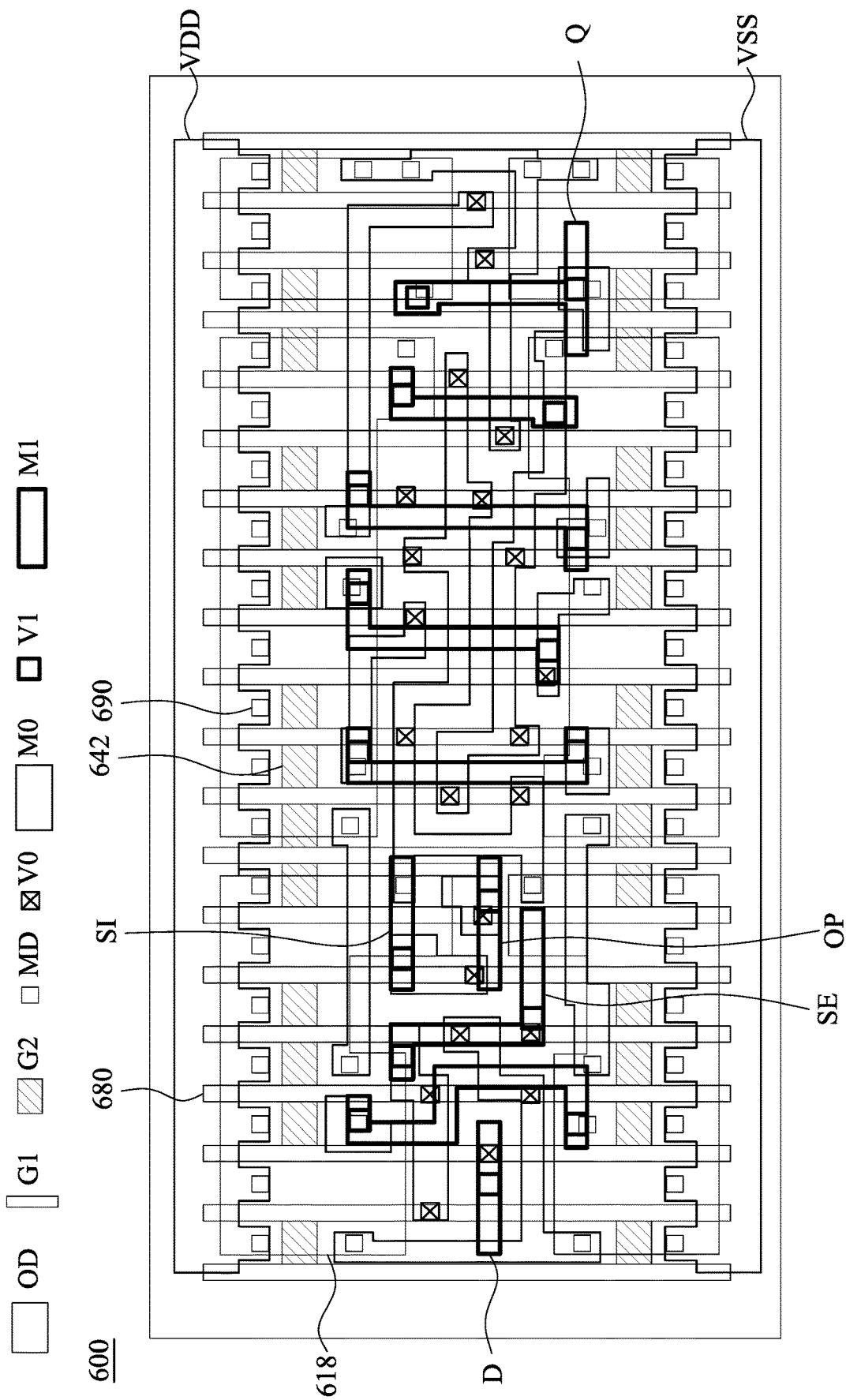
FIG. 17 is a layout diagram of an integrated circuit in accordance with some embodiments of the present disclosure.

FIG. 17 is a layout diagram of an integrated circuit 600 in accordance with some embodiments of the present disclosure. The integrated circuit 600 is an SDFQD1 circuit. The integrated circuit 600 includes a plurality of active regions (e.g., the active region 618), metal gate structures (e.g., the metal gate structure 680), gate structures (e.g., the gate structure 642), contacts (e.g., the contact 690), and conductive traces (e.g., the conductive traces VDD, VSS, D, SI, OP, SE, and Q). For example, as shown in FIG. 17, the OD portions correspond to the active regions, the G1 portions correspond to the metal gate structures, the G2 portions correspond to the gate structures, the MD portions correspond to the contacts, the M0 portions correspond to the conductive traces in M0 level (e.g., the conductive traces VDD and VSS), the V0 portions correspond to the vias interconnecting the metal gate structures and the conductive traces in M0 level, the M1 portions correspond to the conductive traces in M1 level (e.g., the conductive traces D, SI, OP, SE, and Q), and the V1 portions correspond to the vias interconnecting the conductive traces in M0 and M1 levels.

The conductive trace VDD is coupled to some of body regions in the active regions, and the conductive trace VSS is coupled to the rest body regions. The adjacent metal gate structures have substantially the same gate pitch, and the gate structures are respectively between adjacent metal gate structures to form H-shapes. The conductive traces may be at different levels (e.g., M0 and M1 levels). Other relevant structural details of the semiconductor device in FIG. 17 are the same as or similar to the semiconductor device in FIGS. 10A-10E, and, therefore, a description in this regard will not be repeated hereinafter.

Figure 18:
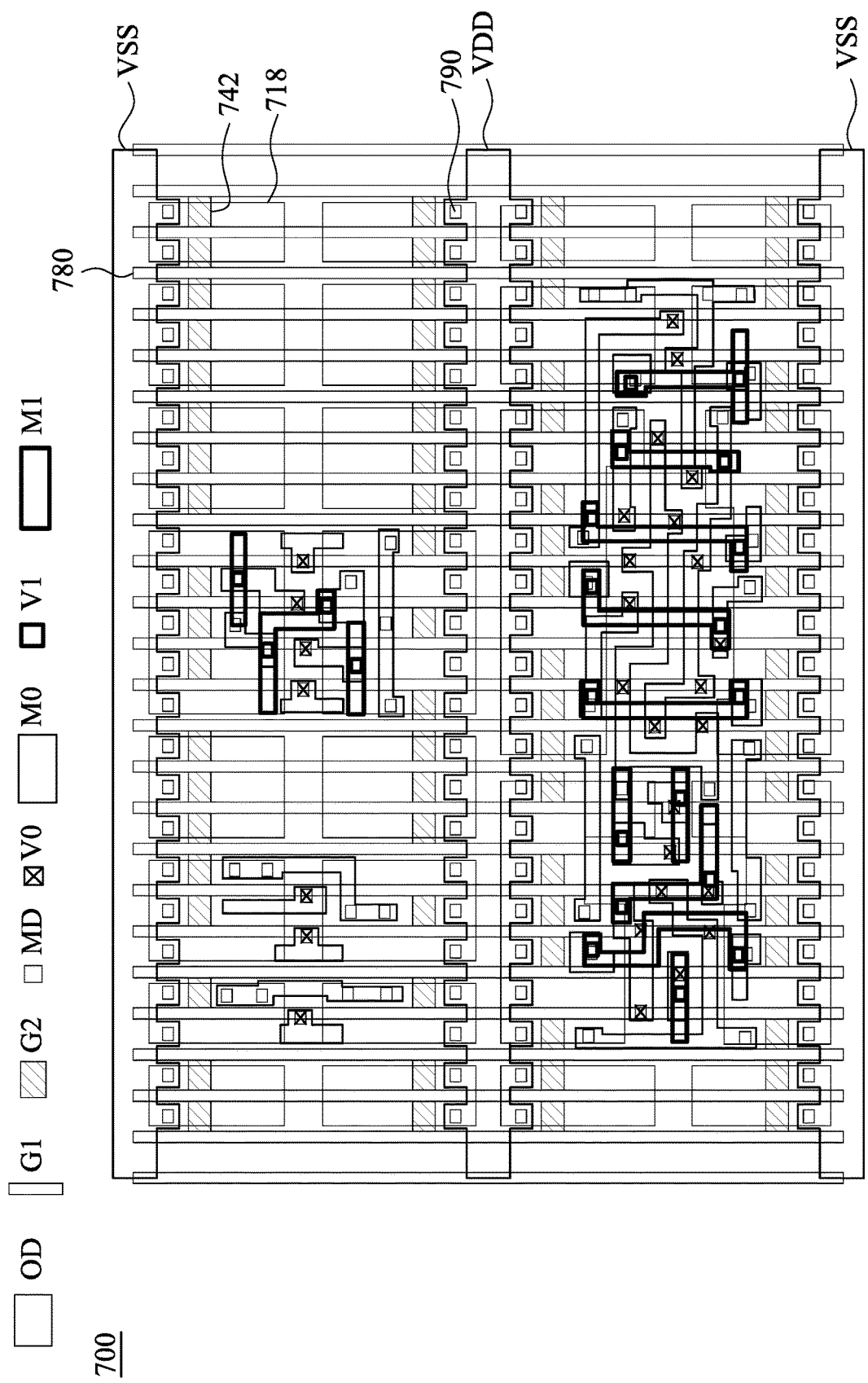
FIG. 18 is a layout diagram of an integrated circuit in accordance with some embodiments of the present disclosure.

FIG. 18 is a layout diagram of an integrated circuit 700 in accordance with some embodiments of the present disclosure. The integrated circuit 700 includes a plurality of active regions (e.g., the active region 718), metal gate structures (e.g., the metal gate structure 780), gate structures (e.g., the gate structure 742), contacts (e.g., the contact 790), and conductive traces (e.g., the conductive traces VDD and VSS). For example, as shown in FIG. 18, the OD portions correspond to the active regions, the G1 portions correspond to the metal gate structures, the G2 portions correspond to the gate structures, the MD portions correspond to the contacts, the M0 portions correspond to the conductive traces in M0 level (e.g., the conductive traces VDD and VSS), the V0 portions correspond to the vias interconnecting the metal gate structures and the conductive traces in M0 level, the M1 portions correspond to the conductive traces in M1 level, and the V1 portions correspond to the vias interconnecting the conductive traces in M0 and M1 levels.

The conductive trace VDD is coupled to some of body regions in the active regions, and the conductive trace VSS is coupled to the rest body regions. In some embodiments, the conductive trace VDD has a fishbone structure. The adjacent metal gate structures have substantially the same gate pitch, and the gate structures are respectively between adjacent metal gate structures to form H-shapes. The conductive traces may be at different levels (e.g., M0 and M1 levels). Other relevant structural details of the semiconductor device in FIG. 18 are the same as or similar to the semiconductor device in FIGS. 10A-10E, and, therefore, a description in this regard will not be repeated hereinafter.

Figure 19:
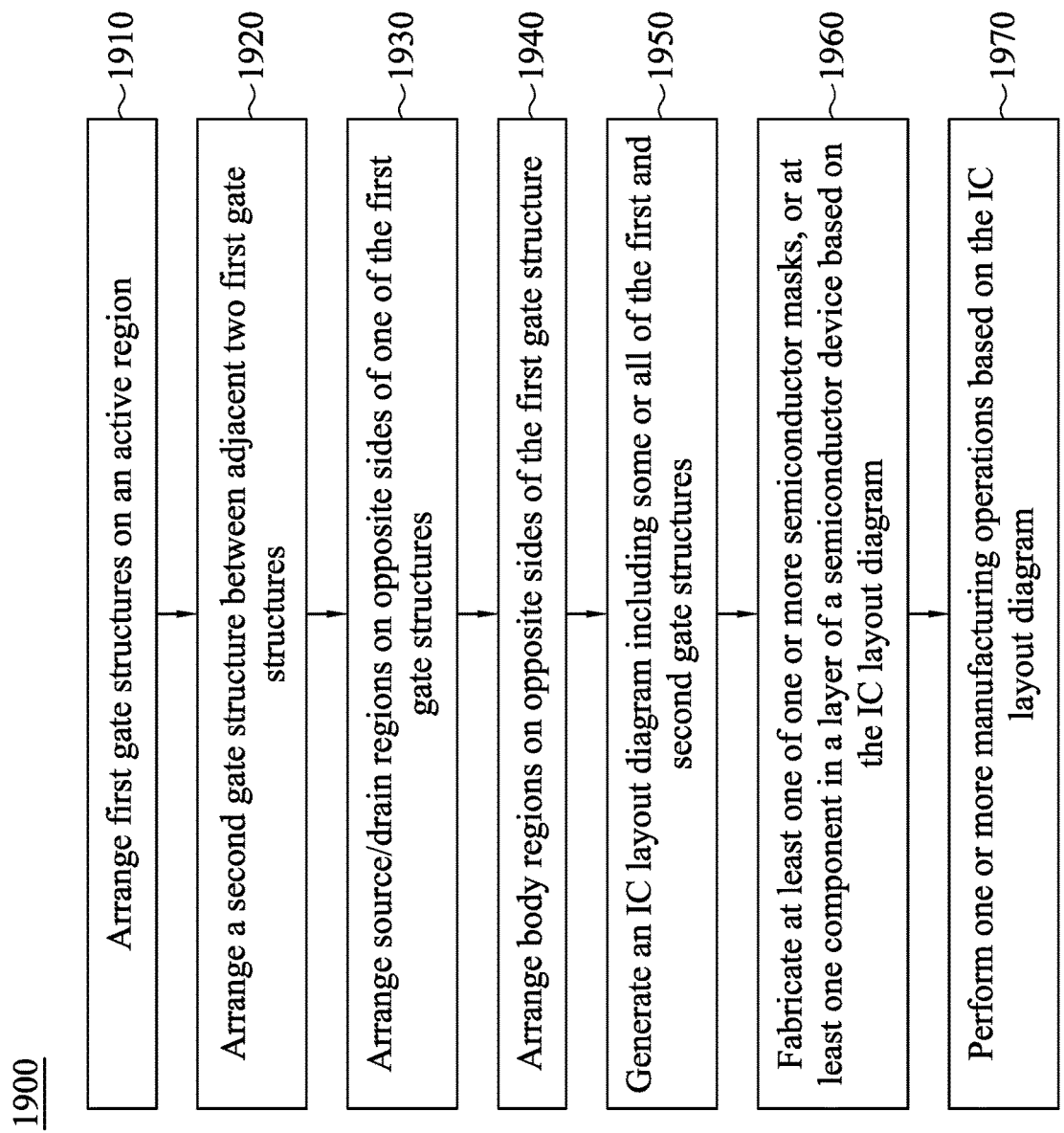
FIG. 19 is a flowchart of a method of generating an IC layout diagram, in accordance with some embodiments of the present disclosure.

FIG. 19 is a flowchart of a method 1900 of generating an IC layout diagram, in accordance with some embodiments of the present disclosure. In some embodiments, generating an IC layout diagram includes generating one of layout diagrams 300, 400, 500, 600, or 700 discussed above with respect to FIGS. 14A-18, manufactured based on the generated IC layout diagram. In some embodiments, generating the IC layout diagram is part of operating an IC manufacturing system as part of manufacturing an IC device, e.g., a memory circuit, logic device, processing device, signal processing circuit, or the like.

In some embodiments, some or all of method 1900 is executed by a processor of a computer. In some embodiments, some or all of method 1900 is executed by a processor 2002 of an IC device design system 2000, discussed below with respect to FIG. 20. Some or all of the operations of method 1900 are capable of being performed as part of a design procedure performed in a design house, e.g., design house 2120 discussed below with respect to FIG. 21.

In some embodiments, the operations of method 1900 are performed in the order depicted in FIG. 19. In some embodiments, the operations of method 1900 are performed simultaneously and/or in an order other than the order depicted in FIG. 19. In some embodiments, one or more operations are performed before, between, during, and/or after performing one or more operations of method 1900.

At operation 1910, first gate structures are arranged on an active region. Arranging the first gate structures includes arranging the first gate structures in an x-direction with substantially a constant gate pitch and arranging the first gate structures as intrinsic gates of a transistor. At operation 1920, a second gate structure is arranged between adjacent two first gate structures. Arranging the conductive portions of the second conductive layer includes arranging the second gate structures as an extrinsic gate of the transistor. At operation 1930, in some embodiments, source/drain regions are arranged on opposite sides of one of the first gate structures. Arranging the source/drain regions includes arranging the source/drain regions as source/drain regions of the transistor. At operation 1940, in some embodiments, body regions are arranged on opposite sides of the first gate structure. Arranging the body regions includes arranging the body regions as body regions of the transistor, and one of the body regions and one of the source/drain regions are on opposite sides of the second gate structure.

At operation 1950, in some embodiments, an IC layout diagram is generated. The IC layout diagram includes the first gate structures, the second gate structure, the source/drain regions, and the body regions arranged as discussed above with respect to operations 1910-1940. In some embodiment, generating the IC layout diagram includes storing the IC layout diagram in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 2014 of IC device design system 2000, discussed below with respect to FIG. 20.

At operation 1960, in some embodiments, at least one of one or more semiconductor masks, or at least one component in a layer of a semiconductor device is fabricated based on the IC layout diagram. Fabricating one or more semiconductor masks or at least one component in a layer of a semiconductor device is discussed below with respect to FIG. 21.

At operation 1970, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 21.

By executing some or all of the operations of method 1900, an IC layout diagram and corresponding semiconductor device, e.g., as discussed above with respect to FIGS. 1A-10E and 12A-18, are generated in which the various embodiments include H-shaped gate structures, thereby improving the layout density of the semiconductor device.

Figure 20:
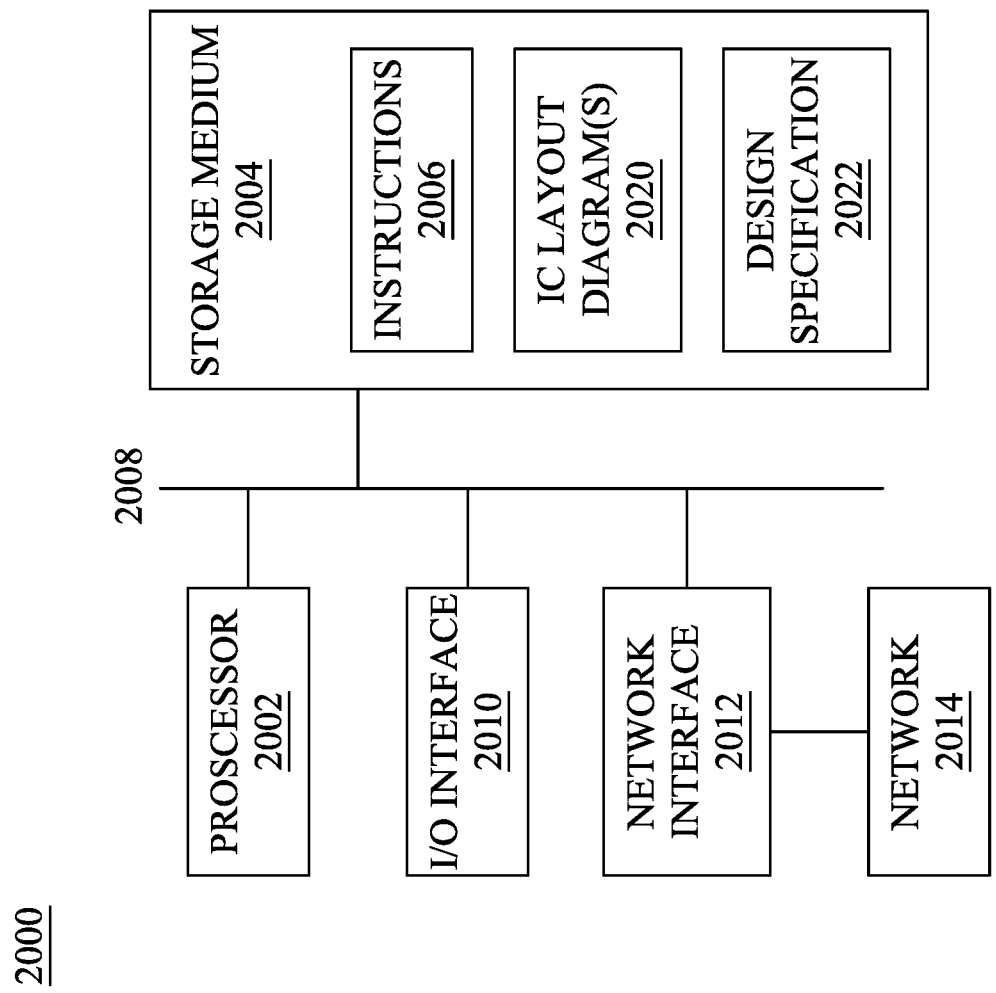
FIG. 20 is a block diagram of an IC device design system, in accordance with some embodiments of the present disclosure.

FIG. 20 is a block diagram of an IC device design system 2000, in accordance with some embodiments of the present disclosure. One or more operations of method 1900 as discussed above with respect to FIG. 19 are implementable using the IC device design system 2000, in accordance with some embodiments.

In some embodiments, IC device design system 2000 is a computing device including a hardware processor 2002 and a non-transitory computer-readable storage medium 2004. Non-transitory computer-readable storage medium 2004, amongst other things, is encoded with, i.e., stores, computer program codes, i.e., a set of executable instructions 2006. Execution of instructions 2006 by the hardware processor 2002 represents (at least in part) an IC device design system which implements a portion or all of, e.g., method 1900 discussed above with respect to FIG. 19 (hereinafter, the noted processes and/or methods).

Processor 2002 is electrically coupled to non-transitory computer-readable storage medium 2004 via a bus 2008. Processor 2002 is also electrically coupled to an I/O interface 2010 by bus 2008. A network interface 2012 is also electrically connected to processor 2002 via bus 2008. Network interface 2012 is connected to a network 2014, so that processor 2002 and non-transitory, computer-readable storage medium 2004 are capable of being connected to external elements via network 2014. Processor 2002 is configured to execute the instructions 2006 encoded in non-transitory computer-readable storage medium 2004 in order to cause IC device design system 2000 to be usable for performing a portion or all of the noted processes and/or methods. In one or more embodiments, processor 2002 is a central processing unit (CPU), a multi-processor, a distributed processing system, an application specific IC (ASIC), and/or a suitable processing unit.

In one or more embodiments, non-transitory computer-readable storage medium 2004 is an electronic, magnetic, optical, electromagnetic, infrared, and/or a semiconductor system (or apparatus or device). For example, non-transitory computer-readable storage medium 2004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 2004 includes a compact disk-read only memory (CD-ROM), a compact disk-read/write (CD-R/W), and/or a digital video disc (DVD).

In one or more embodiments, non-transitory computer-readable storage medium 2004 stores the instructions 2006 configured to cause IC device design system 2000 to be usable for performing a portion or all of the noted processes and/or methods. In one or more embodiments, non-transitory computer-readable storage medium 2004 also stores information which facilitates performing a portion or all of the noted processes and/or methods. In various embodiments, non-transitory computer-readable storage medium 2004 stores one or a combination of at least one IC layout design diagram 2020 or at least one design specification 2022, each discussed above with respect to FIGS. 1A-10E and 12A-18.

IC device design system 2000 includes I/O interface 2010. I/O interface 2010 is coupled to external circuitry. In various embodiments, I/O interface 2010 includes one or a combination of a keyboard, keypad, mouse, trackball, trackpad, display, touchscreen, and/or cursor direction keys for communicating information and commands to and/or from processor 2002.

IC device design system 2000 also includes network interface 2012 coupled to processor 2002. Network interface 2012 allows IC device design system 2000 to communicate with network 2014, to which one or more other computer systems are connected. Network interface 2012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 2000.

IC device design system 2000 is configured to receive information through I/O interface 2010. The information received through I/O interface 2010 includes one or a combination of at least one design rule instructions, at least one set of criteria, at least one design rule, at least one DRM, and/or other parameters for processing by processor 2002. The information is transferred to processor 2002 via bus 2008. IC device design system 2000 is configured to transmit and/or receive information related to a user interface through I/O interface 2010.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 1900 of FIG. 19, IC device design system 2000 and a non-transitory computer-readable storage medium, e.g., non-transitory computer-readable storage medium 2004, enable the benefits discussed above with respect to method 1900 and FIG. 19.

Figure 21:
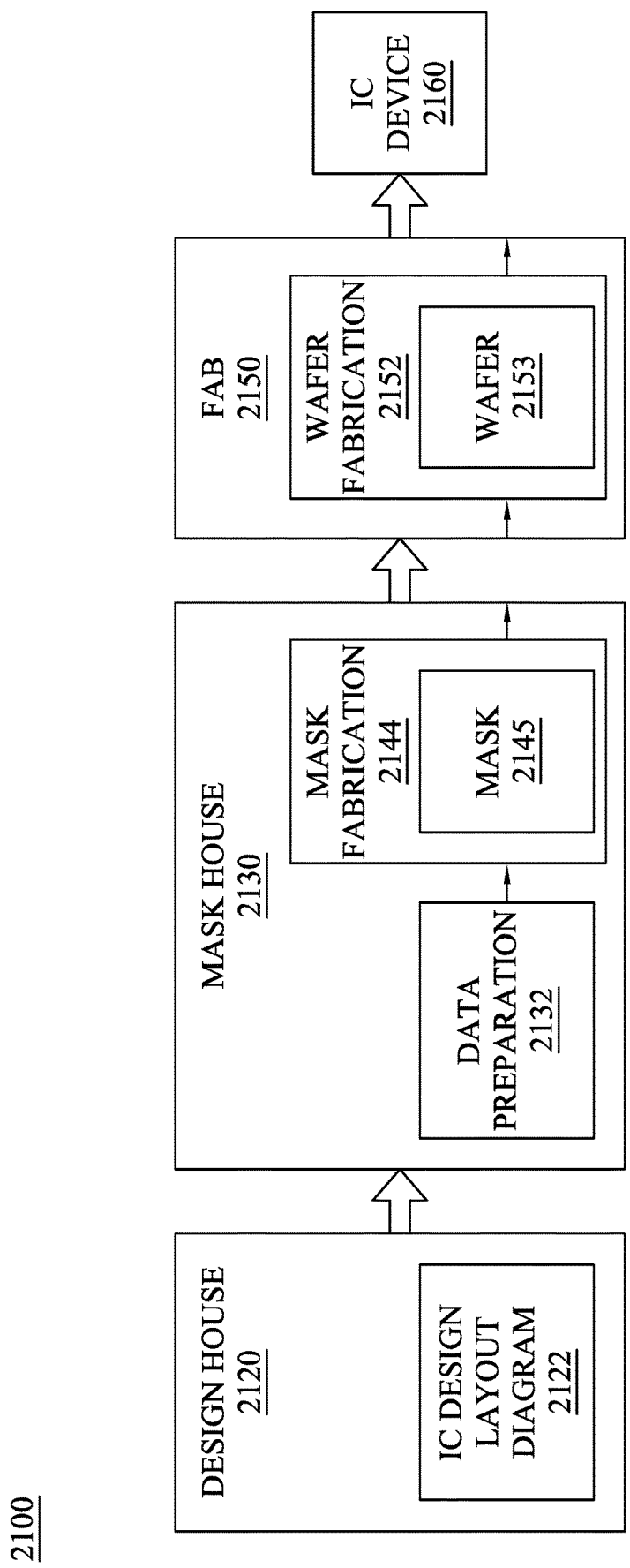
FIG. 21 is a block diagram of IC manufacturing system, and an IC manufacturing flow associated therewith, in accordance with some embodiments of the present disclosure.

FIG. 21 is a block diagram of IC manufacturing system 2100, and an IC manufacturing flow associated therewith, in accordance with some embodiments of the present disclosure. In some embodiments, based on a layout design, at least one of (A) one or more semiconductor masks or (B) at least one component in a layer of a semiconductor IC is fabricated using the IC manufacturing system 2100.

In FIG. 21, the IC manufacturing system 2100 includes entities, such as a design house 2120, a mask house 2130, and an IC manufacturer/fabricator ("fab") 2150, that interact with one another in the design, development, and manufacturing cycles and/or services related to manufacturing an IC device 2160. The entities in system 2100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2120, mask house 2130, and IC fab 2150 is owned by a single larger company. In some embodiments, two or more of design house 2120, mask house 2130, and IC fab 2150 coexist in a common facility and use common resources.

Design house (or design team) 2120 generates an IC design layout diagram (or design) 2122 based on method 1900 of FIG. 19 and discussed above with respect to FIGS. 1A-10E and 12A-18. IC design layout diagram 2122 includes various geometrical patterns that correspond to patterns of metal, oxide, or semiconductor layers that make up the various components of IC device 2160 to be fabricated. The various layers combine to form various IC features. For example, a portion of IC design layout diagram 2122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 2120 implements a proper design procedure including method 1900 of FIG. 19 and discussed above with respect to FIGS. 1A-10E and 12A-18, to form IC design layout diagram 2122. The design procedure includes one or more of logic design, physical design or place and route. IC design layout diagram 2122 is presented in one or more data files having information of the geometrical patterns. For example, IC design layout diagram 2122 can be expressed in a GDSII file format or DFII file format.

Mask house 2130 includes data preparation 2132 and mask fabrication 2144. Mask house 2130 uses IC design layout diagram 2122 to manufacture one or more masks 2145 to be used for fabricating the various layers of IC device 2160 according to IC design layout diagram 2122. Mask house 2130 performs mask data preparation 2132, where IC design layout diagram 2122 is translated into a representative data file ("RDF"). Mask data preparation 2132 provides the RDF to mask fabrication 2144. Mask fabrication 2144 includes a mask writer. A mask writer converts the RDF to an image on a substrate, such as a mask (reticle) 2145 or a semiconductor wafer 2153. The design layout diagram 2122 is manipulated by mask data preparation 2132 to comply with particular characteristics of the mask writer and/or requirements of IC fab 2150. In FIG. 21, mask data preparation 2132 and mask fabrication 2144 are illustrated as separate elements. In some embodiments, mask data preparation 2132 and mask fabrication 2144 are collectively referred to as mask data preparation.

In some embodiments, mask data preparation 2132 includes optical proximity correction (OPC) which uses lithography enhancement techniques to compensate for image errors, such as those that can arise from diffraction, interference, other process effects and the like. OPC adjusts IC design layout diagram 2122. In some embodiments, mask data preparation 2132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2132 includes a mask rule checker (MRC) that checks the IC design layout diagram 2122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2122 to compensate for limitations during mask fabrication 2144, which may undo part of the modifications performed by OPC in order to meet mask creation rules.

In some embodiments, mask data preparation 2132 includes lithography process checking (LPC) that simulates processing that will be implemented by IC fab 2150 to fabricate IC device 2160. LPC simulates this processing based on IC design layout diagram 2122 to create a simulated manufactured device, such as IC device 2160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2122.

It should be understood that the above description of mask data preparation 2132 has been simplified for the purposes of clarity. In some embodiments, data preparation 2132 includes additional features such as a logic operation (LOP) to modify the IC design layout diagram 2122 according to manufacturing rules. Additionally, the processes applied to IC design layout diagram 2122 during data preparation 2132 may be executed in a variety of different orders.

After mask data preparation 2132 and during mask fabrication 2144, a mask 2145 or a group of masks 2145 are fabricated based on the modified IC design layout diagram 2122. In some embodiments, mask fabrication 2144 includes performing one or more lithographic exposures based on IC design layout diagram 2122. In some embodiments, an electron-beam (e-beam) or a mechanism of multiple e-beams is used to form a pattern on a mask (photomask or reticle) 2145 based on the modified IC design layout diagram 2122. Mask 2145 can be formed in various technologies. In some embodiments, mask 2145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 2145 includes a transparent substrate (e.g., fused quartz) and an opaque material (e.g., chromium) coated in the opaque regions of the binary mask. In another example, mask 2145 is formed using a phase shift technology. In a phase shift mask (PSM) version of mask 2145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2144 is used in a variety of processes. For example, such a mask(s) is used in an ion implantation process to form various doped regions in semiconductor wafer 2153, in an etching process to form various etching regions in semiconductor wafer 2153, and/or in other suitable processes.

IC fab 2150 includes wafer fabrication 2152. IC fab 2150 is an IC fabrication business that includes one or more manufacturing facilities for the fabrication of a variety of different IC products. In some embodiments, IC Fab 2150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2150 uses mask(s) 2145 fabricated by mask house 2130 to fabricate IC device 2160. Thus, IC fab 2150 at least indirectly uses IC design layout diagram 2122 to fabricate IC device 2160. In some embodiments, semiconductor wafer 2153 is fabricated by IC fab 2150 using mask(s) 2145 to form IC device 2160. In some embodiments, the IC fabrication includes performing one or more lithographic exposures based at least indirectly on IC design layout diagram 2122. Semiconductor wafer 2153 includes a silicon substrate or other proper substrate having material layers formed thereon. Semiconductor wafer 2153 further includes one or more of various doped regions, dielectric features, multi-level interconnects, and the like (formed at subsequent manufacturing steps).

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the metal gate structures (i.e., the intrinsic gates) have a constant gate pitch and a constant width. As such, the density of the transistors can be increased. Another advantage is that the gate structures (i.e., the extrinsic gates) are used as masks to implant the source/drain regions and the body regions, such that the source/drain regions and the body regions can be spaced apart from each other. Furthermore, the intrinsic gates and the extrinsic gates can be patterned together, such that the extrinsic gates do not complicate the manufacturing process for forming the semiconductor device. In addition, the intrinsic gates and the extrinsic gates are isolated from each other, and the extrinsic gates are floating. With such configuration, the extrinsic gates eliminate the floating body effects and do not affect the electrical performance of the adjacent source/drain regions and the body regions.

According to some embodiments, a semiconductor device includes a source/drain region, a body region, a first gate structure, and a second gate structure. The source/drain region and the body region are in a substrate. The first and second gate structures are above the substrate. The source/drain region and the body region are on opposite sides of the first gate structure. The second gate structure is spaced apart from the first gate structure. The source/drain region, the body region, and the first gate structure are on a same side of the second gate structure.

According to some embodiments, a semiconductor device includes an active region, a first gate structure, and a second gate structure. The active region includes first and second source/drain regions and first and second body regions. The first and second source/drain regions are spaced apart from each other, and the first and second body regions are spaced apart from each other. The first gate structure is above the active region and between the first source/drain region and the first body region. The second gate structure is above the active region and between the first and second body regions.

According to some embodiments, a method for manufacturing a semiconductor device includes forming an active region in a substrate. A first gate structure and a second gate structure are formed above the active region. The first and second gate structures include a same material and extend in different directions. A source/drain region and a first body region are formed in the active region and on opposite sides of the first gate structure. The second gate structure is replaced with a third gate structure. The first and third gate structures include different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
    forming an active region in a substrate;
    forming a first gate structure and a second gate structure above the active region, wherein the first and second gate structures comprise a same material and extend in different directions, and a bottom surface of the first gate structure is higher than a top surface of the active region;
    forming a source/drain region and a first body region in the active region and on opposite sides of the first gate structure, wherein a lateral distance between the source/drain region and the second gate structure is substantially the same as a lateral distance between the first body region and the second gate structure; and
    replacing the second gate structure with a third gate structure, wherein the first and third gate structure comprise different materials.

2. The method of claim 1, wherein the first gate structure is free from metal.

3. The method of claim 1, wherein the third gate structure comprises metal.

4. The method of claim 1, further comprising forming a second body region in the active region such that the first and second body regions are on opposite sides of the second gate structure.

5. The method of claim 1, further comprising forming a spacer structure between and in contact with the first and second gate structures, wherein the spacer structure extends from the first gate structure to the second gate structure.

6. The method of claim 1, wherein forming the first gate structure and the second gate structure above the active region is such that a portion of the first gate structure is directly above an isolation structure surrounding the active region of the substrate.

7. The method of claim 1, wherein the second gate structure extends in a first direction in a top view and has a width in a second direction perpendicular to the first direction in the top view, and the first gate structure has a width in the second direction greater than the width of the second gate structure in the second direction in the top view.

8. The method of claim 1, wherein the bottom surface of the first gate structure is substantially coplanar with a bottom surface of the second gate structure.

9. A method comprising:
    providing a semiconductor-on-insulator substrate comprising a first semiconductive layer, an insulator layer over the first semiconductive layer, and a second semiconductive layer over the insulator layer;
    forming an isolation structure in the second semiconductive layer and in contact with the insulator layer such that the isolation structure defines an active region in the second semiconductive layer;
    forming a first semiconductive gate structure and a second semiconductive gate structure over the semiconductor-on-insulator substrate, such that the first semiconductive gate structure is directly over the isolation structure and a portion of the second semiconductive gate structure is directly over the active region;
    replacing the first semiconductive gate structure with a metal gate structure; and
    forming a contact over the active region and adjacent to the second semiconductive gate structure and the metal gate structure.

10. The method of claim 9, further comprising depositing a spacer structure between and in contact with the first semiconductive gate structure and the second semiconductive gate structure.

11. The method of claim 10, wherein replacing the first semiconductive gate structure with the metal gate structure is such that the spacer structure is in contact with the second semiconductive gate structure and the metal gate structure.

12. The method of claim 10, further comprising depositing a contact etch stop layer (CESL) to cover the spacer structure prior to replacing the first semiconductive gate structure with the metal gate structure.

13. The method of claim 9, further comprising depositing an interlayer dielectric (ILD) layer to cover the second semiconductive gate structure and the metal gate structure such that the ILD layer is in contact with a top surface of the second semiconductive gate structure and a top surface of the metal gate structure.

14. The method of claim 9, wherein forming the first semiconductive gate structure and the second semiconductive gate structure over the semiconductor-on-insulator substrate is further such that another portion of the second semiconductive gate structure is directly over the isolation structure.

15. The method of claim 9, wherein the second semiconductive gate structure extends in a first direction, and a width of the second semiconductive gate structure in the first direction is greater than a width of the metal gate structure in the first direction.

16. A method comprising:
    forming an isolation structure in a substrate to define an active region in the substrate;
    forming a first dummy gate structure, a second dummy gate structure, and a third dummy gate structure over the substrate, wherein the second dummy gate structure extends from a sidewall of the first dummy gate structure towards a sidewall of the third dummy gate structure;
    replacing the first dummy gate structure with a first metal gate structure, wherein an entire of the first metal gate structure does not overlap the active region in a top view;
    replacing the third dummy gate structure with a second metal gate structure, wherein the first metal gate structure, the second metal gate structure, and the second dummy gate structure form an H-shape in the top view;
    depositing a dielectric layer over the first metal gate structure, the second metal gate structure, and the second dummy gate structure; and
    forming a contact passing through the dielectric layer to the active region.

17. The method of claim 16, wherein an entire of the first metal gate structure is directly above the isolation structure.

18. The method of claim 16, wherein the first metal gate structure extends in a first direction in the top view, and a length of the first metal gate structure in the first direction is greater than a length of the second dummy gate structure in the first direction in the top view.

19. The method of claim 16, further comprising implanting a source/drain region and a body region in the active region such that the source/drain region and the body region are on opposite sides of the second dummy gate structure.

20. The method of claim 16, wherein a bottom surface of the second dummy gate structure is substantially coplanar with a bottom surface of the first metal gate structure.

* * * * *